(12) United States Patent
Butterfield et al.

(10) Patent No.: US 7,374,644 B2
(45) Date of Patent: May 20, 2008

(54) CONDUCTIVE POLISHING ARTICLE FOR ELECTROCHEMICAL MECHANICAL POLISHING

(75) Inventors: Paul D. Butterfield, San Jose, CA (US); Liang-Yuh Chen, Foster City, CA (US); Yongqi Hu, Campbell, CA (US); Antoine P. Manens, Palo Alto, CA (US); Rashid Mavliev, Santa Clara, CA (US); Stan D. Tsai, Fremont, CA (US); Feng Q. Liu, San Jose, CA (US); Ralph Wadensweiler, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 823 days.

(21) Appl. No.: 10/608,513

(22) Filed: Jun. 26, 2003

(65) Prior Publication Data

US 2004/0134792 A1    Jul. 15, 2004

Related U.S. Application Data

(63) Continuation-in-part of application No. 10/140,010, filed on May 7, 2002, now Pat. No. 6,979,248, and a continuation-in-part of application No. 10/211,626, filed on Aug. 2, 2002, now Pat. No. 7,125,477, which is a continuation-in-part of application No. 10/033,732, filed on Dec. 27, 2001, now Pat. No. 7,066,800, which is a continuation-in-part of application No. 09/505,899, filed on Feb. 17, 2000, now Pat. No. 6,537,144, and a continuation-in-part of application No. 10/210,972, filed on Aug. 2, 2002, which is a continuation-in-part of application No. 09/505,899, filed on Feb. 17, 2000, now Pat. No. 6,537,144, and a continuation-in-part of application No. 10/151,538, filed on May 16, 2002, now abandoned.

(51) Int. Cl.
*C25D 17/00* (2006.01)
(52) U.S. Cl. ............. 204/224 M; 204/217; 204/224 R; 204/286.1; 204/288.3; 204/288.6
(58) Field of Classification Search ........... 204/224 M, 204/217, 224 R, 286.1, 288.3, 288.6
See application file for complete search history.

(56) References Cited

U.S. PATENT DOCUMENTS 1,601,642 A    9/1926 Parker (Continued)

FOREIGN PATENT DOCUMENTS

EP    0 325 753 A2    8/1989

(Continued)

OTHER PUBLICATIONS

Alexander, Jr., "Electrically Conductive Polymer Nanocomposite Materials", http://www.afrlhorizons.com/Briefs/Sept02/ML0206.html printed Feb. 19, 2003.

(Continued)

*Primary Examiner*—Arun S. Phasge
(74) *Attorney, Agent, or Firm*—Patterson & Sheridan

(57) ABSTRACT

Embodiments of a ball assembly are provided. In one embodiment, a ball assembly includes a housing, a ball, a conductive adapter and a contact element. The housing has an annular seat extending into a first end of an interior passage. The conductive adapter is coupled to a second end of the housing. The contact element electrically couples the adapter and the ball with is retained in the housing between seat and the adapter.

58 Claims, 31 Drawing Sheets

U.S. PATENT DOCUMENTS

| | | | |
|---|---|---|---|
| 1,927,162 A | 9/1933 | Fiedler et al. | |
| 2,112,691 A | 3/1938 | Crowder | |
| 2,240,265 A | 4/1941 | Nachtman | |
| 2,392,687 A | 1/1946 | Nachtman | |
| 2,431,065 A | 11/1947 | Miller | |
| 2,451,341 A | 10/1948 | Jemstedt | |
| 2,453,481 A | 11/1948 | Wilson | |
| 2,454,935 A | 11/1948 | Miller | |
| 2,456,185 A | 12/1948 | Grube | |
| 2,457,510 A | 12/1948 | van Ornum | |
| 2,458,676 A | 1/1949 | Brenner et al. | |
| 2,461,556 A | 2/1949 | Lorig | |
| 2,473,290 A | 6/1949 | Millard | |
| 2,477,808 A | 8/1949 | Jones | |
| 2,479,323 A | 8/1949 | Davis | |
| 2,480,022 A | 8/1949 | Hogaboom | |
| 2,490,055 A | 12/1949 | Hoff | |
| 2,495,695 A | 1/1950 | Camin et al. | |
| 2,500,205 A | 3/1950 | Schaefer | |
| 2,500,206 A | 3/1950 | Schaefer et al. | |
| 2,503,863 A | 4/1950 | Bart | |
| 2,506,794 A | 5/1950 | Kennedy et al. | |
| 2,509,304 A | 5/1950 | Klein | |
| 2,512,328 A | 6/1950 | Hays | |
| 2,517,907 A | 8/1950 | Mikulas | |
| 2,519,945 A | 8/1950 | Twele et al. | |
| 2,530,677 A | 11/1950 | Berkenkotter et al. | |
| 2,535,966 A | 12/1950 | Teplitz | |
| 2,536,912 A | 1/1951 | Cobertt | |
| 2,539,898 A | 1/1951 | Davis | |
| 2,540,175 A | 2/1951 | Rosenqvist | |
| 2,544,510 A | 3/1951 | Prahl | |
| 2,549,678 A | 4/1951 | Fiandt | |
| 2,544,943 A | 5/1951 | Farmer | |
| 2,556,017 A | 6/1951 | Vonada | |
| 2,560,534 A | 7/1951 | Adler | |
| 2,560,966 A | 7/1951 | Lee | |
| 2,569,577 A | 10/1951 | Reading | |
| 2,569,578 A | 10/1951 | Rieger | |
| 2,571,709 A | 10/1951 | Gray | |
| 2,576,074 A | 11/1951 | Nachtman | |
| 2,587,630 A | 3/1952 | Konrad et al. | |
| 2,619,454 A | 11/1952 | Zapponi | |
| 2,633,452 A | 3/1953 | Hogaboom, Jr. et al. | |
| 2,646,398 A | 7/1953 | Henderson | |
| 2,656,283 A | 10/1953 | Fink et al. | |
| 2,656,284 A | 10/1953 | Toulmin | |
| 2,657,117 A | 10/1953 | Rendel | |
| 2,657,457 A | 11/1953 | Toulmin | |
| 2,673,836 A | 3/1954 | Vonada | |
| 2,674,550 A | 4/1954 | Dunlevy et al. | |
| 2,675,348 A | 4/1954 | Greenspan | |
| 2,680,710 A | 6/1954 | Kenmore et al. | |
| 2,684,939 A | 7/1954 | Geese | |
| 2,696,859 A | 8/1954 | Gray et al. | |
| 2,689,215 A | 9/1954 | Bart | |
| 2,695,269 A | 11/1954 | de Witz et al. | |
| 2,698,832 A | 1/1955 | Swanson | |
| 2,706,173 A | 4/1955 | Wells et al. | |
| 2,706,175 A | 4/1955 | Licharz | |
| 2,708,445 A | 5/1955 | Manson et al. | |
| 2,710,834 A | 6/1955 | Vrilakas | |
| 2,711,993 A | 6/1955 | Lyon | |
| 3,162,588 A | 12/1964 | Bell | |
| 3,334,041 A | 8/1967 | Dyer et al. | |
| 3,433,730 A | 3/1969 | Kennedy et al. | |
| 3,448,023 A | 6/1969 | Bell | |
| 3,476,677 A | 11/1969 | Corley et al. | |
| 3,579,922 A | 5/1971 | Mandonas et al. | |
| 3,607,707 A | 9/1971 | Chenevier | |
| 3,808,384 A | 4/1974 | Boulanger | |
| 3,873,512 A | 3/1975 | Latanision | |
| 3,942,959 A | 3/1976 | Markoo et al. | |
| 3,992,178 A | 11/1976 | Markoo et al. | |
| 4,047,902 A | 9/1977 | Wiand | |
| 4,082,638 A | 4/1978 | Jumer | |
| 4,108,455 A | 8/1978 | James | |
| 4,119,515 A | 10/1978 | Costakis | |
| 4,125,444 A | 11/1978 | Inoue | |
| 4,199,902 A | 4/1980 | Sauerland | |
| 4,312,716 A | 1/1982 | Maschler et al. | |
| 4,523,411 A | 6/1985 | Freerks | |
| 4,621,880 A | 11/1986 | Rush | |
| 4,621,936 A | 11/1986 | Hansson et al. | |
| 4,704,511 A | 11/1987 | Miyano | |
| 4,706,793 A | 11/1987 | Masciarelli | |
| 4,713,149 A | 12/1987 | Hoshino | 204/23 |
| 4,736,508 A | 4/1988 | Poli et al. | |
| 4,752,371 A | 6/1988 | Kreisel et al. | |
| 4,772,361 A | 9/1988 | Dorsett et al. | |
| 4,793,895 A | 12/1988 | Kaanta et al. | |
| 4,801,144 A | 1/1989 | De Masi, Jr. et al. | |
| 4,839,993 A | 6/1989 | Masuko et al. | |
| 4,848,814 A | 7/1989 | Suzuki et al. | |
| 4,889,496 A | 12/1989 | Neidich | |
| 4,934,102 A | 6/1990 | Leach et al. | |
| 4,954,141 A | 9/1990 | Takiyama et al. | |
| 4,956,056 A | 9/1990 | Zubatova et al. | |
| 5,011,510 A | 4/1991 | Hayakawa et al. | |
| 5,061,294 A | 10/1991 | Harmer et al. | |
| 5,066,370 A | 11/1991 | Andreshak et al. | |
| 5,096,550 A | 3/1992 | Mayer et al. | |
| 5,104,319 A | 4/1992 | Evans et al. | |
| 5,108,463 A | 4/1992 | Buchanan | |
| 5,136,817 A | 8/1992 | Tabata et al. | |
| 5,137,542 A | 8/1992 | Buchanan et al. | |
| 5,203,884 A | 4/1993 | Buchanan et al. | |
| 5,217,586 A | 6/1993 | Datta et al. | |
| 5,225,034 A | 7/1993 | Yu et al. | |
| 5,257,478 A | 11/1993 | Hyde et al. | |
| 5,328,716 A | 7/1994 | Buchanan | |
| 5,445,486 A | 8/1995 | Kitayama et al. | |
| 5,478,435 A | 12/1995 | Murphy et al. | |
| 5,520,473 A | 5/1996 | Durham | |
| 5,534,106 A | 7/1996 | Cote et al. | |
| 5,543,032 A | 8/1996 | Datta et al. | |
| 5,560,753 A | 10/1996 | Schnabel et al. | |
| 5,562,529 A | 10/1996 | Kishii et al. | |
| 5,567,300 A | 10/1996 | Datta et al. | |
| 5,575,706 A | 11/1996 | Tsai et al. | |
| 5,578,362 A | 11/1996 | Reinhardt et al. | |
| 5,605,574 A | 2/1997 | Tsunashima et al. | |
| 5,609,719 A | 3/1997 | Hempel | |
| 5,624,300 A | 4/1997 | Kishii et al. | |
| 5,633,068 A | 5/1997 | Ryoke et al. | |
| 5,654,078 A | 8/1997 | Ferronato | |
| 5,674,122 A | 10/1997 | Krech | |
| 5,677,824 A | 10/1997 | Harashima et al. | |
| 5,689,791 A | 11/1997 | Swift | |
| 5,693,239 A | 12/1997 | Wang et al. | |
| 5,702,811 A | 12/1997 | Ho et al. | |
| 5,718,574 A | 2/1998 | Shimazu | |
| 5,733,564 A | 3/1998 | Lehtinen | |
| 5,738,574 A | 4/1998 | Tolles et al. | |
| 5,788,304 A | 8/1998 | Korn et al. | |
| 5,804,507 A | 9/1998 | Perlov et al. | |
| 5,804,513 A | 9/1998 | Sakatani et al. | |
| 5,807,165 A | 9/1998 | Uzoh et al. | |
| 5,823,854 A | 10/1998 | Chen | |
| 5,836,575 A | 11/1998 | Robinson et al. | |
| 5,840,190 A | 11/1998 | Scholander et al. | |
| 5,840,629 A | 11/1998 | Carpio | |
| 5,846,882 A | 12/1998 | Birang | |
| 5,850,071 A | 12/1998 | Makiguchi et al. | |

| Patent No. | Date | Inventor |
|---|---|---|
| 5,871,392 A | 2/1999 | Meikle et al. |
| 5,882,491 A | 3/1999 | Wardle |
| 5,893,796 A | 4/1999 | Birang et al. |
| 5,911,619 A | 6/1999 | Uzoh et al. |
| 5,931,631 A | 8/1999 | Bonora et al. |
| 5,931,719 A | 8/1999 | Nagahara et al. |
| 5,938,801 A | 8/1999 | Robinson |
| 5,948,697 A | 9/1999 | Hata |
| 5,958,061 A | 9/1999 | Kelly et al. |
| 5,984,391 A | 11/1999 | Vanderpot et al. |
| 5,985,093 A | 11/1999 | Chen |
| 6,001,008 A | 12/1999 | Fujimori et al. |
| 6,004,880 A | 12/1999 | Liu et al. |
| 6,010,395 A | 1/2000 | Nakajima |
| 6,017,265 A | 1/2000 | Cook et al. |
| 6,020,264 A | 2/2000 | Lustig et al. |
| 6,024,630 A | 2/2000 | Shendon et al. |
| 6,033,293 A | 3/2000 | Crevasse et al. ............ 451/494 |
| 6,056,851 A | 5/2000 | Hsieh et al. |
| 6,066,030 A | 5/2000 | Uzoh |
| 6,074,284 A | 6/2000 | Tani et al. |
| 6,077,026 A | 6/2000 | Shultz |
| 6,077,337 A | 6/2000 | Lee |
| 6,082,950 A | 7/2000 | Altwood et al. |
| 6,085,670 A | 7/2000 | Genov |
| 6,090,239 A | 7/2000 | Liu et al. |
| 6,091,498 A | 7/2000 | Hanson et al. |
| 6,103,096 A | 8/2000 | Datta et al. |
| 6,110,285 A | 8/2000 | Kitazawa et al. |
| 6,116,998 A | 9/2000 | Damgaard et al. |
| 6,132,292 A | 10/2000 | Kubo |
| 6,143,147 A | 11/2000 | Jelinek |
| 6,146,244 A | 11/2000 | Atsugi et al. |
| 6,146,504 A | 11/2000 | Patadia et al. |
| 6,153,043 A | 11/2000 | Edelstein et al. |
| 6,156,124 A | 12/2000 | Tobin |
| 6,159,079 A | 12/2000 | Zuniga et al. |
| 6,165,904 A | 12/2000 | Kim |
| 6,171,467 B1 | 1/2001 | Weihs et al. |
| 6,176,992 B1 | 1/2001 | Talieh |
| 6,176,998 B1 | 1/2001 | Wardle et al. |
| 6,183,354 B1 | 2/2001 | Zuniga et al. |
| 6,187,134 B1 | 2/2001 | Chow et al. |
| 6,190,494 B1 | 2/2001 | Dow |
| 6,193,506 B1 | 2/2001 | Muka |
| 6,210,257 B1 | 4/2001 | Carlson |
| 6,213,704 B1 | 4/2001 | White et al. |
| 6,222,337 B1 | 4/2001 | Kroeker et al. |
| 6,234,870 B1 | 5/2001 | Uzoh et al. |
| 6,238,271 B1 | 5/2001 | Cesna |
| 6,238,592 B1 | 5/2001 | Hardy et al. |
| 6,244,935 B1 | 6/2001 | Birang et al. |
| 6,245,700 B1 | 6/2001 | Budd et al. |
| 6,248,222 B1 | 6/2001 | Wang |
| 6,251,235 B1 | 6/2001 | Talieh et al. |
| 6,256,555 B1 | 7/2001 | Bacchi et al. |
| 6,257,827 B1 | 7/2001 | Hendrickson et al. |
| 6,257,953 B1 | 7/2001 | Gitis et al. |
| 6,258,223 B1 | 7/2001 | Cheung et al. |
| 6,261,168 B1 | 7/2001 | Jensen et al. ................ 451/527 |
| 6,261,959 B1 | 7/2001 | Travis et al. ................ 438/692 |
| 6,273,798 B1 | 8/2001 | Berman |
| 6,296,557 B1 | 10/2001 | Walker |
| 6,297,159 B1 | 10/2001 | Paton |
| 6,319,108 B1 | 11/2001 | Adefris et al. |
| 6,319,420 B1 | 11/2001 | Dow |
| 6,322,116 B1 | 11/2001 | Stevens |
| 6,322,422 B1 | 11/2001 | Satou |
| 6,328,642 B1 | 12/2001 | Pant et al. .................. 451/307 |
| 6,328,872 B1 | 12/2001 | Talieh et al. |
| 6,331,135 B1 | 12/2001 | Sabde et al. ................. 451/41 |
| 6,335,083 B1 | 1/2002 | Kasai et al. |
| 6,343,183 B1 | 1/2002 | Halpin et al. |
| 6,345,150 B1 | 2/2002 | Yoo |
| 6,361,414 B1 | 3/2002 | Ravkin et al. |
| 6,368,184 B1 | 4/2002 | Beckage |
| 6,368,190 B1 | 4/2002 | Easter et al. |
| 6,371,716 B1 | 4/2002 | Byun et al. |
| 6,372,001 B1 | 4/2002 | Omar et al. |
| 6,379,223 B1 | 4/2002 | Sun et al. |
| 6,381,169 B1 | 4/2002 | Bocian et al. |
| 6,383,066 B1 | 5/2002 | Chen et al. |
| 6,386,956 B1 | 5/2002 | Sato et al. |
| 6,391,166 B1 | 5/2002 | Wang |
| 6,395,152 B1 | 5/2002 | Wang |
| 6,402,591 B1 | 6/2002 | Thornton ..................... 451/36 |
| 6,402,925 B2 | 6/2002 | Talieh |
| 6,406,363 B1 | 6/2002 | Xu et al. ..................... 451/296 |
| 6,409,904 B1 | 6/2002 | Uzoh et al. |
| 6,413,153 B1 | 7/2002 | Molar |
| 6,413,388 B1 | 7/2002 | Uzoh et al. |
| 6,413,403 B1 | 7/2002 | Lindquist et al. |
| 6,428,394 B1 | 8/2002 | Mooring et al. ............... 451/41 |
| 6,431,968 B1 | 8/2002 | Chen et al. |
| 6,440,295 B1 | 8/2002 | Wang |
| 6,447,668 B1 | 9/2002 | Wang |
| 6,461,988 B2 | 10/2002 | Budd et al. |
| 6,471,847 B2 | 10/2002 | Talieh et al. |
| 6,475,332 B1 | 11/2002 | Boyd et al. ............. 156/345.12 |
| 6,479,962 B2 | 11/2002 | Ziemkowski et al. |
| 6,482,307 B2 | 11/2002 | Ashjaee et al. ............. 205/103 |
| 6,484,539 B1 | 11/2002 | Nordine et al. |
| 6,497,800 B1 | 12/2002 | Talieh et al. ............. 204/224 R |
| 6,511,739 B2 | 1/2003 | Kasai et al. |
| 6,514,892 B1 | 2/2003 | Kasai et al. |
| 6,517,426 B2 | 2/2003 | Lee ........................... 451/537 |
| 6,520,843 B1 | 2/2003 | Halley ........................ 451/285 |
| 6,528,767 B2 | 3/2003 | Bagley et al. |
| 6,537,140 B1 | 3/2003 | Miller et al. |
| 6,537,144 B1 | 3/2003 | Tsai et al. |
| 6,551,179 B1 | 4/2003 | Halley ........................ 451/285 |
| 6,561,873 B2 | 5/2003 | Tsai et al. |
| 6,561,889 B1 | 5/2003 | Xu et al. ..................... 451/526 |
| 6,569,004 B1 | 5/2003 | Pham ......................... 451/526 |
| 6,572,463 B1 | 6/2003 | Xu et al. ..................... 451/526 |
| 6,572,755 B2 | 6/2003 | Emesh et al. |
| 6,585,579 B2 | 7/2003 | Jensen et al. ................ 451/527 |
| 6,630,059 B1 | 10/2003 | Uzoh et al. |
| 6,641,471 B1 | 11/2003 | Pinheiro et al. |
| 6,656,019 B1 | 12/2003 | Chen et al. |
| 6,666,959 B2 | 12/2003 | Uzoh et al. |
| 6,677,594 B1 | 1/2004 | Young |
| 6,685,548 B2 | 2/2004 | Chen et al. |
| 6,692,338 B1 | 2/2004 | Kirchner |
| 6,726,823 B1 | 4/2004 | Wang et al. |
| 6,736,952 B2 | 5/2004 | Emesh et al. |
| 6,739,951 B2 | 5/2004 | Sun et al. |
| 6,752,700 B2 | 6/2004 | Duescher |
| 6,769,969 B1 | 8/2004 | Duescher |
| 6,776,693 B2 | 8/2004 | Duboust et al. |
| 6,802,955 B2 | 10/2004 | Emesh et al. |
| 6,811,680 B2 | 11/2004 | Chen et al. |
| 6,848,977 B1 | 2/2005 | Cook et al. |
| 6,856,761 B2 | 2/2005 | Doran |
| 6,962,524 B2 | 11/2005 | Butterfield et al. |
| 6,982,524 B2 | 1/2006 | Park et al. |
| 7,125,477 B2 * | 10/2006 | Butterfield et al. .... 204/224 M |
| 2001/0005667 A1 | 6/2001 | Tolles et al. |
| 2001/0024878 A1 | 9/2001 | Nakamura |
| 2001/0027018 A1 | 10/2001 | Molnar |
| 2001/0035354 A1 | 11/2001 | Ashjaee et al. |
| 2001/0036746 A1 | 11/2001 | Sato et al. |
| 2001/0040099 A1 * | 11/2001 | Pedersen et al. ............ 205/143 |
| 2001/0040100 A1 | 11/2001 | Wang |
| 2001/0042690 A1 | 11/2001 | Talieh |
| 2002/0008036 A1 | 1/2002 | Wang |

| | | | |
|---|---|---|---|
| 2002/0011417 A1 | 1/2002 | Talieh et al. | |
| 2002/0020621 A1 | 2/2002 | Uzoh et al. | |
| 2002/0025760 A1 | 2/2002 | Lee et al. | |
| 2002/0025763 A1 | 2/2002 | Lee et al. | |
| 2002/0070126 A1 | 6/2002 | Sato et al. | |
| 2002/0077037 A1 | 6/2002 | Tietz | |
| 2002/0088715 A1 | 7/2002 | Talieh et al. | |
| 2002/0102853 A1 | 8/2002 | Li et al. | |
| 2002/0108861 A1 | 8/2002 | Emesh et al. | |
| 2002/0119286 A1 | 8/2002 | Chen et al. | |
| 2002/0123300 A1 | 9/2002 | Jones et al. | |
| 2002/0130049 A1 | 9/2002 | Chen et al. | |
| 2002/0130634 A1 | 9/2002 | Ziemkowski et al. | |
| 2002/0146963 A1 | 10/2002 | Teetzel | |
| 2002/0148732 A1 | 10/2002 | Emesh et al. | |
| 2003/0013397 A1 | 1/2003 | Rhoades | |
| 2003/0034131 A1 | 2/2003 | Park et al. | |
| 2003/0040188 A1 | 2/2003 | Hsu et al. | |
| 2003/0067180 A1 | 4/2003 | Hosokawa | |
| 2003/0114087 A1 | 6/2003 | Duboust et al. | |
| 2003/0116445 A1 | 6/2003 | Sun et al. | |
| 2003/0116446 A1 | 6/2003 | Duboust et al. | |
| 2003/0150079 A1 | 8/2003 | Takai et al. | |
| 2003/0164362 A1 | 9/2003 | Bagley et al. | |
| 2003/0173230 A1 | 9/2003 | Wadensweiler et al. | |
| 2003/0209448 A1 | 11/2003 | Hu et al. | |
| 2003/0213703 A1 | 11/2003 | Wang et al. | |
| 2003/0220053 A1 | 11/2003 | Manens et al. | |
| 2004/0020788 A1 | 2/2004 | Mavliev et al. | |
| 2004/0020789 A1 | 2/2004 | Hu | |
| 2004/0023495 A1 | 2/2004 | Butterfield et al. | |
| 2004/0082288 A1 | 4/2004 | Tietz et al. | |
| 2004/0121708 A1 | 6/2004 | Hu et al. | |
| 2004/0134792 A1 | 7/2004 | Butterfield et al. | |
| 2004/0163946 A1 | 8/2004 | Chang et al. | |
| 2004/0170407 A1 | 9/2004 | Nguyen et al. | |
| 2004/0266327 A1 | 12/2004 | Chen et al. | |
| 2005/0000801 A1 | 1/2005 | Wang et al. | |
| 2005/0092621 A1 | 5/2005 | Hu et al. | |
| 2005/0133363 A1 | 6/2005 | Hu et al. | |
| 2005/0161341 A1 | 7/2005 | Duboust et al. | |
| 2005/0178666 A1 | 8/2005 | Tsai et al. | |
| 2005/0194681 A1 | 9/2005 | Hu et al. | |

FOREIGN PATENT DOCUMENTS

| | | |
|---|---|---|
| EP | 0 455 455 | 11/1991 |
| EP | 1361023 | 11/2003 |
| EP | 1 368 826 | 12/2003 |
| JP | 58-171264 | 10/1983 |
| JP | 61-079666 | 4/1986 |
| JP | 61265279 | 11/1986 |
| JP | 62193139 | 8/1987 |
| JP | 63-028512 | 2/1988 |
| JP | 2121347 | 5/1990 |
| JP | 04024943 | 1/1992 |
| JP | 05-277957 | 10/1993 |
| JP | 06-047678 | 2/1994 |
| JP | 0817753 | 1/1996 |
| JP | 9129567 | 5/1997 |
| JP | 09293684 | 11/1997 |
| JP | 10-006213 | 1/1998 |
| JP | 11-042554 | 2/1999 |
| JP | 2870537 | 3/1999 |
| JP | 11239961 | 3/1999 |
| JP | 11130249 | 5/1999 |
| JP | 11-23996 | 7/1999 |
| JP | 2000091406 | 3/2000 |
| JP | 2000150402 | 5/2000 |
| JP | 2000183146 | 6/2000 |
| JP | 2000-218513 | 8/2000 |
| JP | 11-216663 | 12/2000 |
| JP | 2000353737 | 12/2000 |
| JP | 2001-77117 | 3/2001 |
| JP | 2001-179611 | 7/2001 |
| JP | 2001-244223 | 9/2001 |
| JP | 2002-334858 | 11/2002 |
| JP | 3453352 | 10/2003 |
| KR | 2003-037158 | 5/2003 |
| SU | 1618538 | 1/1991 |
| WO | WO 93/15879 | 8/1993 |
| WO | WO 98/49723 | 11/1998 |
| WO | WO 99/41434 | 8/1999 |
| WO | WO 99/53119 | 10/1999 |
| WO | WO 99/65072 | 12/1999 |
| WO | WO 00/03426 | 1/2000 |
| WO | WO 00/26443 | 5/2000 |
| WO | WO 00/33356 | 6/2000 |
| WO | WO 00/59682 | 10/2000 |
| WO | WO 00/71297 | 11/2000 |
| WO | WO 01/13416 | 2/2001 |
| WO | WO 01/49452 | 7/2001 |
| WO | WO 01/52307 | 7/2001 |
| WO | WO 01/63018 | 8/2001 |
| WO | WO 01/71066 A1 | 9/2001 |
| WO | WO 01/88229 | 11/2001 |
| WO | WO 01/88954 | 11/2001 |
| WO | WO 02/23616 | 3/2002 |
| WO | WO 02/064314 | 8/2002 |
| WO | WO 02/075804 A2 | 9/2002 |
| WO | WO 02/095808 | 11/2002 |
| WO | WO 03/001581 | 1/2003 |
| WO | WO 03/099519 A1 | 12/2003 |
| WO | WO 2004/073926 A1 | 9/2004 |

OTHER PUBLICATIONS

Contolini, "Electrochemical Planarization of ULSI Copper," Solid State Technology, vol. 40, No. 6, Jun. 1, 1997.
Nogami, "An Innovation in Integrate Porous Low-K Materials and Copper," InterConnect Japan 2001; Honeywell Seminar Dec. 6, 2001, p. 1-12.
Partial International Search / PCT Invitation to pay additional fees dated Nov. 14, 2002.
Notification regarding review of justification for invitation to pay additional fees for PCT/US/02/11009 dated Feb. 25, 2003.
International Search Report for PCT/US 02/11009 dated Feb. 25, 2003.
PCT Written Opinion dated Apr. 1, 2003 for PCT/US02/11009.
Notification of Transmittal of International Preliminary Examination Report dated Nov. 10, 2003.
European Search Report for 03252801.0, dated Jan. 16, 2004 (7047 EP).
Communication pursuant to Article 96(2) EPC for Application No. 02728965.4, dated Jun. 11, 2004.
Search Report issued by the Austrian Patent Office for corresponding Singapore Patent Application No. 200302562-4, provided by letter dated Oct. 7, 2004.
Invitation to pay additional fees dated Nov. 11, 2004.
Notification of Transmittal of International Preliminary Examination Report and Written Opinion dated Feb. 21, 2005.
Notification of transmittal of the International Search report and Written Opinion dated Mar. 14, 2005.
PCT International Search Report and Written Opinion dated Apr. 28, 2005 for PCT/US04/037870.
PCT International Search Report and Written Opinion for PCT/US2006/004114, dated Jul. 14, 2006.
European Search Report dated Sep. 27, 2005 for Application No. 03254807.5.
Written Opinion dated Apr. 1, 2003 for International Application No. PCT/US/02/11009.
Partial Search Report (Annex to Form PCT/ISA/206) dated Nov. 11, 2004 for International Application No. PCT/US2004/022722. (APPM/004100.PC).
European Search Report dated Jun. 11, 2004 for European Application No. 02728695.4. (APPM/04100EP02).
European Examination Report dated Sep. 9, 2007 for European Application No. 05077958.6. (APPM/04100EPD1).

* cited by examiner

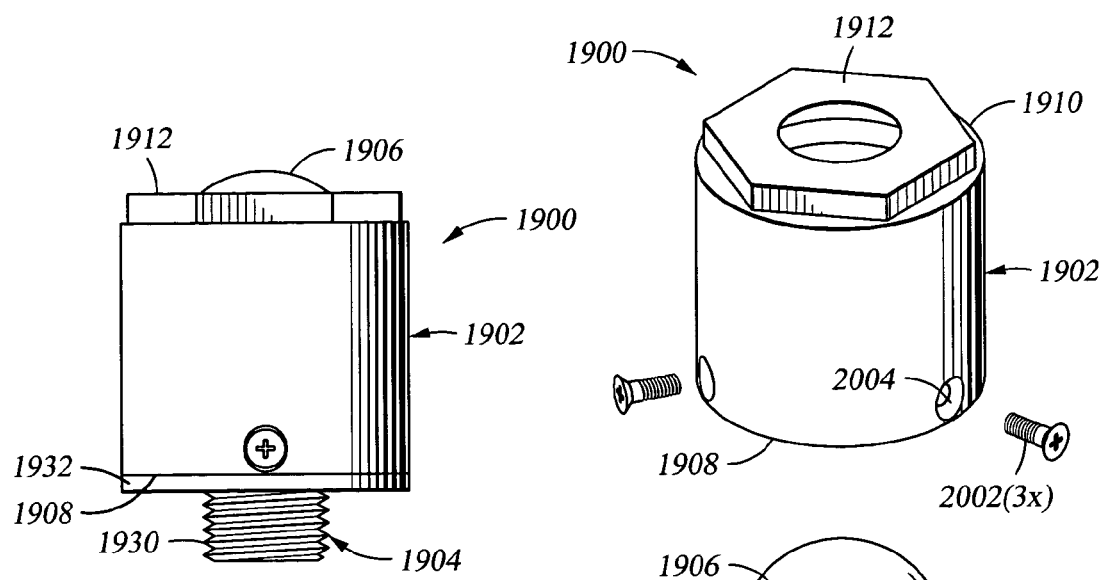
Fig. 20A
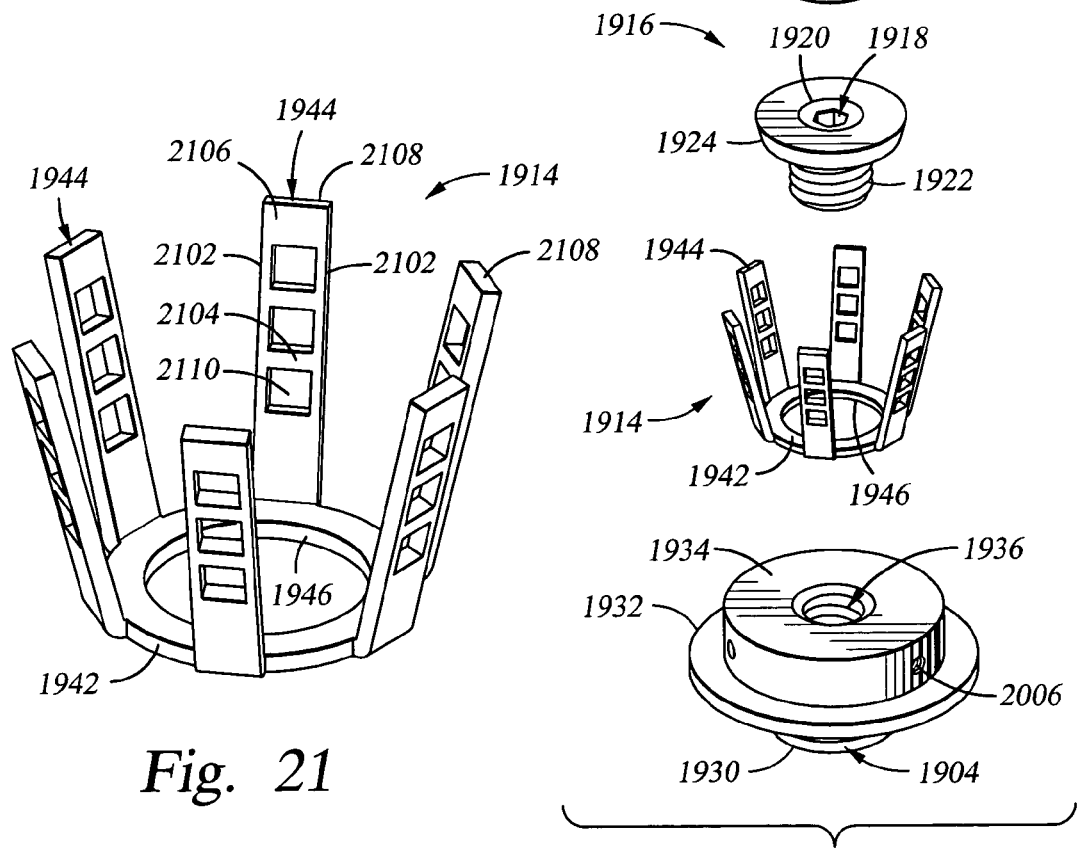
Fig. 21
Fig. 20B

CONDUCTIVE POLISHING ARTICLE FOR ELECTROCHEMICAL MECHANICAL POLISHING

CROSS-REFERENCE TO RELATED APPLICATIONS

This application is a continuation-in-part of U.S. patent application Ser. No. 10/140,010, filed May 7, 2002, issued as U.S. Pat. No. 6,979,248. This application is also a continuation-in-part of U.S. patent application Ser. No. 10/211,626, filed Aug. 2, 2002, issued as U.S. Pat. No. 7,125,477, which is a continuation-in-part of U.S. patent application Ser. No. 10/033,732, filed Dec. 27, 2001, issued as U.S. Pat. No. 7,066,800, which is a continuation-in-part of U.S. patent application Ser. No. 09/505,899, filed Feb. 17, 2000, issued as U.S. Pat. No. 6,537,144. This application is additionally a continuation-in-part of U.S. patent application Ser. No. 10/210,972, filed Aug. 2, 2002, which is also a continuation-in-part of U.S. patent application Ser. No. 09/505,899, filed Feb. 17, 2000, issued as U.S. Pat. No. 6,537,144. This application is further a continuation-in-part of U.S. patent application No. 10/151,538, filed May 16, 2002 now abandoned. All of the above referenced applications are hereby incorporated by reference in their entireties. This application is related to U.S. patent application Ser. No. 10/033,732, issued as U.S. Pat. No. 7,066,800, filed on Dec. 27, 2001; U.S. patent application Ser. No. 10/455,941, filed Jun. 6, 2003, issued as U.S. Pat. No. 6,991,528 entitled "Conductive Polishing Article for Electrochemical Mechanical Polishing" by Hu, et al.; and U.S. patent application Ser. No. 10/455,895, filed Jun. 6, 2003 entitled "Conductive Polishing Article for Electrochemical Mechanical Polishing" by Hu, et al., all of which are also incorporated herein by reference in their entireties.

BACKGROUND OF THE INVENTION

1. Field of the Invention

The present invention relates to an article of manufacture and apparatus for planarizing a substrate surface.

2. Background of the Related Art

Sub-quarter micron multi-level metallization is one of the key technologies for the next generation of ultra large-scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

In the fabrication of integrated circuits and other electronic devices, multiple layers of conducting, semiconducting, and dielectric materials are deposited on or removed from a surface of a substrate. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Chemical mechanical planarization, or chemical mechanical polishing (CMP), is a common technique used to planarize substrates. CMP utilizes a chemical composition, typically a slurry or other fluid medium, for selective removal of material from substrates. In conventional CMP techniques, a substrate carrier or polishing head is mounted on a carrier assembly and positioned in contact with a polishing pad in a CMP apparatus. The carrier assembly provides a controllable pressure to the substrate urging the substrate against the polishing pad. The pad is moved relative to the substrate by an external driving force. The CMP apparatus effects polishing or rubbing movement between the surface of the substrate and the polishing pad while dispersing a polishing composition to effect chemical activity and/or mechanical activity and consequential removal of material from the surface of the substrate.

One material increasingly utilized in integrated circuit fabrication is copper due to its desirable electrical properties. However, copper has its own special fabrication problems. For example, copper is difficult to pattern and etch and new processes and techniques, such as damascene or dual damascene processes, are being used to form copper substrate features.

In damascene processes, a feature is defined in a dielectric material and subsequently filled with copper. Dielectric materials with low dielectric constants, i.e., less than about 3, are being used in the manufacture of copper damascenes. Barrier layer materials are deposited conformally on the surfaces of the features formed in the dielectric layer prior to deposition of copper material. Copper material is then deposited over the barrier layer and the surrounding field. However, copper fill of the features usually results in excess copper material, or overburden, on the substrate surface that must be removed to form a copper filled feature in the dielectric material and prepare the substrate surface for subsequent processing.

One challenge that is presented in polishing copper materials is that the interface between the conductive material and the barrier layer is generally non-planar and residual copper material is retained in irregularities formed by the non-planar interface. Further, the conductive material and the barrier materials are often removed from the substrate surface at different rates, both of which can result in excess conductive material being retained as residues on the substrate surface. Additionally, the substrate surface may have different surface topography, depending on the density or size of features formed therein. Copper material is removed at different removal rates along the different surface topography of the substrate surface, which makes effective removal of copper material from the substrate surface and final planarity of the substrate surface difficult to achieve.

One solution to remove all of the desired copper material from the substrate surface is to overpolish the substrate surface. However, overpolishing of some materials can result in the formation of topographical defects, such as concavities or depressions in features, referred to as dishing, or excessive removal of dielectric material, referred to as erosion. The topographical defects from dishing and erosion can further lead to non-uniform removal of additional materials, such as barrier layer materials disposed thereunder, and produce a substrate surface having a less than desirable polishing quality.

Another problem with the polishing of copper surfaces arises from the use of low dielectric constant (low k) dielectric materials to form copper damascenes in the substrate surface. Low k dielectric materials, such as carbon doped silicon oxides, may deform or fracture under conventional polishing pressures (i.e., about 6 psi), called downforce, which can detrimentally affect substrate polish quality and detrimentally affect device formation. For example, relative rotational movement between the substrate and a polishing pad can induce a shear force along the substrate surface and deform the low k material to form topographical defects, which can detrimentally affect subsequent polishing.

One solution for polishing copper in low dielectric materials is by polishing copper by electrochemical mechanical polishing (ECMP) techniques. ECMP techniques remove conductive material from a substrate surface by electrochemical dissolution while concurrently polishing the substrate with reduced mechanical abrasion compared to conventional CMP processes. The electrochemical dissolution is performed by applying a bias between a cathode and substrate surface to remove conductive materials from a substrate surface into a surrounding electrolyte.

In one embodiment of an ECMP system, the bias is applied by a ring of conductive contacts in electrical communication with the substrate surface in a substrate support device, such as a substrate carrier head. However, the contact ring has been observed to exhibit non-uniform distribution of current over the substrate surface, which results in non-uniform dissolution, especially during overpolishing where a ring of conductive contacts doesn't efficiently remove residues. Mechanical abrasion is performed by contacting the substrate with a conventional polishing pad and providing relative motion between the substrate and polishing pad. However, conventional polishing pads often limit electrolyte flow to the surface of the substrate. Additionally, the polishing pad may be composed of insulative materials that may interfere with the application of bias to the substrate surface and result in non-uniform or variable dissolution of material from the substrate surface.

As a result, there is a need for an improved polishing article for the removal of conductive material on a substrate surface.

SUMMARY OF THE INVENTION

Aspects of the invention generally provide an article of manufacture and an apparatus for planarizing a layer on a substrate using electrochemical deposition techniques, electrochemical dissolution techniques, polishing techniques, and/or combinations thereof.

In one aspect, a polishing article for polishing a substrate includes a body having a surface adapted to polish the substrate and at least one conductive element embedded at least partially in the body. The conductive element may include fibers coated with a conductive material, a conductive filler, or combinations thereof, which may be disposed in a binder material. The conductive element may include a fabric of interwoven fibers coated with the conductive material embedded at least partially in the body, a composite of fibers coated with the conductive material, conductive fillers, or combinations thereof, and a binder, embedded at least partially in the body, or combinations thereof. The conductive element may have a contact surface that extends beyond a plane defined by the polishing surface and may comprise a coil, one or more loops, one or more strands, an interwoven fabric of materials, or combinations thereof. A plurality of perforations and a plurality of grooves may be formed in the polishing article to facilitate flow of material through and across the polishing article.

In another aspect, a polishing article is provided for processing a substrate surface, such as a conductive layer deposited on the substrate surface. The polishing article include a body comprising at least a portion of fibers coated with a conductive material, conductive fillers, or combinations thereof, and adapted to polish the substrate. A plurality of perforations and a plurality of grooves may be formed in the polishing article to facilitate flow of material through and around the polishing article.

In another aspect, the polishing articles may be disposed in an apparatus for processing a substrate including a basin, a permeable disc disposed in the basin, the polishing article or the article of manufacture disposed on the permeable disk, an electrode disposed in the basin between the permeable disc and the bottom of the basin, and a polishing head adapted to retain the substrate during processing.

In another aspect, the polishing articles may be used as a conductive polishing article in a method for processing a substrate including providing an apparatus containing an enclosure, disposing a conductive polishing article in the enclosure, supplying an electrically conductive solution to the enclosure at a flow rate up to about 20 gallons per minute (GPM), positioning the substrate adjacent the conductive polishing article in the electrically conductive solution, contacting a surface of the substrate with the conductive polishing article in the electrically conductive solution, applying a bias between an electrode and the conductive polishing article, and removing at least a portion of the surface of the substrate surface.

In another embodiment of the invention, a polishing article for processing a substrate comprises a fabric layer having a conductive layer disposed thereover. The conductive layer has an exposed surface adapted to polish a substrate. The fabric layer may be woven or non-woven. The conductive layer may be comprised of a soft conductive material and, in one embodiment, the exposed surface may be planar or embossed.

In another embodiment of the invention, a polishing article for processing a substrate comprises a conductive fabric layer having a conductive layer disposed thereover. The conductive layer has an exposed surface adapted to polish a substrate. The conductive fabric layer may be woven or non-woven. The conductive layer may be comprised of a soft conductive material and, in one embodiment, the exposed surface may be planar or embossed.

In another embodiment of the invention, a polishing article for processing a substrate comprises a conductive fabric layer having a nonconductive layer disposed thereover. The nonconductive layer has an exposed surface adapted to polish a substrate with at least partially exposed conductive fabric to positively bias polishing substrate. The conductive fabric layer may be woven or non-woven. The nonconductive layer may be comprised of an abrasive material and, in one embodiment, the exposed surface may be planar or embossed.

In another embodiment of the invention, a polishing article for processing a substrate comprises a conductive portion having abrasive elements extending therefrom. In another embodiment of the invention, a polishing article for processing a substrate comprises conductive portion having conductive rollers extending therefrom. In one embodiment, the conductive rollers have a polymer core at least partially covered by a conductive coating that is comprised of a soft conductive material.

In another aspect, a ball assembly is provided. In one embodiment, the ball assembly includes a housing, a ball, a conductive adapter and a contact element. The housing has an annular seat extending into a first end of an interior passage. The conductive adapter is coupled to a second end of the housing. The contact element electrically couples the adapter and the ball with is retained in the housing between seat and the adapter.

BRIEF DESCRIPTION OF THE DRAWINGS

So that the manner in which the above recited aspects of the invention are attained and can be understood in detail, a more particular description of the invention, briefly summarized above, may be had by reference to embodiments thereof which are illustrated in the appended drawings.

It is to be noted, however, that the appended drawings illustrate only typical embodiments of this invention and, therefore, are not to be considered limiting of its scope, for the invention may admit to other equally effective embodiments.

FIGS. 13A-B are sectional views of other embodiments of polishing articles;

FIGS. 20A-B are side and exploded views of the ball assembly of FIG. 19;

FIG. 21 is one embodiment of a contact element of the ball assembly of FIGS. 19 and 20A-B;

DETAILED DESCRIPTION

The words and phrases used herein should be given their ordinary and customary meaning in the art by one skilled in the art unless otherwise further defined. Chemical-mechanical polishing should be broadly construed and includes, but is not limited to, abrading a substrate surface by chemical activity, mechanical activity, or a combination of both chemical and mechanical activity. Electropolishing should be broadly construed and includes, but is not limited to, planarizing a substrate by the application of electrochemical activity, such as by anodic dissolution.

Electrochemical mechanical polishing (ECMP) should be broadly construed and includes, but is not limited to, planarizing a substrate by the application of electrochemical activity, chemical activity, mechanical activity, or a combination of electrochemical, chemical, and mechanical activity to remove material from a substrate surface.

Electrochemical mechanical plating process (ECMPP) should be broadly construed and includes, but is not limited to, electrochemically depositing material on a substrate and generally planarizing the deposited material by the application of electrochemical activity, chemical activity, mechanical activity, or a combination of electrochemical, chemical, and mechanical activity.

Anodic dissolution should be broadly construed and includes, but is not limited to, the application of an anodic bias to a substrate directly or indirectly which results in the removal of conductive material from a substrate surface and into a surrounding electrolyte solution. Polishing surface is broadly defined as the portion of an article of manufacture that at least partially contacts a substrate surface during processing or electrically couples an article of manufacture to a substrate surface either directly through contact or indirectly through an electrically conductive medium.

Polishing Apparatus

Figure 1:
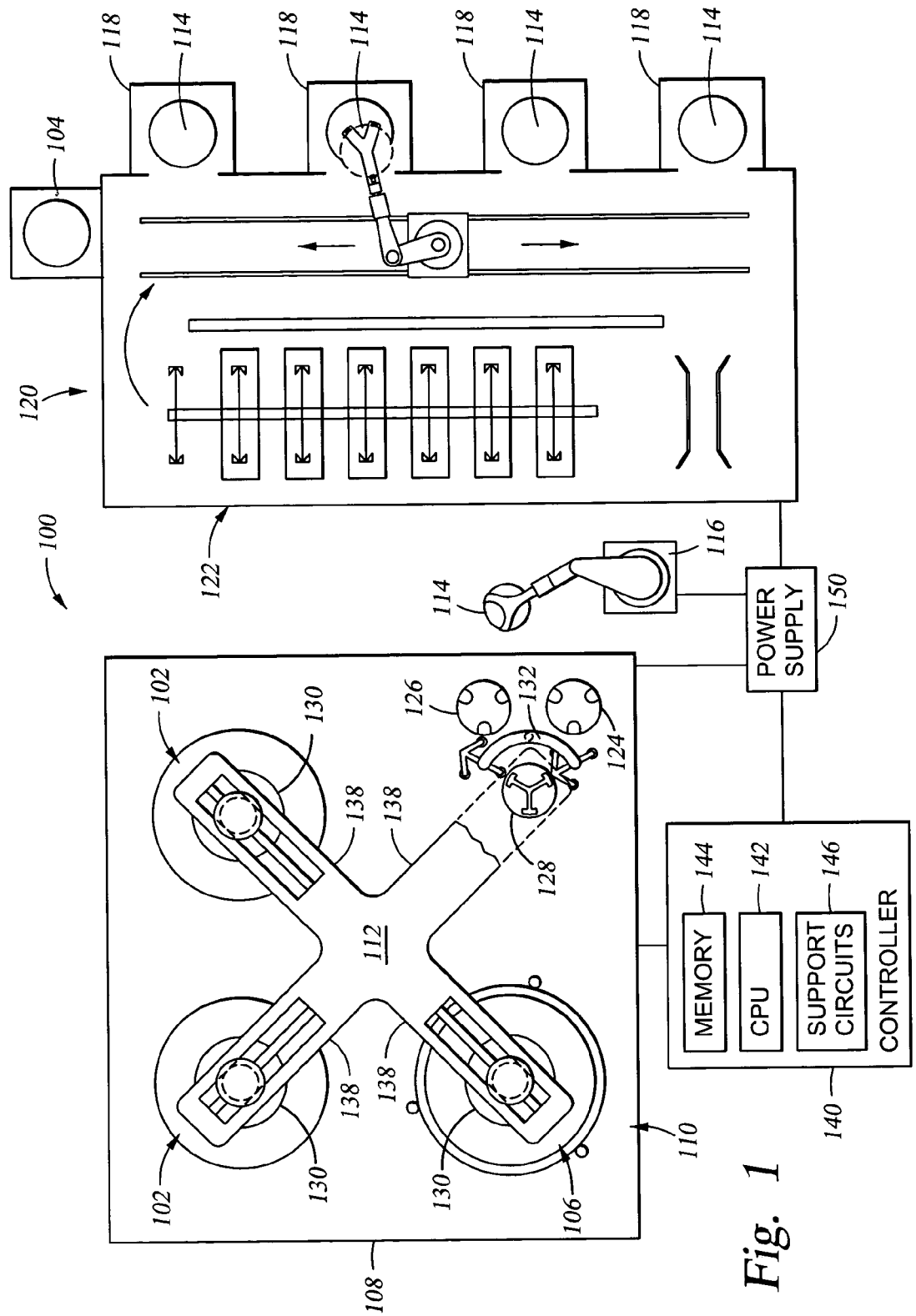
FIG. 1 is a plan view of one embodiment of a processing apparatus of the invention.

FIG. 1 depicts a processing apparatus 100 having at least one station suitable for electrochemical deposition and chemical mechanical polishing, such as electrochemical mechanical polishing (ECMP) station 102 and at least one conventional polishing or buffing station 106 disposed on a single platform or tool. One polishing tool that may be adapted to benefit from the invention is a MIRRA® Mesa™ chemical mechanical polisher available from Applied Materials, Inc. located in Santa Clara, Calif.

For example, in the apparatus 100 shown in FIG. 1, the apparatus 100 includes two ECMP stations 102 and one polishing station 106. The stations may be used for processing a substrate surface. For example, a substrate having feature definitions formed therein and filled with a barrier layer and then a conductive material disposed over the barrier layer may have the conducive material removed in two steps in the two ECMP stations 102 with the barrier layer polished in the polishing station 106 to form a planarized surface.

The exemplary apparatus 100 generally includes a base 108 that supports one or more ECMP stations 102, one or more polishing stations 106, a transfer station 110 and a carousel 112. The transfer station 110 generally facilitates transfer of substrates 114 to and from the apparatus 100 via a loading robot 116. The loading robot 116 typically transfers substrates 114 between the transfer station 110 and a factory interface 120 that may include a cleaning module 122, a metrology device 104 and one or more substrate storage cassettes 118. One example of a metrology device 104 is a NovaScan™ Integrated Thickness Monitoring system, available from Nova Measuring Instruments, Inc., located in Phoenix, Ariz.

Alternatively, the loading robot 116 (or factory interface 120) may transfer substrates to one or more other processing tools (not shown) such as a chemical vapor deposition tool, physical vapor deposition tool, etch tool and the like.

In one embodiment, the transfer station 110 comprises at least an input buffer station 124, an output buffer station 126, a transfer robot 132, and a load cup assembly 128. The loading robot 116 places the substrate 114 onto the input buffer station 124. The transfer robot 132 has two gripper assemblies, each having pneumatic gripper fingers that hold the substrate 114 by the substrate's edge. The transfer robot 132 lifts the substrate 114 from the input buffer station 124 and rotates the gripper and substrate 114 to position the substrate 114 over the load cup assembly 128, then places the substrate 114 down onto the load cup assembly 128.

The carousel 112 generally supports a plurality of polishing heads 130, each of which retains one substrate 114 during processing. The carousel 112 transfers the polishing heads 130 between the transfer station 110, the one or more ECMP stations 102 and the one or more polishing stations 106. One carousel 112 that may be adapted to benefit from the invention is generally described in U.S. Pat. No. 5,804,507, issued Sep. 8, 1998 to Tolles et al., which is hereby incorporated by reference in its entirety.

Generally, the carousel 112 is centrally disposed on the base 108. The carousel 112 typically includes a plurality of arms 138. Each arm 138 generally supports one of the polishing heads 130. One of the arms 138 depicted in FIG. 1 is not shown so that the transfer station 110 may be seen. The carousel 112 is indexable such that the polishing head 130 may be moved between the stations 102, 106 and the transfer station 110 in a sequence defined by the user.

Generally the polishing head 130 retains the substrate 114 while the substrate 114 is disposed in the ECMP station 102 or polishing station 106. The arrangement of the ECMP stations 106 and polishing stations 102 on the apparatus 100 allow for the substrate 114 to be sequentially plated or polished by moving the substrate between stations while being retained in the same polishing head 130. One polishing head that may be adapted to the invention is a TITAN HEAD™ substrate carrier, manufactured by Applied Materials, Inc., located in Santa Clara, Calif.

Examples of embodiments of polishing heads 130 that may be used with the polishing apparatus 100 described herein are described in U.S. Pat. No. 6,183,354, issued Feb. 6, 2001 to Zuniga, et al., which is hereby incorporated by reference in its entirety.

To facilitate control of the polishing apparatus 100 and processes performed thereon, a controller 140 comprising a central processing unit (CPU) 142, memory 144, and support circuits 146, is connected to the polishing apparatus 100. The CPU 142 may be one of any form of computer processor that can be used in an industrial setting for controlling various drives and pressures. The memory 144 is connected to the CPU 142. The memory 144, or computer-readable medium, may be one or more of readily available memory such as random access memory (RAM), read only memory (ROM), floppy disk, hard disk, or any other form of digital storage, local or remote. The support circuits 146 are connected to the CPU 142 for supporting the processor in a conventional manner. These circuits include cache, power supplies, clock circuits, input/output circuitry, subsystems, and the like.

Power to operate the polishing apparatus 100 and/or the controller 140 is provided by a power supply 150. Illustratively, the power supply 150 is shown connected to multiple components of the polishing apparatus 100, including the transfer station 110, the factory interface 120, the loading robot 116 and the controller 140. In other embodiments separate power supplies are provided for two or more components of the polishing apparatus 100.

Figure 2:
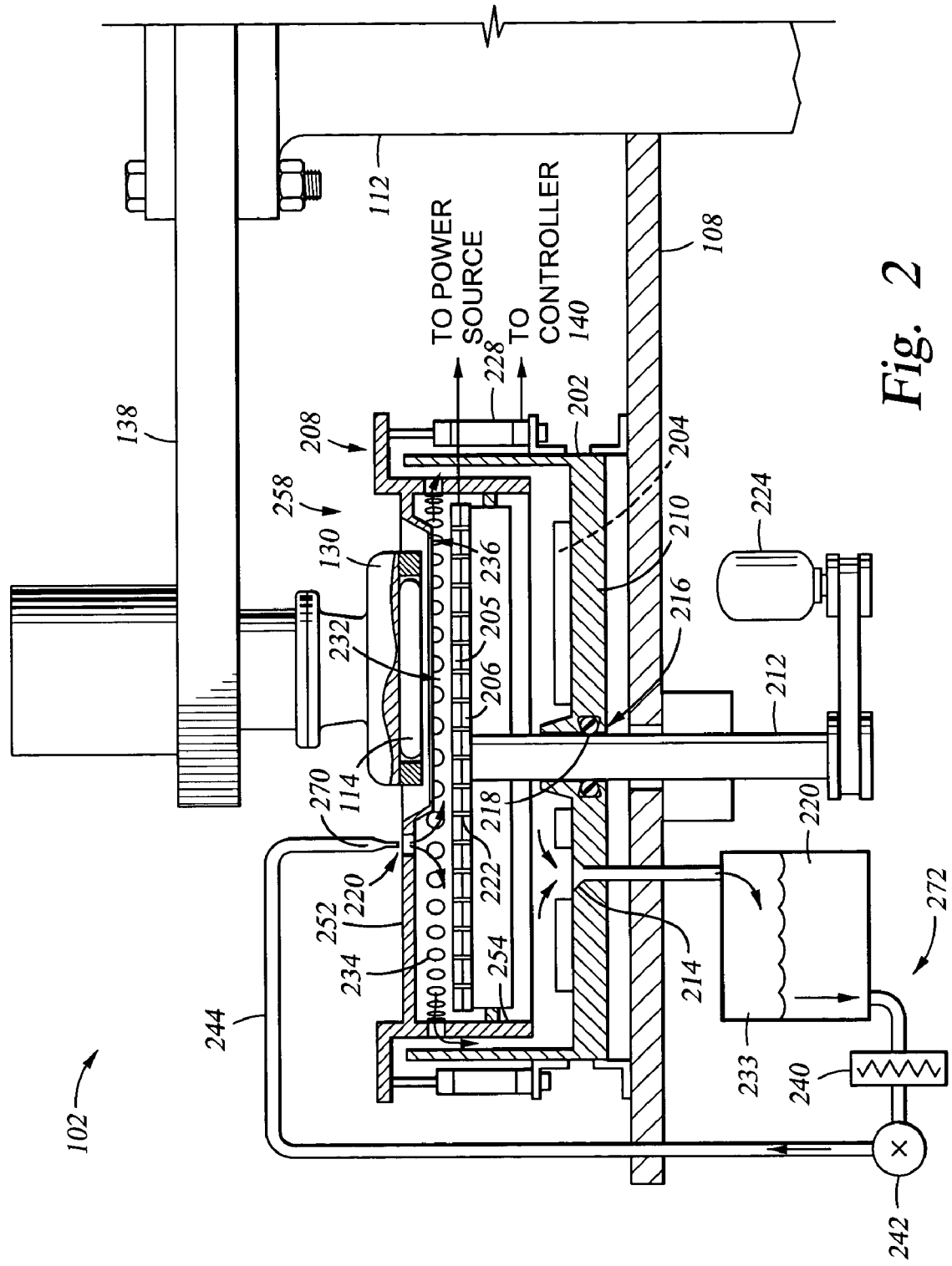
FIG. 2 is a sectional view of one embodiment of an ECMP station.

FIG. 2 depicts a sectional view of the polishing head 130 supported above an ECMP station 102. The ECMP station 102 generally includes a basin 202, an electrode 204, polishing article 205, a disc 206 and a cover 208. In one embodiment, the basin 202 is coupled to the base 108 of the polishing apparatus 100. The basin 202 generally defines a container or electrolyte cell in which a conductive fluid such as an electrolyte 220 can be confined. The electrolyte 220 used in processing the substrate 114 can be used to process metals such as copper, aluminum, tungsten, gold, silver, or any other materials that can be electrochemically deposited onto or electrochemically removed from the substrate 114.

The basin 202 can be a bowl shaped member made of a plastic such as fluoropolymers, TEFLON®, PFA, PE, PES, or other materials that are compatible with electroplating and electropolishing chemistries. The basin 202 has a bottom 210 that includes an aperture 216 and a drain 214. The aperture 216 is generally disposed in the center of the bottom 210 and allows a shaft 212 to pass therethrough. A seal 218 is disposed between the aperture 216 and the shaft 212 and allows the shaft 212 to rotate while preventing fluids disposed in the basin 202 from passing through the aperture 216.

The basin 202 typically includes the electrode 204, the disc 206, and the polishing article 205 disposed therein. Polishing article 205, such as a polishing pad, is disposed and supported in the basin 202 on the disc 206.

The electrode 204 is a counter-electrode to the substrate 114 and/or polishing article 205 contacting a substrate surface. The polishing article 205 is at least partially conductive and may act as an electrode in combination with the substrate during electrochemical processes, such as an electrochemical mechanical plating process (ECMPP), which includes electrochemical deposition and chemical mechanical polishing, or electrochemical dissolution. The electrode 204 may be an anode or cathode depending upon the positive bias (anode) or negative bias (cathode) applied between the electrode 204 and polishing article 405.

For example, depositing material from an electrolyte on the substrate surface, the electrode 204 acts as an anode and the substrate surface and/or polishing article 205 acts as a cathode. When removing material from a substrate surface, such as by dissolution from an applied bias, the electrode 204 functions as a cathode and the substrate surface and/or polishing article 205 may act as an anode for the dissolution process.

The electrode 204 is generally positioned between the disc 206 and the bottom 210 of the basin 202 where it may be immersed in the electrolyte 220. The electrode 204 can be a plate-like member, a plate having multiple apertures formed therethrough, or a plurality of electrode pieces disposed in a permeable membrane or container. A permeable membrane (not shown) may be disposed between the disc 206 and the electrode 204 or electrode 204 and polishing article 205 to filter bubbles, such as hydrogen bubbles, from the wafer surface and to reduce defect formation and stabilize or more uniformly apply current or power therebetween.

For electrodeposition processes, the electrode 204 is made of the material to be deposited or removed, such as copper, aluminum, gold, silver, tungsten and other materials which can be electrochemically deposited on the substrate 114. For electrochemical removal processes, such as anodic dissolution, the electrode 204 may include a non-consumable electrode of a material other than the deposited material, for example, platinum, carbon, or aluminum, for copper dissolution.

The polishing article 205 can be a pad, a web or a belt of material, which is compatible with the fluid environment and the processing specifications. In the embodiment depicted in FIG. 2, the polishing article 205 is circular in form and positioned at an upper end of the basin 202, supported on its lower surface by the disc 206. The polishing article 205 includes at least a partially conductive surface of a conductive material, such as one or more conductive elements, for contact with the substrate surface during processing. The polishing article 205 may be a portion or all of a conductive polishing material or a composite of a conductive polishing material embedded in or disposed on a conventional polishing material. For example the conductive material may be disposed on a "backing" material disposed between the disc 206 and polishing article 205 to tailor the compliance and/or durometer of the polishing article 205 during processing.

The basin 202, the cover 208, and the disc 206 may be movably disposed on the base 108. The basin 202, cover 208 and disc 206 may be axially moved toward the base 108 to facilitate clearance of the polishing head 130 as the carousel 112 indexes the substrate 114 between the ECMP and polishing stations 102, 106. The disc 206 is disposed in the basin 202 and coupled to the shaft 212. The shaft 212 is generally coupled to a motor 224 disposed below the base 108. The motor 224, in response to a signal from the controller 140, rotates the disc 206 at a predetermined rate.

The disc 206 may be a perforated article support made from a material compatible with the electrolyte 220 which would not detrimentally affect polishing. The disc 206 may be fabricated from a polymer, for example fluoropolymers, PE, TEFLON®, PFA, PES, HDPE, UHMW or the like. The disc 206 can be secured in the basin 202 using fasteners such as screws or other means such as snap or interference fit with the enclosure, being suspended therein and the like. The disc 206 is preferably spaced from the electrode 204 to provide a wider process window, thus reducing the sensitivity of depositing material and removing material from the substrate surface to the electrode 204 dimensions.

The disc 206 is generally permeable to the electrolyte 220. In one embodiment, the disc 206 includes a plurality of perforations or channels 222 formed therein. Perforations include apertures, holes, openings, or passages formed partially or completely through an object, such as the polishing article. The perforation size and density is selected to provide uniform distribution of the electrolyte 220 through the disc 206 to the substrate 114.

In one aspect of the disc 206 includes perforations having a diameter between about 0.02 inches (0.5 millimeters) and about 0.4 inches (10 mm). The perforations may have a perforation density between about 20% and about 80% of the polishing article. A perforation density of about 50% has been observed to provide electrolyte flow with minimal detrimental effects to polishing processes. Generally, the perforations of the disc 206 and the polishing article 205 are aligned to provide for sufficient mass flow of electrolyte through the disc 206 and polishing article 205 to the substrate surface. The polishing article 205 may be disposed on the disc 206 by a mechanical clamp or conductive adhesive.

While the polishing articles described herein for electrochemical-mechanical polishing (ECMP) processes, the invention contemplates using the conductive polishing article in other fabrication processes involving electrochemical activity. Examples of such processes using electrochemical activity include electrochemical deposition, which involves the polishing article 205 being used to apply an uniform bias to a substrate surface for depositing a conductive material without the use of conventional bias application apparatus, such as edge contacts, and electrochemical mechanical plating processes (ECMPP) that include a combination of electrochemical deposition and chemical mechanical polishing.

In operation, the polishing article 205 is disposed on the disc 206 in an electrolyte in the basin 202. A substrate 114 on the polishing head is disposed in the electrolyte and contacted with the polishing article 205. Electrolyte is flowed through the perforations of the disc 206 and the polishing article 205 and is distributed on the substrate surface by grooves formed therein. Power from a power source is then applied to the conductive polishing article 205 and the electrode 204, and conductive material, such as copper, in the electrolyte is then removed by an anodic dissolution method.

The electrolyte 220 is flowed from a reservoir 233 into the volume 232 via a nozzle 270. The electrolyte 220 is prevented from overflowing the volume 232 by a plurality of holes 234 disposed in a skirt 254. The holes 234 generally provide a path through the cover 208 for the electrolyte 220 exiting the volume 232 and flowing into the lower portion of the basin 202. At least a portion of the holes 234 are generally positioned between a lower surface 236 of the depression 258 and the center portion 252. As the holes 234 are typically higher than the lower surface 236 of the depression 258, the electrolyte 220 fills the volume 232 and is thus brought into contact with the substrate 114 and polishing medium 205. Thus, the substrate 114 maintains contact with the electrolyte 220 through the complete range of relative spacing between the cover 208 and the disc 206.

The electrolyte 220 collected in the basin 202 generally flows through the drain 214 disposed at the bottom 210 into the fluid delivery system 272. The fluid delivery system 272 typically includes the reservoir 233 and a pump 242. The electrolyte 220 flowing into the fluid delivery system 272 is collected in the reservoir 233. The pump 242 transfers the electrolyte 220 from the reservoir 233 through a supply line 244 to the nozzle 270 where the electrolyte 220 recycled through the ECMP station 102. A filter 240 is generally disposed between the reservoir 233 and the nozzle 270 to remove particles and agglomerated material that may be present in the electrolyte 220.

Electrolyte solutions may include commercially available electrolytes. For example, in copper containing material removal, the electrolyte may include sulfuric acid based electrolytes or phosphoric acid based electrolytes, such as potassium phosphate ($K_3PO_4$), or combinations thereof. The electrolyte may also contain derivatives of sulfuric acid based electrolytes, such as copper sulfate, and derivatives of phosphoric acid based electrolytes, such as copper phosphate. Electrolytes having perchloric acid-acetic acid solutions and derivatives thereof may also be used.

Additionally, the invention contemplates using electrolyte compositions conventionally used in electroplating or electropolishing processes, including conventionally used electroplating or electropolishing additives, such as brighteners among others. One source for electrolyte solutions used for electrochemical processes such as copper plating, copper anodic dissolution, or combinations thereof is Shipley Leonel, a division of Rohm and Haas, headquartered in Philadelphia, Pa., under the tradename Ultrafill 2000. An example of a suitable electrolyte composition is described in U.S. patent application Ser. No. 10/038,066, filed on Jan. 3, 2002, published as U.S. Patent Publication No. 2002/0130049, which is incorporated by reference in its entirety.

Electrolyte solutions are provided to the electrochemical cell to provide a dynamic flow rate on the substrate surface or between the substrate surface and an electrode at a flow rate up to about 20 gallons per minute (GPM), such as between about 0.5 GPM and about 20 GPM, for example, at about 2 GPM. It is believed that such flow rates of electrolyte evacuate polishing material and chemical by-products from the substrate surface and allow refreshing of electrolyte material for improved polishing rates.

When using mechanical abrasion in the polishing process, the substrate 114 and polishing article 205 are rotated relative to one another to remove material from the substrate surface. Mechanical abrasion may be provided by physical contact with both conductive polishing materials and conventional polishing materials as described herein. The substrate 114 and the polishing article 205 are respectively rotated at about 5 rpms or greater, such as between about 10 rpms and about 50 rpms.

In one embodiment, a high rotational speed polishing process may be used. The high rotational speed process includes rotating the polishing article 205 at a platen speed of about 150 rpm or greater, such as between about 150 rpm and about 750 rpm; and the substrate 114 may be rotated at a rotational speed between about 150 rpm and about 500 rpm, such as between about 300 rpm and about 500 rpm. Further description of a high rotational speed polishing process that may be used with the polishing articles, processes, and apparatus described herein is disclosed in U.S. patent application Ser. No. 60/308,030, filed on Jul. 25, 2001, and entitled, "Method And Apparatus For Chemical Mechanical Polishing Of Semiconductor Substrates." Other motion, including orbital motion or a sweeping motion across the substrate surface, may also be performed during the process.

When contacting the substrate surface, a pressure of about 6 psi or less, such as about 2 psi or less is applied between the polishing article 205 and the substrate surface. If a substrate containing low dielectric constant material is being polished, a pressure between of about 2 psi or less, such as about 0.5 psi or less is used to press the substrate 114 against the polishing article 205 during polishing of the substrate. In one aspect, a pressure between about 0.1 psi and about 0.2 psi may be used to polish substrates with conductive polishing articles as described herein.

In anodic dissolution, a potential difference or bias is applied between the electrode 204, performing as a cathode, and the polishing surface 310 (See, FIG. 3) of the polishing article 205, performing as the anode. The substrate in contact with the polishing article is polarized via the conductive polishing surface article 310 at the same time the bias is applied to the conductive article support member. The application of the bias allows removal of conductive material, such as copper-containing materials, formed on a substrate surface. Establishing the bias may include the application of a voltage of about 15 volts or less to the substrate surface. A voltage between about 0.1 volts and about 10 volts may be used to dissolve copper-containing material from the substrate surface and into the electrolyte. The bias may also produce a current density between about 0.1 milliamps/$cm^2$ and about 50 milliamps/$cm^2$, or between about 0.1 amps to about 20 amps for a 200 mm substrate.

The signal provided by the power supply 150 to establish the potential difference and perform the anodic dissolution process may be varied depending upon the requirements for removing material from the substrate surface. For example, a time varying anodic signal may be provided to the conductive polishing medium 205. The signal may also be applied by electrical pulse modulation techniques. The electrical pulse modification technique comprises applying a constant current density or voltage over the substrate for a first time period, then applying a constant reverse voltage or stopping applying a voltage over the substrate for a second time period, and repeating the first and second steps. For example, the electrical pulse modification technique may use a varying potential from between about −0.1 volts and about −15 volts to between about 0.1 volts and about 15 volts.

With the correct perforation pattern and density on the polishing media, it is believed that biasing the substrate from the polishing article 205 provides uniform dissolution of conductive materials, such as metals, into the electrolyte from the substrate surface as compared to the higher edge removal rate and lower center removal rate from conventional edge contact-pins bias.

Conductive material, such as copper containing material can be removed from at least a portion of the substrate surface at a rate of about 15,000 Å/min or less, such as between about 100 Å/min and about 15,000 Å/min. In one embodiment of the invention where the copper material to be removed is about 12,000 Å thick, the voltage may be applied to the conductive polishing article 205 to provide a removal rate between about 100 Å/min and about 8,000 Å/min.

Following the electropolishing process, the substrate may be further polished or buffed to remove barrier layer materials, remove surface defects from dielectric materials, or improve planarity of the polishing process using the conductive polishing article. An example of a suitable buffing process and composition is disclosed in co-pending U.S. patent application Ser. No. 09/569,968, filed on May 11, 2000, and incorporated herein by reference in its entirety.

Polishing Article Materials

The polishing articles described herein may be formed from conductive materials that may comprise a conductive polishing material or may comprise a conductive element disposed in a dielectric or conductive polishing material. In one embodiment, a conductive polishing material may include conductive fibers, conductive fillers, or combinations thereof. The conductive fibers, conductive fillers, or combinations thereof may be dispersed in a polymeric material.

The conductive fibers may comprise conductive or dielectric materials, such as dielectric or conductive polymers or carbon-based materials, at least partially coated or covered with a conductive material including a metal, a carbon-based material, a conductive ceramic material, a conductive alloy, or combinations thereof. The conductive fibers may be in the form of fibers or filaments, a conductive fabric or cloth, one or more loops, coils, or rings of conductive fibers. Multiple layers of conductive materials, for example, multiple layers of conductive cloth or fabric, may be used to form the conductive polishing material.

The conductive fibers include dielectric or conductive fiber materials coated with a conductive material. Dielectric polymeric materials may be used as fiber materials. Examples of suitable dielectric fiber materials include polymeric materials, such as polyamides, polyimides, nylon polymer, polyurethane, polyester, polypropylene, polyethylene, polystyrene, polycarbonate, diene containing polymers, such as AES (polyacrylontrile ethylene styrene), acrylic polymers, or combinations thereof. The invention also contemplates the use of organic or inorganic materials that may be used as fibers described herein.

The conductive fiber material may comprise intrinsically conductive polymeric materials including polyacetylene, polyethylenedioxythiophene (PEDT), which is commercially available under the trade name Baytron™, polyaniline, polypyrrole, polythiophene, carbon-based fibers, or combinations thereof. Another example of a conductive polymer is polymer-noble metal hybrid materials. Polymer-noble metal hybrid materials are generally chemically inert with a surrounding electrolyte, such as those with noble metals that are resistant to oxidation. An example of a polymer-noble metal hybrid material is a platinum-polymer hybrid material. Examples of conductive polishing materials, including conductive fibers, are more fully described in co-pending U.S. patent application Ser. No. 10/033,732, filed on Dec. 27, 2001, and issued as U.S. Pat. No. 7,066,800, entitled, "Conductive Polishing Article For Electrochemical Mechanical Polishing", which is incorporated herein by reference in its entirety. The invention also contemplates the use of organic or inorganic materials that may be used as fibers described herein.

The fiber material may be solid or hollow in nature. The fiber length is in the range between about 1 μm and about 1000 mm with a diameter between about 0.1 μm and about 1 mm. In one aspect, the diameter of fiber may be between about 5 μm to about 200 μm with an aspect ratio of length to diameter of about 5 or greater, such as about 10 or greater, for conductive polymer composites and foams, such as conductive fibers disposed in polyurethane. The cross-sectional area of the fiber may be circular, elliptical, star-patterned, "snow flaked", or of any other shape of manufactured dielectric or conductive fibers. High aspect ratio fibers having a length between about 5 mm and about 1000 mm in length and between about 5 μm and about 1000 μm in diameter may be used for forming meshes, loops, fabrics or cloths, of the conductive fibers. The fibers may also have an elasticity modulus in the range between about $10^4$ psi and about $10^8$ psi. However, the invention contemplates any elastic modulus necessary to provide for compliant, elastic fibers in the polishing articles and processes described herein.

Conductive material disposed on the conductive or dielectric fiber material generally include conductive inorganic compounds, such as a metal, a metal alloy, a carbon-based material, a conductive ceramic material, a metal inorganic compound, or combinations thereof. Examples of metal that may be used for the conductive material coatings herein include noble metals, tin, lead, copper, nickel, cobalt, and combinations thereof. Noble metals include gold, platinum, palladium, iridium, rhenium, rhodium, rhenium, ruthenium, osmium, and combinations thereof, of which gold and platinum are preferred. The invention also contemplates the use of other metals for the conductive material coatings than those illustrated herein. Carbon-based material includes carbon black, graphite, and carbon particles capable of being affixed to the fiber surface. Examples of ceramic materials include niobium carbide (NbC), zirconium carbide (ZrC), tantalum carbide (TaC), titanium carbide (TiC), tungsten carbide (WC), and combinations thereof. The invention also contemplates the use of other metals, other carbon-based materials, and other ceramic materials for the conductive material coatings than those illustrated herein. Metal inorganic compounds include, for example, copper sulfide or danjenite, $Cu_9S_5$, disposed on polymeric fibers, such as acrylic or nylon fibers. The danjenite coated fibers are commercially available under the tradename Thunderon® from Nihon Sanmo Dyeing Co., Ltd, of Japan. The Thunderon® fibers typically have a coating of danjenite, $Cu_9S_5$, between about 0.03 μm and about 0.1 μm and have been observed to have conductivities of about 40 Ω/cm. The conductive coating may be disposed directly on the fiber by plating, coating, physical vapor deposition, chemical deposition, binding, or bonding of the conductive materials. Additionally, a nucleation, or seed, layer of a conductive material, for example, copper, cobalt or nickel, may be used to improve adhesion between the conductive material and the fiber material. The conductive material may be disposed on individual dielectric or conductive fibers of variable lengths as well as on shaped loops, foams, and cloths or fabrics made out of the dielectric or conductive fiber material.

An example of a suitable conductive fiber is a polyethylene fiber coated with gold. Additional examples of the conductive fibers include acrylic fibers plated with gold and nylon fibers coated with rhodium. An example of a conductive fiber using a nucleation material is a nylon fiber coated with a copper seed layer and a gold layer disposed on the copper layer.

The conductive fillers may include carbon based materials or conductive particles and fibers. Examples of conductive carbon-based materials include carbon powder, carbon fibers, carbon nanotubes, carbon nanofoam, carbon aerogels, graphite, and combinations thereof. Examples of conductive particles or fibers include intrinsically conductive polymers, dielectric or conductive particles coated with a conductive material, dielectric filler materials coated in conductive materials, conductive inorganic particles including metal particles such as gold, platinum, tin, lead and other metal or metal alloy particles, conductive ceramic particle, and combinations thereof. The conductive fillers may be partially or completely coated with a metal, such as a noble metal, a carbon-based material, conductive ceramic material, a metal inorganic compound, or combinations thereof, as described herein. An example of a filler material is a carbon fiber or graphite coated with copper or nickel. Conductive fillers may be spherical, elliptical, longitudinal with certain aspect ratio, such as 2 or greater, or of any other shape of manufactured fillers. Filler materials are broadly defined herein as materials that may be disposed in a second material to alter, the physical, chemical, or electrical properties of the second material. As such, filler materials may also include dielectric or conductive fiber material partially or completely coated in a conductive metal or conductive polymers as described herein. The fillers of dielectric or conductive fiber material partially or completely coated in a conductive metal or conductive polymers may also be complete fibers or pieces of fibers.

The conductive materials are used to coat both dielectric and conductive fibers and fillers to provide a desired level of conductivity for forming the conductive polishing material. Generally, the coating of conductive material is deposited on the fiber and/or filler material to a thickness between about 0.01 µm and about 50 µm, such as between about 0.02 µm and about 10 µm. The coating typically results in fibers or fillers having resistivities less than about 100 Ω-cm, such as between about 0.001 Ω-cm and about 32 Ω-cm. The invention contemplates that resistivities are dependent on the materials of both the fiber or filler and the coating used, and may exhibit resistivities of the conductive material coating, for example, platinum, which has a resistivity 9.81 µΩ-cm at 0° C. An example of a suitable conductive fiber includes a nylon fiber coated with about 0.1 µm copper, nickel, or cobalt, and about 2 µm of gold disposed on the copper, nickel, or cobalt layer, with a total diameter of the fiber between about 30 µm and about 90 µm.

The conductive polishing material may include a combination of the conductive or dielectric fibers material at least partially coated or covered with an additional conductive material and conductive fillers for achieving a desired electrical conductivity or other polishing article properties. An example of a combination is the used of gold coated nylon fibers and graphite as the conductive material comprising at least a portion of a conductive polishing material.

The conductive fiber material, the conductive filler material, or combinations thereof, may be dispersed in a binder material or form a composite conductive polishing material. One form of binder material is a conventional polishing material. Conventional polishing materials are generally dielectric materials such as dielectric polymeric materials. Examples of dielectric polymeric polishing materials include polyurethane and polyurethane mixed with fillers, polycarbonate, polyphenylene sulfide (PPS), Teflon™ polymers, polystyrene, ethylene-propylene-diene-methylene (EPDM), or combinations thereof, and other polishing materials used in polishing substrate surfaces. The conventional polishing material may also include felt fibers impregnated in urethane or be in a foamed state. The invention contemplates that any conventional polishing material may be used as a binder material (also known as a matrix) with the conductive fibers and fillers described herein.

Additives may be added to the binder material to assist the dispersion of conductive fibers, conductive fillers or combinations thereof, in the polymer materials. Additives may be used to improve the mechanical, thermal, and electrical properties of the polishing material formed from the fibers and/or fillers and the binder material. Additives include cross-linkers for improving polymer cross-linking and dispersants for dispersing conductive fibers or conductive fillers more uniformly in the binder material. Examples of cross-linkers include amino compounds, silane crosslinkers, polyisocyanate compounds, and combinations thereof. Examples of dispersants include N-substituted long-chain alkenyl succinimides, amine salts of high-molecular-weight organic acids, co-polymers of methacrylic or acrylic acid derivatives containing polar groups such as amines, amides, imines, imides, hydroxyl, ether, Ethylene-propylene copolymers containing polar groups such as amines, amides, imines, imides, hydroxyl, ether. In addition sulfur containing compounds, such as thioglycolic acid and related esters have been observed as effective dispersers for gold coated fibers and fillers in binder materials. The invention contemplates that the amount and types of additives will vary for the fiber or filler material as well as the binder material used, and the above examples are illustrative and should not be construed or interpreted as limiting the scope of the invention.

Further, a mesh of the conductive fiber and/or filler material may be formed in the binder material by providing sufficient amounts of conductive fiber and/or conductive filler material to form a physically continuous or electrically continuous medium or phase in the binder material. The conductive fibers and/or conductive fillers generally comprise between about 2 wt. % and about 85 wt. %, such as between about 5 wt. % and about 60 wt. %, of the polishing material when combined with a polymeric binder material.

An interwoven fabric or cloth of the fiber material coated with a conductive material, and optionally, a conductive filler, may be disposed in the binder. The fiber material coated with a conductive material may be interwoven to form a yarn. The yarns may be brought together to make a conductive mesh with the help of adhesives or coatings. The yarn may be disposed as a conductive element in a polishing pad material or may be woven into a cloth or fabric.

Alternatively, the conductive fibers and/or fillers may be combined with a bonding agent to form a composite conductive polishing material. Examples of suitable bonding agents include epoxies, silicones, urethanes, polyimides, a polyamide, a fluoropolymer, fluorinated derivatives thereof, or combinations thereof. Additional conductive material, such as conductive polymers, additional conductive fillers, or combinations thereof, may be used with the bonding agent for achieving desired electrical conductivity or other polishing article properties. The conductive fibers and/or fillers may include between about 2 wt. % and about 85 wt. %, such as between about 5 wt. % and about 60 wt. %, of the composite conductive polishing material.

The conductive fiber and/or filler material may be used to form conductive polishing materials or articles having bulk or surface resistivity of about 50 Ω-cm or less, such as a resistivity of about 3 Ω-cm or less. In one aspect of the polishing article, the polishing article or polishing surface of the polishing article has a resistivity of about 1 Ω-cm or less. Generally, the conductive polishing material or the composite of the conductive polishing material and conventional polishing material are provided to produce a conductive polishing article having a bulk resistivity or a bulk surface resistivity of about 50 Ω-cm or less. An example of a composite of the conductive polishing material and conventional polishing material includes gold or carbon coated fibers which exhibit resistivities of 1 Ω-cm or less, disposed in a conventional polishing material of polyurethane in sufficient amounts to provide a polishing article having a bulk resistivity of about 10 Ω-cm or less.

The conductive polishing materials formed from the conductive fibers and/or fillers described herein generally have mechanical properties that do not degrade under sustained electric fields and are resistant to degradation in acidic or basic electrolytes. The conductive material and any binder material used are combined to have equivalent mechanical properties, if applicable, of conventional polishing materials used in a conventional polishing article. For example, the conductive polishing material, either alone or in combination with a binder material, has a hardness of about 100 or less on the Shore D Hardness scale for polymeric materials as described by the American Society for Testing and Materials (ASTM), headquartered in Philadelphia, Pa. In one aspect, the conductive material has a hardness of about 80 or less on the Shore D Hardness scale for polymeric materials. The conductive polishing portion 310 generally includes a surface roughness of about 500 microns or less. The properties of the polishing pad are generally designed to reduce or minimize scratching of the substrate surfaces during mechanical polishing and when applying a bias to the substrate surface.

Polishing Article Structures

In one aspect, the polishing article is composed of a single layer of conductive polishing material described herein disposed on a support. In another aspect, the polishing article may comprise a plurality of material layers including at least one conductive material on the substrate surface or providing for a conductive surface for contacting a substrate and at least one article support portion or sub-pad.

Figure 3:
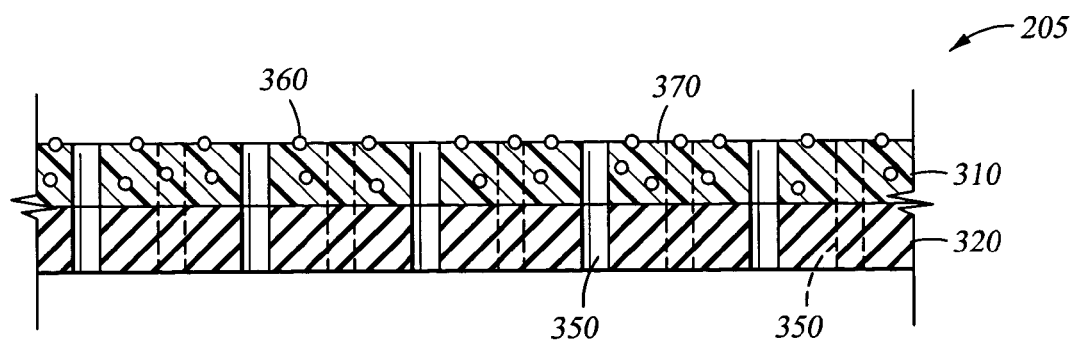
FIG. 3 is a partial cross-sectional view of one embodiment of a polishing article.

FIG. 3 is a partial cross-sectional view of one embodiment of a polishing article 205. Polishing article 205 illustrated in FIG. 3 comprises a composite polishing article having a conductive polishing portion 310 for polishing a substrate surface and an article support, or sub-pad, portion 320.

The conductive polishing portion 310 may comprise a conductive polishing material including the conductive fibers and/or conductive fillers as described herein. For example, the conductive polishing portion 310 may include a conductive material comprising conductive fibers and/or conductive fillers dispersed in a polymeric material. The conductive fillers may be disposed in a polymer binder. The conductive fillers may include soft conductive materials disposed in a polymer binder. Soft conductive materials generally have a hardness and modulus less than or equal to about that of copper. Examples of soft conductive materials include gold, tin, palladium, palladium-tin alloys, platinum, and lead, among other conductive metals, alloys and ceramic composites softer than copper. The invention contemplates the use of other conductive fillers harder than copper if their size is small enough not to scratch polishing substrate. Further, the conductive polishing portion may include one or more loops, coils, or rings of conductive fibers, or conductive fibers interwoven to form a conductive fabric or cloth. The conductive polishing portion 310 may also be comprised of multiple layers of conductive materials, for example, multiple layers of conductive cloth or fabric.

One example of the conductive polishing portion 310 includes gold coated nylon fibers and graphite particles disposed in polyurethane. Another example includes graphite particles and/or carbon fibers disposed in polyurethane or silicone. Another example includes gold or tin particles dispersed in polyurethane matrix.

In another embodiment, the conductive polishing portion 310 may have abrasive particles 360 disposed therein. At least some of the abrasive particles 360 are exposed on an upper polishing surface 370 of the conductive polishing portion 310. The abrasive particles 360 generally are configured to remove the passivation layer of the metal surface of the substrate being polished, thereby exposing the underlying metal to the electrolyte and electrochemical activity, thereby enhancing the rate of polishing during processing.

Examples of abrasive particles 360 include ceramic, inorganic, organic, or polymer particle strong enough to break the passivation layer formed at the metal surface. Polymer particles may be solid or spongy to tailor the wear rate of the polishing portion 310.

The article support portion 320 generally has the same or smaller diameter or width of the conductive polishing portion 310. However, the invention contemplates the article support portion 320 having a greater width or diameter than the conductive polishing portion 310. While the figures herein illustrate a circular conductive polishing portion 310 and article support portion 320, the invention contemplates that the conductive polishing portion 310, the article support portion 320, or both may have different shapes such as rectangular surfaces or elliptical surfaces. The invention further contemplates that the conductive polishing portion 310, the article support portion 320, or both, may form a linear web or belt of material.

The article support portion 320 may comprise inert materials in the polishing process and are resistant to being consumed or damaged during ECMP. For example, the article support portion may be comprised of conventional polishing materials, including polymeric materials, for example, polyurethane and polyurethane mixed with fillers, polycarbonate, polyphenylene sulfide (PPS), ethylene-propylene-diene-methylene (EPDM), Teflon™ polymers, or combinations thereof, and other polishing materials used in polishing substrate surfaces. The article support portion 320 may be a conventional soft material, such as compressed felt fibers impregnated with urethane, for absorbing some of the pressure applied between the polishing article 205 and the carrier head 130 during processing. The soft material may have a Shore A hardness between about 20 and about 90.

Alternatively, the article support portion 320 may be made from a conductive material compatible with surrounding electrolyte that would not detrimentally affect polishing including conductive noble metals or a conductive polymer, to provide electrical conduction across the polishing article. Examples of noble metals include gold, platinum, palladium, iridium, rhenium, rhodium, rhenium, ruthenium, osmium, and combinations thereof, of which gold and platinum are preferred. Materials that are reactive with the surrounding electrolyte, such as copper, may be used if such materials are isolated from the surrounding electrolyte by an inert material, such as a conventional polishing material or a noble metal.

When the article support portion 320 is conductive, the article support portion 320 may have a greater conductivity, i.e., lower resistivity, than the conductive polishing portion 310. For example, the conductive polishing portion 310 may have a resistivity of about 1.0 Ω-cm or less as compared to an article support portion 320 comprising platinum, which has a resistivity 9.81 μΩ-cm at 0° C. A conductive article support portion 320 may provide for uniform bias or current to minimize conductive resistance along the surface of the article, for example, the radius of the article, during polishing for uniform anodic dissolution across the substrate surface. A conductive article support portion 320 may be coupled to a power source for transferring power to the conductive polishing portion 310.

Generally, the conductive polishing portion 310 is adhered to the article support portion 320 by a conventional adhesive suitable for use with polishing materials and in polishing processes. The invention contemplates the use of other means to attach the conductive polishing portion 310 onto the article support portion 320 such as compression molding and lamination. The adhesive may be conductive or dielectric depending on the requirements of the process or the desires of the manufacturer. The article support portion 320 may be affixed to a support, such as disc 206, by an adhesive or mechanical clamp. Alternatively, if polishing article 205 only includes a conductive polishing portion 310, the conductive polishing portion may be affixed to a support, such as disc 206, by an adhesive or mechanical clamp.

The conductive polishing portion 310 and the article support portion 320 of the polishing article 205 are generally permeable to the electrolyte. A plurality of perforations may be formed, respectively, in the conductive polishing portion 310 and the article support portion 320 to facilitate fluid flow therethrough. The plurality of perforations allows electrolyte to flow through and contact the surface during processing. The perforations may be inherently formed during manufacturing, such as between weaves in a conductive fabric or cloth, or may be formed and patterned through the materials by mechanical means. The perforations may be formed partially or completely through each layer of the polishing article 205. The perforations of the conductive polishing portion 310 and the perforations of the article support portion 320 may be aligned to facilitate fluid flow therethrough.

Examples of perforations 350 formed in the polishing article 205 may include apertures in the polishing article having a diameter between about 0.02 inches (0.5 millimeters) and about 0.4 inches (10 mm). The thickness of the polishing article 205 may be between about 0.1 mm and about 5 mm. For example, perforations may be spaced between about 0.1 inches and about 1 inch from one another.

The polishing article 205 may have a perforation density between about 20% and about 80% of the polishing article in order to provide sufficient mass flow of electrolyte across the polishing article surface. However, the invention contemplates perforation densities below or above the perforation density described herein that may be used to control fluid flow therethrough. In one example, a perforation density of about 50% has been observed to provide sufficient electrolyte flow to facilitate uniform anodic dissolution from the substrate surface. Perforation density is broadly described herein as the volume of polishing article that the perforations comprise. The perforation density includes the aggregate number and diameter or size of the perforations, of the surface or body of the polishing article when perforations are formed in the polishing article 205.

The perforation size and density is selected to provide uniform distribution of electrolyte through the polishing article 205 to a substrate surface. Generally, the perforation size, perforation density, and organization of the perforations of both the conductive polishing portion 310 and the article support portion 320 are configured and aligned to each other to provide for sufficient mass flow of electrolyte through the conductive polishing portion 310 and the article support portion 320 to the substrate surface.

Grooves may be disposed in the polishing article 205 to promote electrolyte flow across the polishing article 205 to provide effective or uniform electrolyte flow with the substrate surface for anodic dissolution or electroplating processes. The grooves may be partially formed in a single layer or through multiple layers. The invention contemplates grooves being formed in the upper layer or polishing surface that contacts the substrate surface. To provide increased or controlled electrolyte flow to the surface of the polishing article, a portion or plurality of the perforations may interconnect with the grooves. Alternatively, all or none of the perforations may interconnect with the grooves disposed in the polishing article 205.

Examples of grooves used to facilitate electrolyte flow include linear grooves, arcuate grooves, annular concentric grooves, radial grooves, and helical grooves among others. The grooves formed in the article 205 may have a cross-section that is square, circular, semi-circular, or any other shape that may facilitate fluid flow across the surface of the polishing article. The grooves may intersect each other. The grooves may be configured into patterns, such as an intersecting X-Y pattern disposed on the polishing surface or an intersecting triangular pattern formed on the polishing surface, or combinations thereof, to improve electrolyte flow over the surface of the substrate.

The grooves may be spaced between about 30 mils and about 300 mils apart from one another. Generally, grooves formed in the polishing article have a width between about 5 mils and about 30 mils, but may vary in size as required for polishing. An example of a groove pattern includes grooves of about 10 mils wide spaced about 60 mils apart from one another. Any suitable groove configuration, size, diameter, cross-sectional shape, or spacing may be used to provide the desired flow of electrolyte. Additional cross sections and groove configurations are more fully described in co-pending U.S. Patent Provisional Application Ser. No. 60/328,434, filed on Oct. 11, 2001, entitled "Method And Apparatus For Polishing Substrates", which is incorporated herein by reference in its entirety.

Electrolyte transport to the surface of the substrate may be enhanced by intersecting some of the perforations with the grooves to allow electrolyte to enter through one set of perforation, be evenly distributed around the substrate surface by the grooves, used in processing a substrate, and then processing electrolyte is refreshed by additional electrolyte flowing through the perforations. An example of a pad perforation and grooving is more fully described in U.S. patent application Ser. No. 10/026,854, filed Dec. 20, 2001, published as U.S. Patent Publication No. 2002/0102853, which is incorporated by reference in its entirety.

Figure 4:
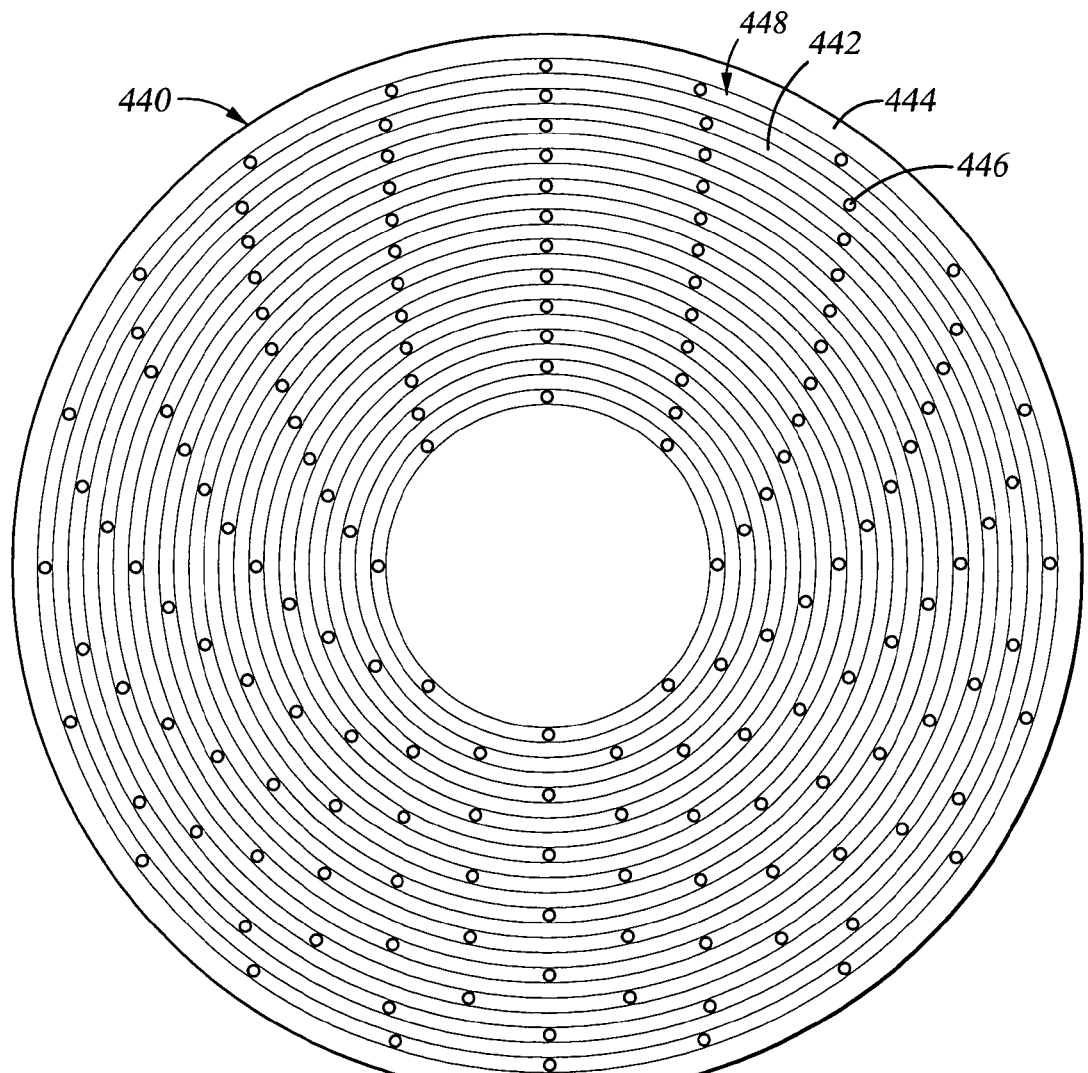
FIG. 4 is a top plan view of one embodiment of a grooved polishing article.

Examples of polishing articles having perforations and grooves are as follows. FIG. 4 is a top plan view of one embodiment of a grooved polishing article. A round pad 440 of the polishing article 205 is shown having a plurality of perforations 446 of a sufficient size and organization to allow the flow of electrolyte to the substrate surface. The perforations 446 can be spaced between about 0.1 inches and about 1 inch from one another. The perforations may be circular perforations having a diameter of between about 0.02 inches (0.5 millimeters) and about 0.4 inches (10 mm). Further the number and shape of the perforations may vary depending upon the apparatus, processing parameters, and ECMP compositions being used.

Grooves 442 are formed in the polishing surface 448 of the polishing article 205 therein to assist transport of fresh electrolyte from the bulk solution from basin 202 to the gap between the substrate and the polishing article. The grooves 442 may have various patterns, including a groove pattern of substantially circular concentric grooves on the polishing surface 448 as shown in FIG. 4, an X-Y pattern as shown in FIG. 5 and a triangular pattern as shown in FIG. 6.

Figure 5:
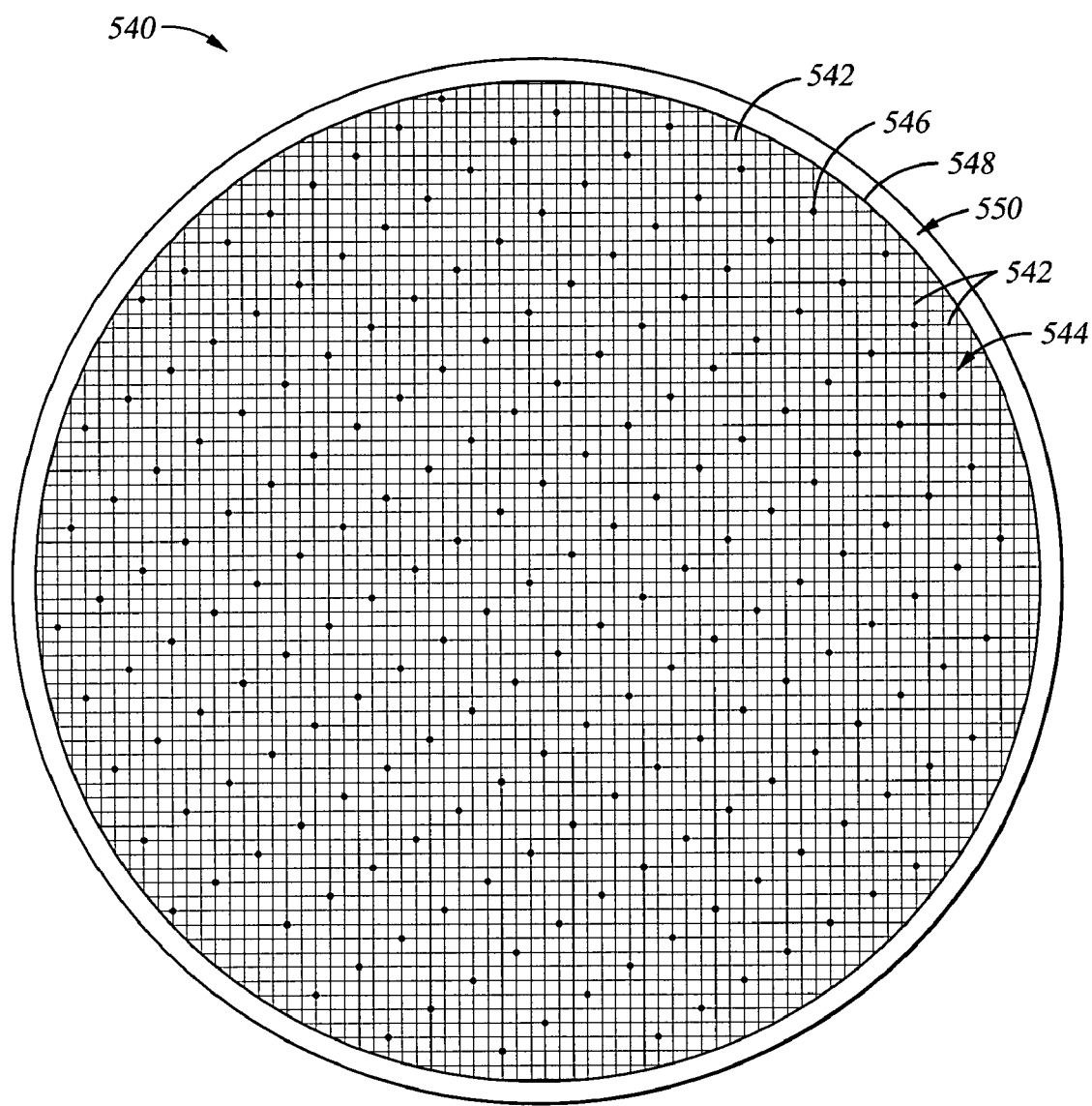
FIGS. 5-6 are top plan views of embodiments of a grooved polishing article.

FIG. 5 is a top plan view of another embodiment of a polishing pad having grooves 542 disposed in an X-Y pattern on the polishing portion 548 of a polishing pad 540. Perforations 546 may be disposed at the intersections of the vertically and horizontally disposed grooves, and may also be disposed on a vertical groove, a horizontal groove, or disposed in the polishing article 548 outside of the grooves 542. The perforations 546 and grooves 542 are disposed in the inner diameter 544 of the polishing article and the outer diameter 550 of the polishing pad 540 may be free of perforations and grooves and perforations.

Figure 6:
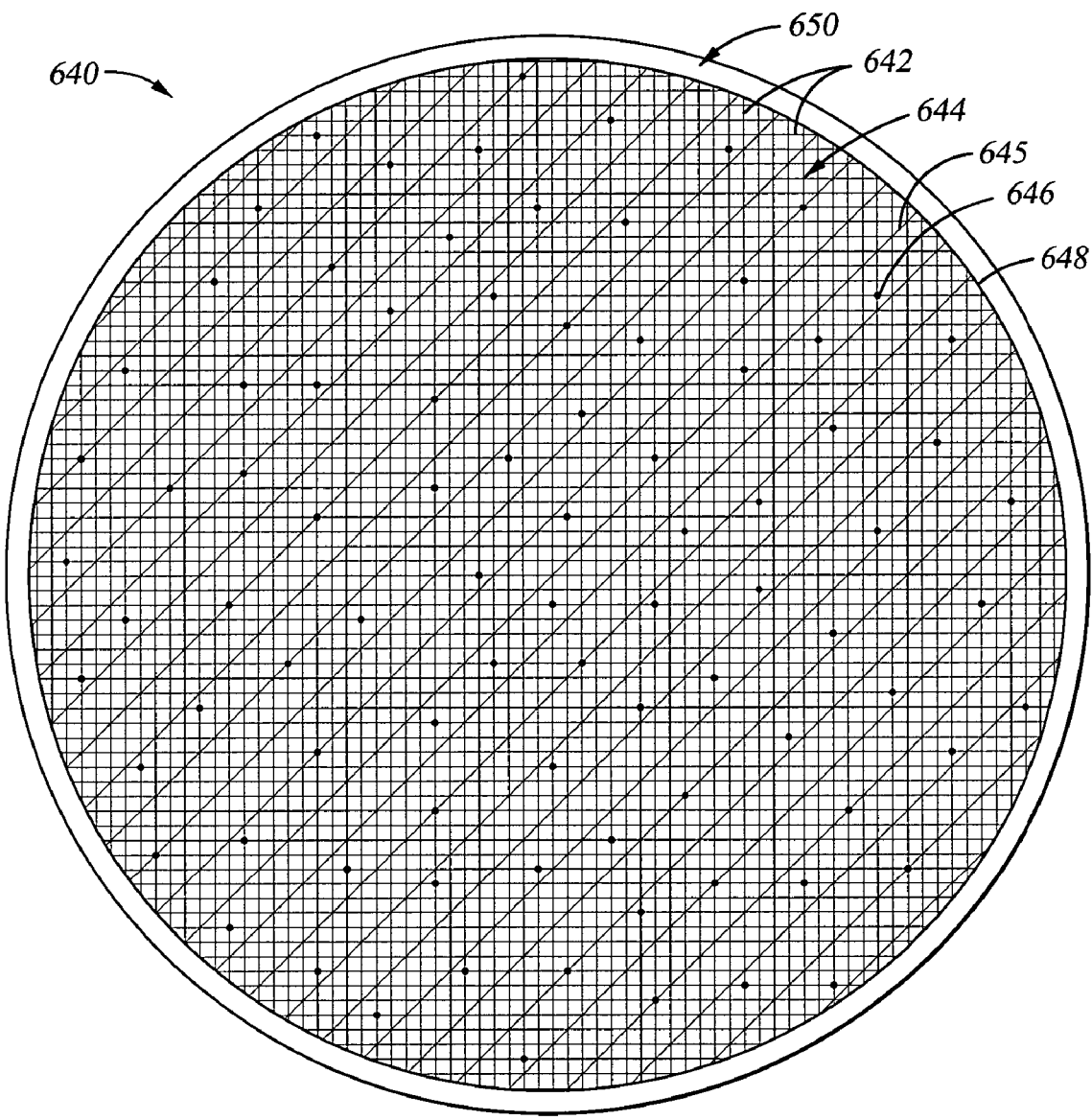

FIG. 6 is another embodiment of patterned polishing article 640. In this embodiment, grooves may be disposed in an X-Y pattern with diagonally disposed grooves 645 intersecting the X-Y patterned grooves 642. The diagonal grooves 645 may be disposed at an angle from any of the X-Y grooves 642, for example, between about 30° and about 60° from any of the X-Y grooves 642. Perforations 646 may be disposed at the intersections of the X-Y grooves 642, the intersections of the X-Y grooves 642 and diagonal grooves 645, along any of the grooves 642 and 645, or disposed in the polishing article 648 outside of the grooves 642 and 645. The perforations 646 and grooves 642 are disposed in the inner diameter 644 of the polishing article and the outer diameter 650 of the polishing pad 640 may be free of perforations and grooves.

Additional examples of groove patterns, such as spiraling grooves, serpentine grooves, and turbine grooves, are more fully described in co-pending U.S. Patent Provisional Application Ser. No. 60/328,434, filed on Oct. 11, 2001, entitled "Method And Apparatus For Polishing Substrates", which is incorporated herein by reference in its entirety.

In addition to the perforations and grooves in the polishing article 205, the conductive polishing portion 310 may be embossed to include surface texture. The embossment may improve the transportation of electrolytes, removed substrate materials, by products, and particles. The embossment may also reduce scratches to polishing substrate and modify the friction between polishing substrate and the polishing article 205. The embossed surface textures distribute uniformly across the conductive polishing portion 310. Embossed surface textures may include structures such as pyramids, islands, crosses along with circular, rectangular and square shapes, among other geometric forms. The invention contemplates other texture structures embossed on conductive polishing portion 310. The embossed surface may cover 5 to 95 percent surface area of the conductive polishing portion 310, such as between 15 percent and 90 percent surface area of the conductive polishing portion 310.

Conductive Polishing Surfaces

Figure 7A:
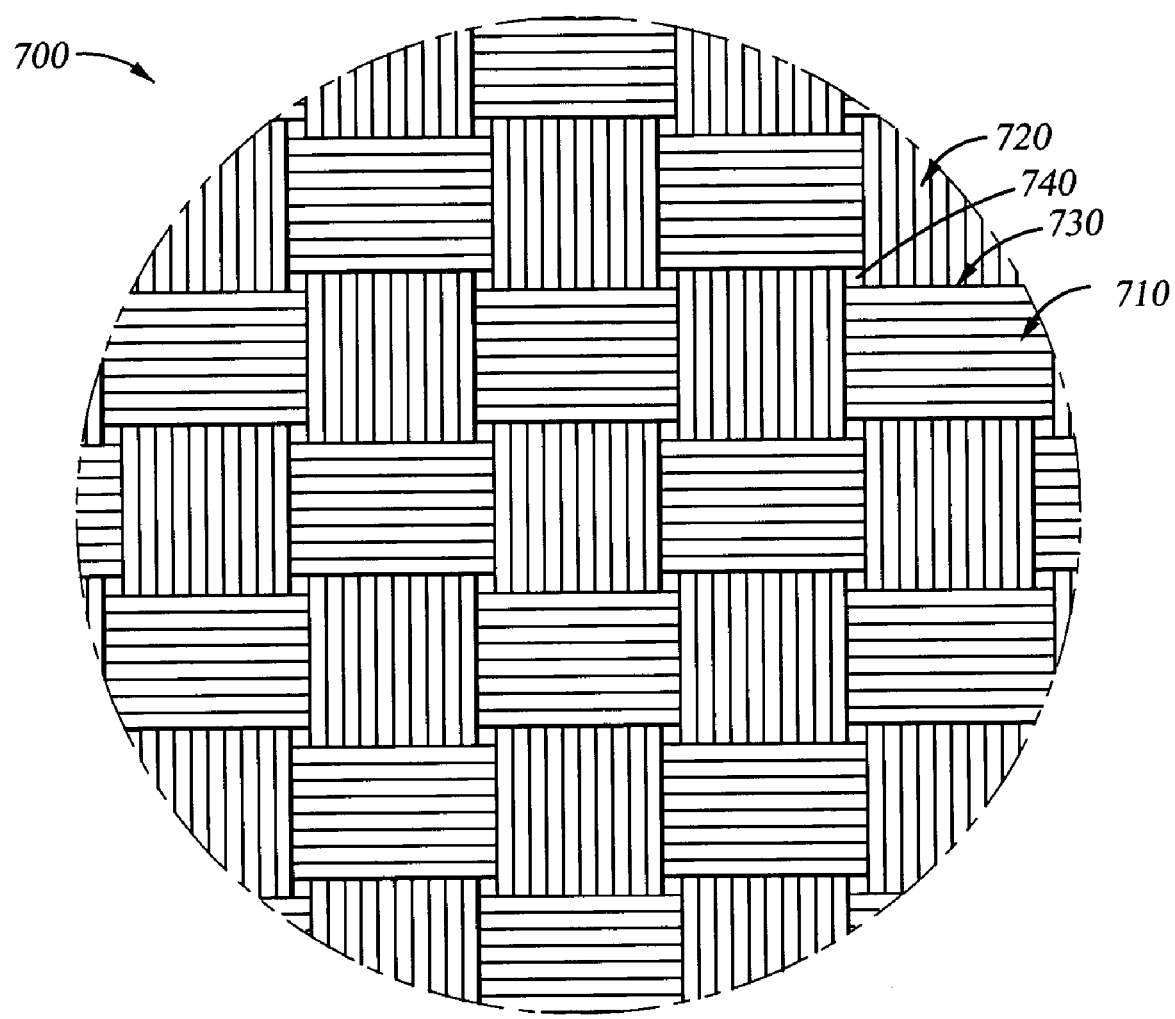
FIG. 7A is a top view of a conductive cloth or fabric described herein.

FIG. 7A is a top sectional view of one embodiment of a conductive cloth or fabric 700 that may be used to form a conductive polishing portion 310 of the polishing article 205. The conductive cloth of fabric is composed of interwoven fibers 710 coated with a conductive material as described herein.

In one embodiment, a weave or basket-weave pattern of the interwoven fibers 710 in the vertical 720 and horizontal 730 (shown in the plane of FIG. 7A) directions is illustrated in FIG. 7A. The invention contemplates other form of fabrics, such as yarns, or different interwoven, web, or mesh patterns to form the conductive cloth or fabric 700. In one aspect, the fibers 710 are interwoven to provide passages 740 in the fabric 700. The passages 740 allow electrolyte or fluid flow, including ions and electrolyte components, through the fabric 700. The conductive fabric 700 may be disposed in a polymeric binder, such as polyurethane. Conductive fillers may also be disposed in such a polymeric binder.

Figure 7B:
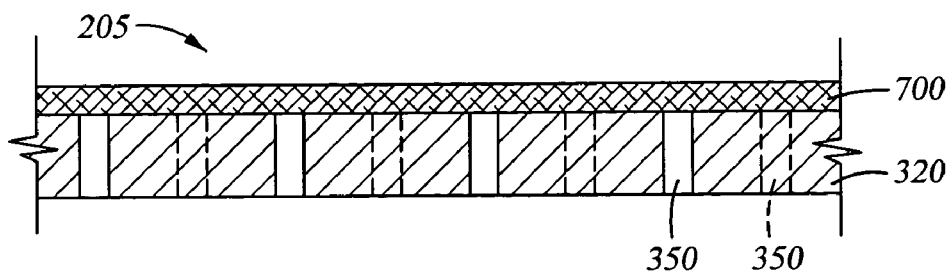
FIGS. 7B and 7C are partial cross-sectional views of polishing articles having a polishing surface comprising a conductive cloth or fabric.

FIG. 7B is a partial cross-sectional view of the conductive cloth or fabric 700 disposed on the article support portion 320 of the article 205. The conductive cloth or fabric 700 may be disposed as one or more continuous layers over the article support portion 320 including any perforations 350 formed in the article support portion 320. The cloth or fabric 700 may be secured to the article support portion 320 by an adhesive. The fabric 700 is adapted to allow electrolyte flow through the fibers, weaves, or passages formed in the cloth or fabric 700 when immersed in an electrolyte solution. Optionally an interposed layer may be included between the cloth or fabric 700 and article support portion 320. The interposed layer is permeable or includes perforations aligned with the perforations 350 for the electrolyte flow through the article 205.

Alternatively, the fabric 700 may also be perforated to increase electrolyte flow therethrough if the passages 740 are determined to not be sufficient to allow effective flow of electrolyte through the fabric 700, i.e., metal ions cannot diffuse through. The fabric 700 is typically adapted or perorated to allow flow rates of electrolyte solutions of up to about 20 gallons per minute.

Figure 7C:
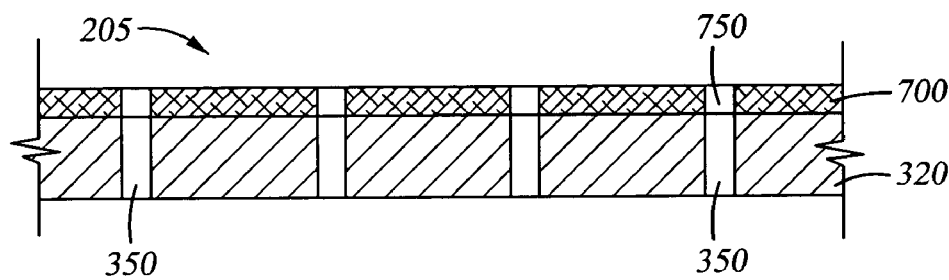

FIG. 7C is a partial cross-sectional view of the cloth or fabric 700 may be patterned with perforations 750 to match the pattern of perforations 350 in the article support portion 320. Alternatively, some or all of the perforations 750 of the conductive cloth or fabric 700 may not be aligned with the perforations 350 of the article support portion 320. Aligning or non-aligning of perforations allow the operator or manufacturer to control the volume or flow rate of electrolyte through the polishing article to contact the substrate surface.

An example of the fabric 700 is an interwoven basket weave of between about 8 and about 10 fibers wide with the fiber comprising a nylon fiber coated with gold. An example of the fiber is a nylon fiber, about 0.1 µm of cobalt, copper, or nickel material disposed on the nylon fiber, and about 2 µm of gold disposed on the cobalt, copper, or nickel material.

Alternatively, a conductive mesh may be used in place of the conductive cloth or fabric 700. The conductive mesh may comprise conductive fibers, conductive fillers, or at least a portion of a conductive cloth 700 disposed in or coated with a conductive binder. The conductive binder may comprise a non-metallic conductive polymer or a composite of conductive material disposed in a polymeric compound. A mixture of a conductive filler, such as graphite powder, graphite flakes, graphite fibers, carbon fibers, carbon powder, carbon black, metallic particles or fibers coated in a conductive material, and a polymeric material, such as polyurethane, may be used to form the conductive binder. The fibers coated with a conductive material as described herein may be used as a conductive filler for use in the conductive binders. For example, carbon fibers or gold-coated nylon fibers may be used to form a conductive binder.

The conductive binder may also include additives if needed to assist the dispersion of conductive fillers and/or fibers, improve adhesion between polymer and fillers and/or fibers, and improve adhesion between the conductive foil and the conductive binder, as well as to improve of mechanical, thermal and electrical properties of conductive binder. Examples of additives to improve adhesion include epoxies, silicones, urethanes, polyimides, or combinations thereof for improved adhesion.

The composition of the conductive fillers and/or fibers and polymeric material may be adapted to provide specific properties, such as conductivity, abrasion properties, durability factors. For example conductive binders comprising between about 2 wt. % and about 85 wt. % of conductive fillers may be used with the articles and processes described herein. Examples of materials that may be used as conductive fillers and conductive binders are more fully described in U.S. patent application Ser. No. 10/033,732, filed Dec. 27, 2001, published as U.S. Patent Publication No. 2002/0119286, which is incorporated herein by reference in its entirety.

The conductive binder may have a thickness of between about 1 microns and 10 millimeters, such as between about 10 microns and about 1 millimeter thick. Multiple layers of conductive binders may be applied to the conductive mesh. The conductive mesh may be used in the same manner as the conductive cloth or fabric 700 as shown in FIGS. 7B and 7C. The conductive binder may be applied in multiple layers over the conductive mesh. In one aspect, the conductive binder is applied to the conductive mesh after the mesh has been perforated to protect the portion of the mesh exposed from the perforation process.

Additionally, a conductive primer may be disposed on the conductive mesh before application of a conductive binder to improve adhesion of the conductive binder to the conductive mesh. The conductive primer may be made of similar material to the conductive binder fibers with a composition modified to produce properties having a greater intermaterial adhesion than the conductive binder. Suitable conductive primer materials may have resistivities below about 100 Ω-cm, such as between 0.001 Ω-cm and about 32 Ω-cm.

Figure 7D:
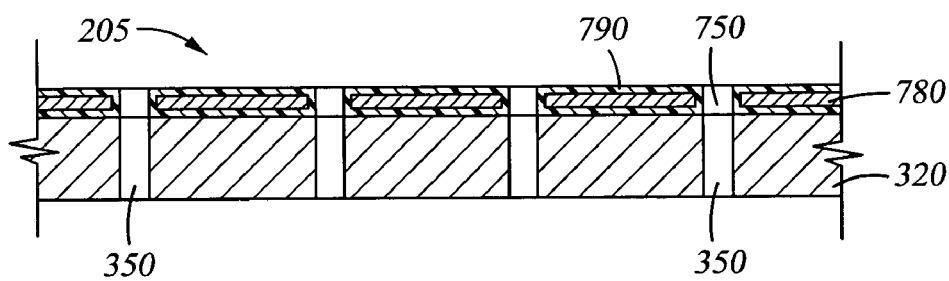
FIG. 7D is a partial cross-sectional view of one embodiment of a polishing article including a metal foil.

Alternatively, a conductive foil may be used in place of the conductive cloth or fabric 700 as shown in FIG. 7D. The conductive foil generally includes a metal foil 780 disposed in or coated with a conductive binder 790 on the support layer 320. Examples of material forming metal foils include metal coated fabrics, conductive metals such as copper, nickel, and cobalt, and noble metals, such as gold, platinum, palladium, iridium, rhenium, rhodium, rhenium, ruthenium, osmium, tin, lead, and combinations thereof, of which gold, tin and platinum are preferred. The conductive foil may also include a nonmetallic conductive foil sheet, such as a copper sheet, carbon fiber woven sheet foil. The conductive foil may also include a metal coated cloth of a dielectric or conductive material, such as copper, nickel, tin or gold coating a cloth of nylon fibers. The conductive foil may also comprise a fabric of conductive or dielectric material coated with a conductive binder material as described herein. The conductive foil may also comprise a wire frame, screen or mesh of interconnecting conductive metal wires or strips, such as copper wire, which may be coated with a conductive binder material as described herein. The invention contemplates the use of other material in forming the metal foil described herein.

A conductive binder 790 as described herein may encapsulate the metal foil 780, which allows the metal foil 780 to be conductive metals that are observed to react with the surrounding electrolyte, such as copper. The conductive foil may be perforated with a plurality of perforation 750 as described herein. While not shown, the conductive foil may be coupled to a conductive wire to power supply to bias the polishing surface.

The conductive binder 790 may be as described for the conductive mesh or fabric 700 and may be applied in multiple layers over the metal foil 780. In one aspect, the conductive binder 790 is applied to the metal foil 780 after the metal foil 780 has been perforated to protect the portion of the metal foil 780 exposed from the perforation process.

The conductive binder described herein may be disposed onto conductive fabric 700, foil 780, or mesh by casting liquid state adhesive or binder onto the fabric 700, foil 780 or mesh. The binder is then solidified on the fabric, foil or mesh after drying and curing. Other suitable processing methods including injection mold, compression mold, lamination, autoclave, extrusion, or combinations thereof may be used to encapsulate the conductive fabric, mesh, or foil. Both thermoplastic and thermosetting binders may be used for this application.

Adhesion between the conductive binder and the metal foil components of the conductive foil may be enhanced by perforating the metal foil with a plurality of perforations having a diameter or width between about 0.1 μm and about 1 mm or by applying a conductive primer between the metal foil and the conductive binder. The conductive primer may be of the same material as the conductive primer for the mesh described herein.

Figure 7E:
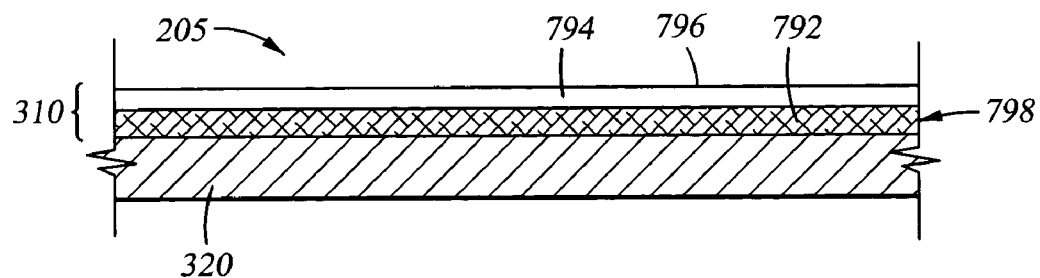
FIG. 7E is another embodiment of a polish article comprising a fabric material.

FIG. 7E is a sectional view of another embodiment of a conductive cloth or fabric 798 that may be used to form a lower layer 792 of a conductive polishing portion 310 of the polishing article 205. The conductive cloth of fabric may be comprised of interwoven or alternatively non-woven fibers 710. The fibers 710 may be formed from or coated with a conductive material as described above. Examples of non-woven fibers include spun-bond or melt blown polymers among other non-woven fabrics.

The conductive polishing portion 310 includes an upper layer 794 comprised of a conductive material. The upper layer 794 includes a polishing surface 796 disposed opposite the lower layer 792. The upper layer 794 may have sufficient thickness to smooth out the irregularities of the underlying lower layer 792, thereby providing a generally flat and planar polishing surface 796 for contacting the substrate during processing. In one embodiment, the polishing surface 796 has a thickness variation of less than or equal to about ±1 mm and a surface roughness of less than or equal to about 500 micron meter.

The upper layer 794 may be comprised of any conductive material. In one embodiment, the upper layer 794 is formed from a soft material such as gold, tin, palladium, palladium-tin alloys, platinum, or lead, among other conductive metals, alloys and ceramic composites softer than copper. The upper layer 794 may optionally include abrasive material disposed therein as described above to assist in removing the passivation layer disposed on the metal surface of the substrate being polished.

Alternatively, the upper layer 794 may be comprised of a non-conductive material that substantially covers the conductive polishing portion 310 yet leaves at least a portion of the conductive polishing portion exposed such that the conductive polishing portion 310 may be electrically coupled to a substrate being polished on the upper layer 794. In such a configuration, the upper layer 794 assists in reducing scratching and prevents the conductive portion 310 from entering any exposed features during polishing. A non-conductive upper layer 794 may include a plurality of perforations that allow the conductive polishing portion 310 to remain exposed.

Figure 7F:
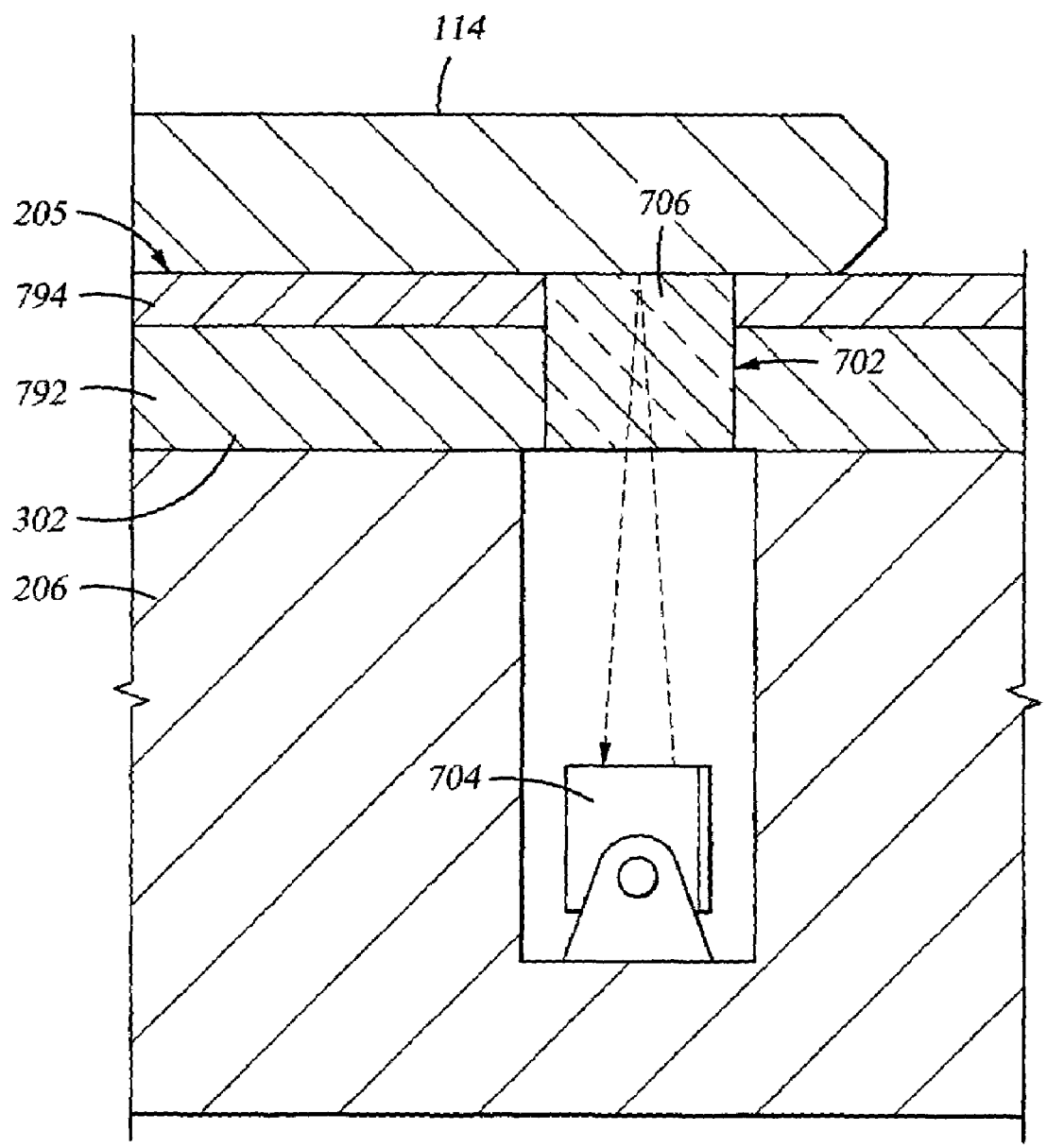
FIG. 7F is another embodiment of a polish article having a window formed therein.

FIG. 7F is another embodiment of a polishing article 205 having a window 702 formed therein. The window 702 is configured to allow a sensor 704 positioned below the polishing article 205 to sense a metric indicative of polishing performance. For example, the sensor 704 may be an eddy current sensor or an interferometer, among other sensors. In one embodiment, the sensor an interferometer capable of generating a collimated light beam, which during processing, is directed at and impinges on a side of the substrate 114 that is being polished. The interference between reflected signals is indicative of the thickness of the layer of material being polished. One sensor that may be utilized to advantage is described in U.S. Pat. No. 5,893,796, issued Apr. 13, 1999, to Birang, et al., which is hereby incorporated by reference in its entirety.

The window 702 includes a fluid barrier 706 that substantially prevents processing fluids from reaching the area of the disc 206 housing the sensor 704. The fluid barrier 706 is generally selected to be transmissive (e.g., to have minimal or no effect or interference) to the signals passing therethrough. The fluid barrier 706 may be a separate element, such as a block of polyurethane coupled to the polishing article 205 within the window 702, or be one or more of the layers comprising the polishing article 205, for example, a sheet of mylar underlying the conductive portion 310 or the article support, or sub-pad, portion 320. Alternatively, fluid barrier 706 may be disposed in the layers disposed between the polishing article 205 and the disc 206, such as the electrode 204 or other layer. In yet another alternative configuration, the fluid barrier 706 may be disposed in a passage 708 aligned with the window 702 in which the sensor 704 resides. In embodiments wherein the conductive portion 310 comprises multiply layers, for example, an upper layer 794 and a lower layer 792, the transparent material 706 may be disposed in at least one layer comprising the conductive portion 310 as shown in FIG. 7F. It is contemplated that other configurations of conductive polishing articles, including those embodiments described herein along with other configurations, may be adapted to include a window.

Conductive Elements in Polishing Surfaces

In another aspect, the conductive fibers and fillers described herein may be used to form distinct conductive elements disposed in a polishing material to form the conductive polishing article 205 of the invention. The polishing material may be a conventional polishing material or a conductive polishing material, for example, a conductive composite of conductive fillers or fibers disposed in the polymer as described herein. The surface of the conductive elements may form a plane with the surface of the polishing article or may extend above a plane of the surface of the polishing article. Conductive elements may extend up to about 5 millimeters above the surface of the polishing article.

While the following illustrate the use of conductive elements having a specific structure and arrangement in the polishing material, the invention contemplates that individual conductive fibers and fillers, and materials made therefrom, such as fabrics, may also be considered conductive elements. Further, while not shown, the following polishing article descriptions may include polishing articles having perforation and grooving patterns described herein and shown in FIGS. 4-6, with configurations to the patterns to incorporate the conductive elements described herein as follows.

Figure 8A:
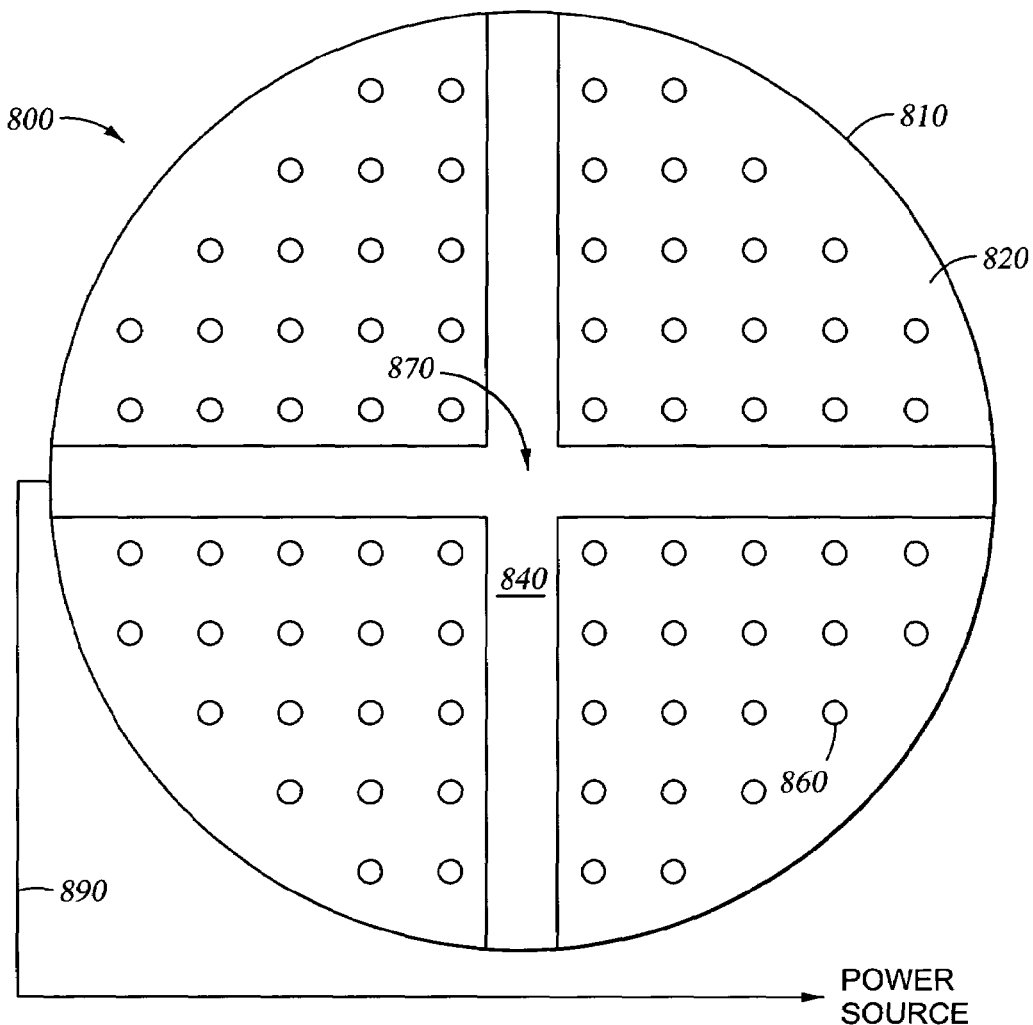
FIGS. 8A and 8B are top and cross-section schematic views, respectively, of one embodiment of a polishing article having a conductive element.
Figure 8B:
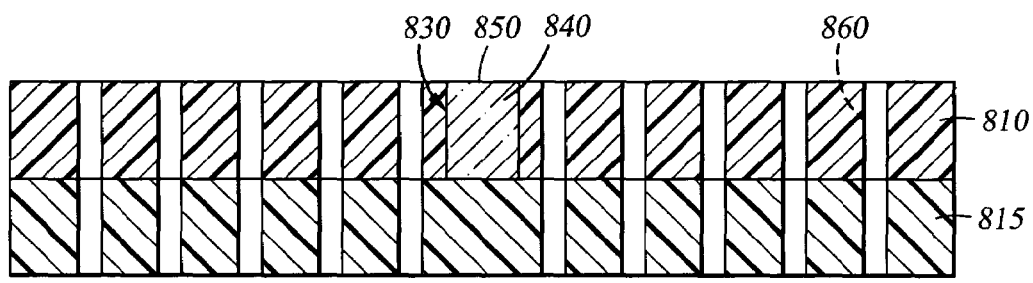

FIGS. 8A-8B depict a top and a cross-sectional schematic view of one embodiment of a polishing article 800 having conductive elements disposed therein. The polishing article 800 generally comprises a body 810 having a polishing surface 820 adapted to contact the substrate while processing. The body 810 typically comprises a dielectric or polymeric material, such as a dielectric polymer material, for example, polyurethane.

The polishing surface 820 has one or more openings, grooves, trenches, or depressions 830 formed therein to at least partially receive conductive elements 840. The conductive elements 840 may be generally disposed to have a contact surface 850 co-planar or extending above a plane defined by the polishing surface 820. The contact surface 850 is typically configured, such as by having a compliant, elastic, flexible, or pressure moldable surface, to maximize electrical contact of the conductive elements 840 when contacting the substrate. During polishing, a contact pressure may be used to urge the contact surface 850 into a position co-planar with the polishing surface 820.

The body 810 is generally made permeable to the electrolyte by a plurality of perforations 860 formed therein as described herein. The polishing article 800 may have a perforation density between about 20% and about 80% of the surface area of the polishing article 810 to provide sufficient electrolyte flow to facilitate uniform anodic dissolution from the substrate surface.

The body 810 generally comprises a dielectric material such as the conventional polishing materials described herein. The depressions 830 formed in the body 810 are generally configured to retain the conductive elements 840 during processing, and accordingly may vary in shape and orientation. In the embodiment depicted in FIG. 8A, the depressions 830 are grooves having a rectangular cross section disposed across the polishing article surface and forming an interconnecting "X" or cross pattern 870 at the center of the polishing article 800. The invention contemplates additional cross sections, such as inverse trapezoidal and rounded curvature where the groove contacts the substrate surface as described herein.

Alternatively, the depressions 830 (and conductive elements 840 disposed therein) may be disposed at irregular intervals, be orientated radially, parallel, or perpendicular, and may additionally be linear, curved, concentric, involute curves, or other cross-sectional areas.

Figure 8C:
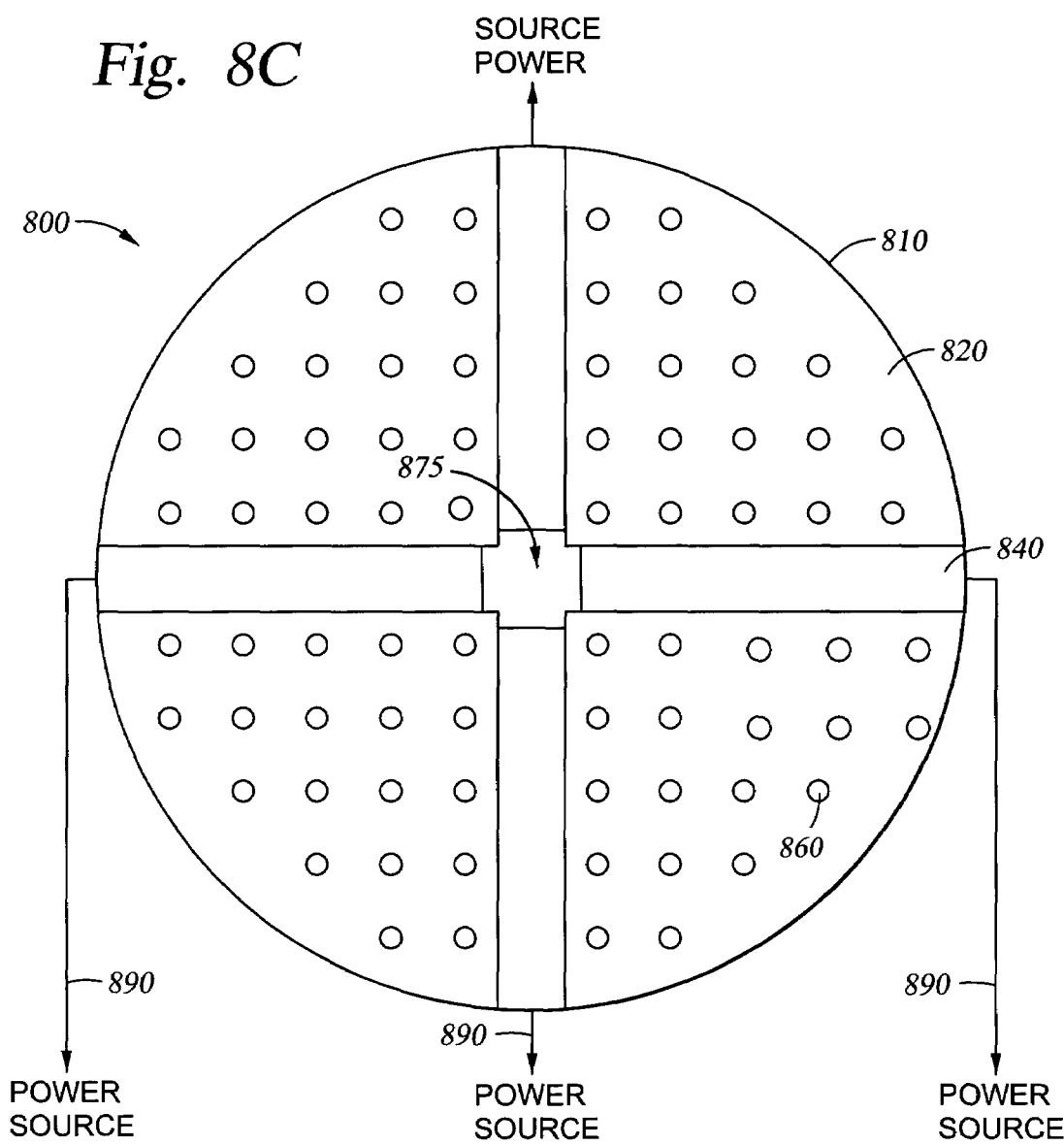
FIGS. 8C and 8D are top and cross-section schematic views, respectively, of one embodiment of a polishing article having a conductive element.

FIG. 8C is a top schematic view of a series of individual conductive elements 840 radially disposed in the body 810, each element 840 separated physically or electrically by a spacer 875. The spacer 875 may be a portion of dielectric polishing material or a dielectric interconnect for the elements, such as a plastic interconnect. Alternatively, the spacer 875 may be a section of the polishing article devoid of either the polishing material or conductive elements 840 to provide an absence of physical connection between the conductive elements 840. In such a separate element configuration, each conductive element 840 may be individually connected to a power source by a conductive path 890, such as a wire.

Referring back to FIGS. 8A and 8B, the conductive elements 840 disposed in the body 810 are generally provided to produce a bulk resistivity or a bulk surface resistivity of about 20 Ω-cm or less. In one aspect of the polishing article, the polishing article has a resistivity of about 2 Ω-cm or less. The conductive elements 840 generally have mechanical properties that do not degrade under sustained electric fields and are resistant to degradation in acidic or basic electrolytes. The conductive elements 840 are retained in the depressions 830 by press fit, clamping, adhesive, or by other methods.

In one embodiment, the conductive elements 840 are sufficiently compliant, elastic, or flexible to maintain electrical contact between the contact surface 850 and the substrate during processing. Sufficient compliant, elastic, or flexible materials for the conductive element 840 may have an analogous hardness of about 100 or less on the Shore D Hardness scale compared to the polishing material. A conductive element 840 having an analogous hardness of about 80 or less on the Shore D Hardness scale for polymeric materials may be used. A compliant material, such as flexible or bendable fibers of material, may also be used as the conductive elements 840. The conductive element 840 may be more compliant than polishing material to avoid high local pressure introduced by conductive element 840 during polishing.

In the embodiment depicted in FIGS. 8A and 8B, the conductive elements 840 are embedded in the polishing surface 810 disposed on an article support or sub-pad 815. Perforations 860 are formed through both polishing surface 810 and the article support 815 around conductive elements 840.

An example of the conductive elements 840 includes dielectric or conductive fibers coated with a conductive material or conductive fillers blended with a polymeric material, such as a polymer based adhesive, to make a conductive (and wear resistant) composite as described herein. The conductive elements 840 may also comprise conductive polymeric material or other conductive materials as described herein to improve electrical properties. For example, the conductive elements comprise a composite of a conductive epoxy and a conductive fiber comprising a nylon fiber coated with gold, such as a nylon fiber coated with about 0.1 µm of cobalt, copper, or nickel disposed on the nylon fiber, and about 2 µm of gold disposed on the a nylon fiber, and carbon or graphite fillers to improve the composite's conductivity, which is deposited in a body of polyurethane.

Figure 8D:
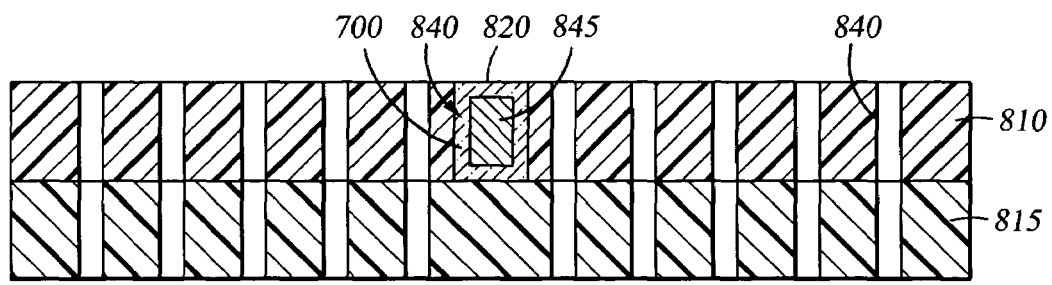

FIG. 8D is a cross-sectional schematic view of another embodiment of a polishing article 800 having conductive elements disposed therein. The conductive elements 840 may be generally disposed to have a contact surface coplanar or extending above a plane defined by the polishing surface 820. The conductive elements 840 may include the conductive fabric 700, as described herein, disposed, encapsulated or wrapped around a conductive member 845. Alternatively individual conductive fibers and/or fillers may be disposed, encapsulated, or wrapped around the conductive member 845. The conductive member 845 may comprise a metal, such as a noble metal described herein, or other conductive materials, such as copper, suitable for use in electropolishing processes. The conductive element 840 may also comprise a composite of the fabric and a binder material as described herein with the fabric forming an outer contact portion of the conductive element 840 and the binder typically forming an inner support structure. The conductive element 840 may also comprise a hollow tube having a rectangular cross-sectional area with the walls of the tube formed of rigid conductive fabric 700 and a bonding agent as described herein.

A connector 890 is utilized to couple the conductive elements 840 to a power source (not shown) to electrically bias the conductive elements 840 during processing. The connector 890 is generally a wire, tape or other conductor compatible with process fluids or having a covering or coating that protects the connector 890 from the process fluids. The connector 890 may be coupled to the conductive elements 840 by molding, soldering, stacking, brazing, clamping, crimping, riveting, fastening, conductive adhesive or by other methods or devices. Examples of materials that may be utilized in the connector 890 include insulated copper, graphite, titanium, platinum, gold, aluminum, stainless steel, and HASTELOY® conductive materials among other materials.

Coatings disposed around the connectors 890 may include polymers such as fluorocarbons, poly-vinyl chloride (PVC) and polyimide. In the embodiment depicted in FIG. 8A, one connector 890 is coupled to each conductive element 840 at the perimeter of the polishing article 800. Alternatively, the connectors 890 may be disposed through the body 810 of the polishing article 800. In yet another embodiment, the connector 890 may be coupled to a conductive grid (not shown) disposed in the pockets and/or through the body 810 that electrically couples the conductive elements 840.

Figure 9A:
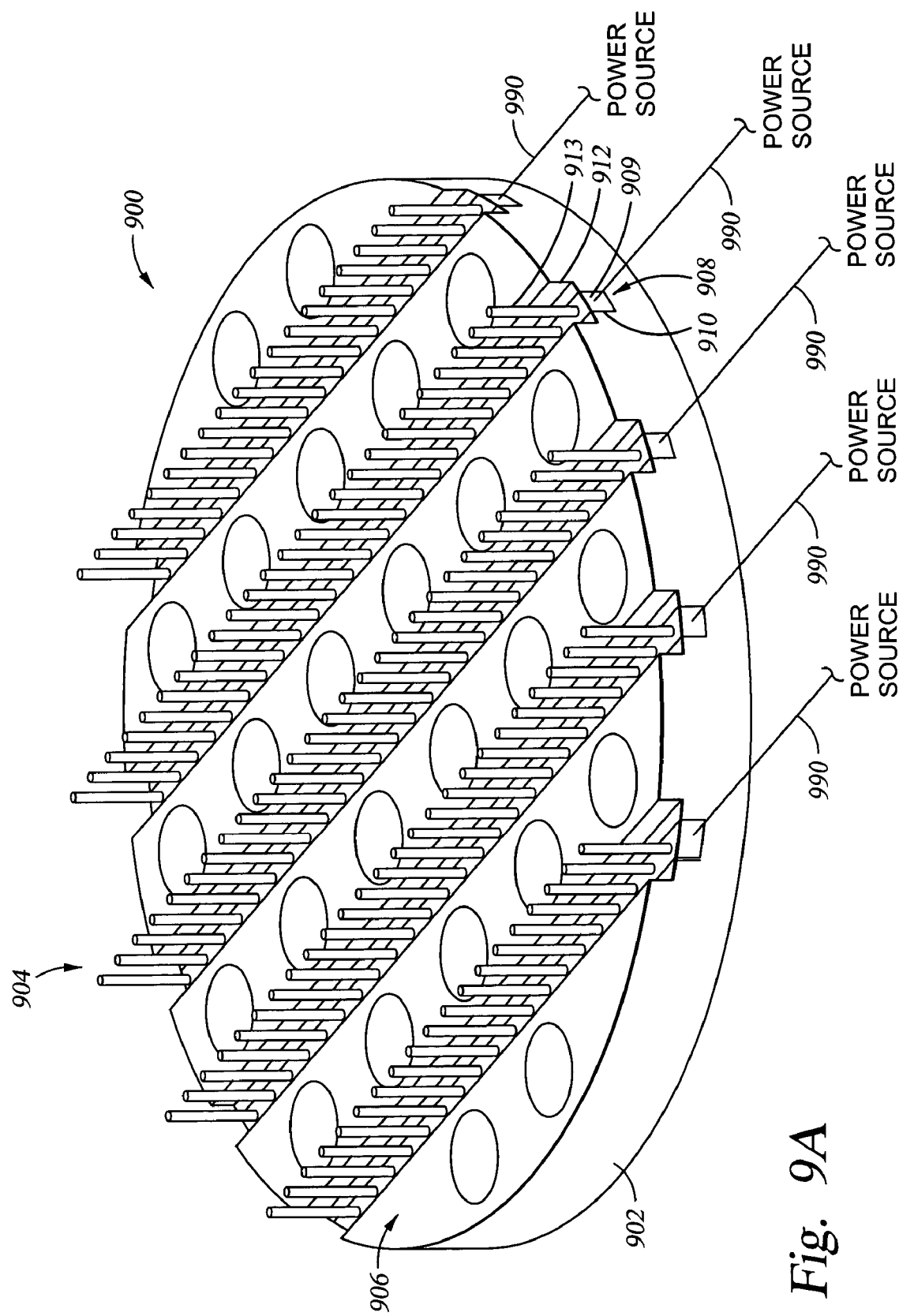
FIGS. 9A and 9B are perspective views of other embodiments of a polishing article having a conductive element.

FIG. 9A depicts another embodiment of a polishing material 900. The polishing material 900 includes a body 902 having one or more at least partially conductive elements 904 disposed on a polishing surface 906. The conductive elements 904 generally comprise a plurality of fibers, strands, and/or flexible fingers that are compliant or elastic and adapted to contact a substrate surface while processing. The fibers are comprised of an at least partially conductive material, such as a fiber composed of a dielectric material coated with a conductive material as described herein. The fibers may also be solid or hollow in nature to decrease or increase the amount of compliance or flexibility of the fibers.

In the embodiment depicted in FIG. 9A, the conductive elements 904 are a plurality of conductive sub-elements 913 coupled to a base 909. The conductive sub-elements 913 include the at least partially electrically conductive fibers described herein. An example of the sub-elements 913 include a nylon fiber coated with gold as described herein or carbon fiber. The base 909 also comprises an electrically conductive material and is coupled to a connector 990. The base 909 may also be coated by a layer of conductive material, such as copper, that dissolves from the polishing pad article during polishing, which is believed to extend the processing duration of the conductive fibers.

The conductive elements 904 generally are disposed in a depression 908 formed in the polishing surface 906. The conductive elements 904 may be orientated between 0 and 90 degrees relative to the polishing surface 906. In embodiments where the conductive elements 904 are orientated perpendicular to the polishing surface 906, the conductive elements 904 may partially be disposed on the polishing surface 906.

The depressions 908 have a lower mounting portion 910 and an upper, clearance portion 912. The mounting portion 910 is configured to receive the base 909 of the conductive elements 904, and retain the conductive elements 904 by press fit, clamping, adhesive, or by other methods. The clearance portion 912 is disposed where the depression 908 intersects the polishing surface 906. The clearance portion 912 is generally larger in cross section than the mounting portion 910 to allow the conductive elements 904 to flex when contacting a substrate while polishing without being disposed between the substrate and the polishing surface 906.

Figure 9B:
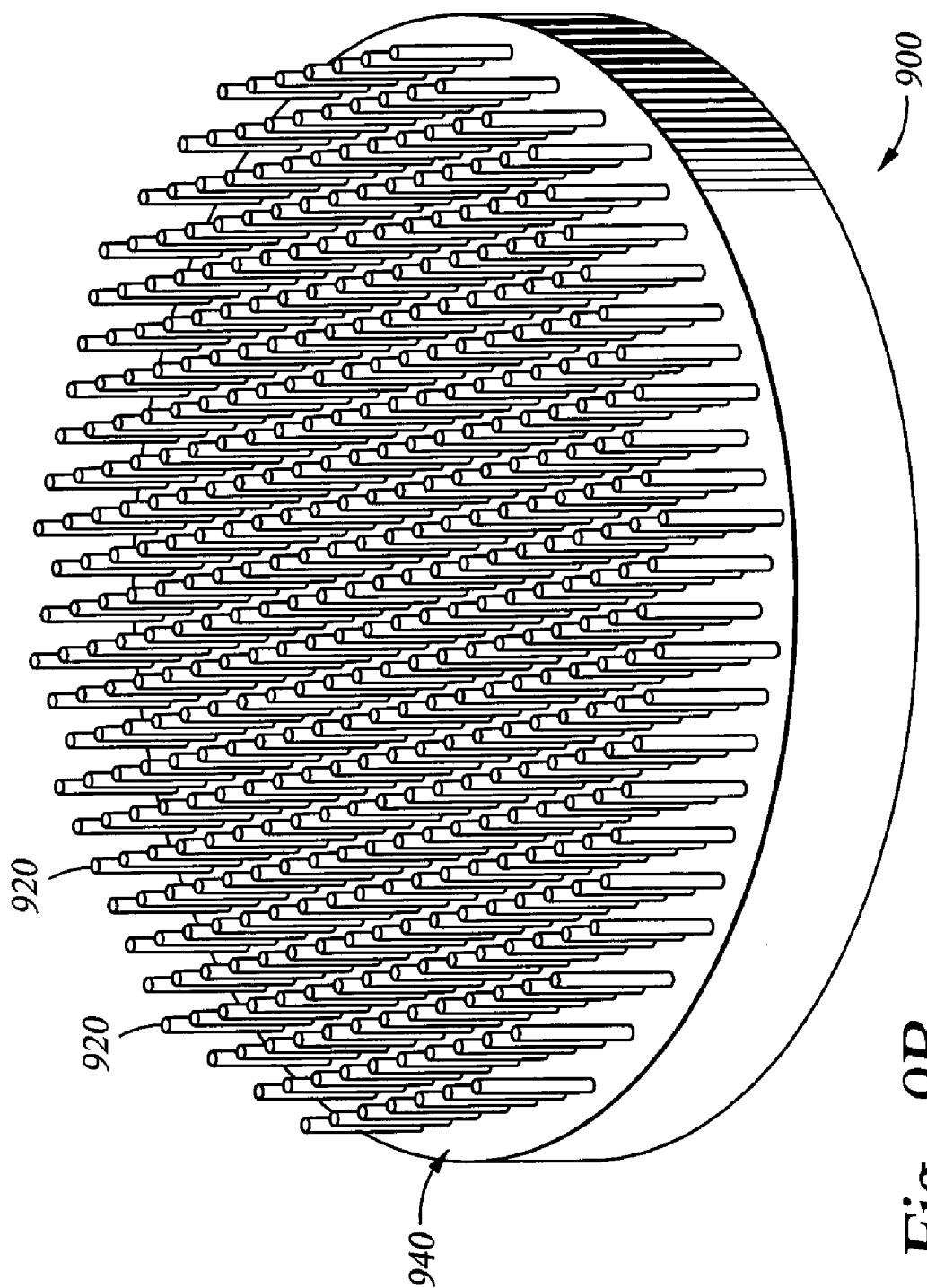

FIG. 9B depicts another embodiment of a polishing article 900 having a conducting surface 940 and a plurality of discrete conductive elements 920 formed thereon. The conductive elements 920 comprise fibers of dielectric material coated by a conductive material are vertically displaced from the conducting surface 940 of the polishing article 205 and are horizontally displaced from each other. The conducting elements 920 of the polishing article 900 are generally orientated between 0 to 90 degrees relative to a conducting surface 940 and can be inclined in any polar orientation relative to a line normal to the conducting surface 940. The conductive elements 920 may be formed across the length of the polishing pads, as shown in FIG. 9B or only may be disposed in selected areas of the polishing pad. The contact height of the conductive elements 920 above the polishing surface may be up to about 5 millimeters. The diameter of the material comprising the conductive element 920 is between about 1 mil (thousandths of an inch) and about 10 mils. The height above the polishing surface and a diameter of the conductive elements 920 may vary upon the polishing process being performed.

The conductive elements 920 are sufficiently compliant or elastic to deform under a contact pressure while maintaining an electrical contact with a substrate surface with reduced or minimal scratching of the substrate surface. In the embodiment shown in FIGS. 9A and 9B, the substrate surface may only contact the conductive elements 920 of the polishing article 205. The conductive elements 920 are positioned so as to provide an uniform current density over the surface of the polishing article 205.

The conductive elements 920 are adhered to the conducting surface by a non-conductive, or dielectric, adhesive or binder. The non-conductive adhesive may provide a dielectric coating to the conducting surface 940 to provide an electrochemical barrier between the conducting surface 940 and any surrounding electrolyte. The conducting surface 940 may be in the form of a round polishing pad or a linear web or belt of polishing article 205. A series of perforations (not shown) may be disposed in the conducting surface 940 for provided flow of electrolyte therethrough.

While not shown, the conductive plate may be disposed on a support pad of conventional polishing material for positioning and handling of the polishing article 900 on a rotating or linear polishing platen.

Figure 10A:
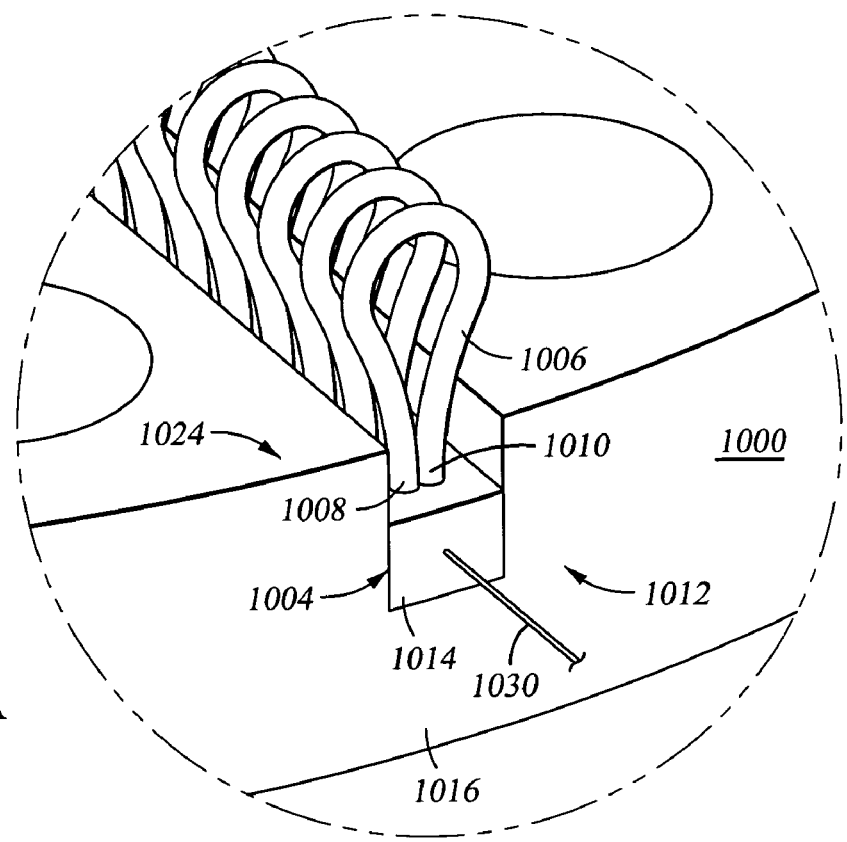
FIG. 10A is a partial perspective view of another embodiment of a polishing article.

FIG. 10A depicts a schematic perspective view of one embodiment of a polishing article 1000 comprised of conductive element 1004. Each conductive element 1004 generally comprises a loop or ring 1006 having a first end 1008 and a second end 1010 disposed in a depression 1012 formed in the polishing surface 1024. Each conductive element 1004 may be coupled to an adjoining conductive element to form a plurality of loops 1006 extending above the polishing surface 1024.

In the embodiment depicted in FIG. 10A, each loop 1006 is fabricated from a fiber coated by a conductive material and is coupled by a tie wire base 1014 adhered to the depression 1012. An example of the loop 1006 is a nylon fiber coated with gold.

The contact height of the loop 1006 above the polishing surface may be between about 0.5 millimeter and about 2 millimeters and the diameter of the material comprising the loop may be between about 1 mil (thousandths of an inch) and about 50 mils. The tie wire base 1014 may be a conductive material, such as titanium, copper, platinum, or platinum coated copper. The tie wire base 1014 may also be coated by a layer of conductive material, such as copper, that dissolves from the polishing pad article during polishing. The use of a layer of conductive material on the tie wire base 1014 is believed to be a sacrificial layer that dissolves in preference of the underlying loop 1006 material or tie wire base 1014 material to extend the life of the conductive element 1004. The conductive elements 1004 may be orientated between 0 to 90 degrees relative to a polishing surface 1024 and can be inclined in any polar orientation relative to a line normal to the polishing surface 1024. The conductive elements 1004 are coupled to a power source by electrical connectors 1030.

Figure 10B:
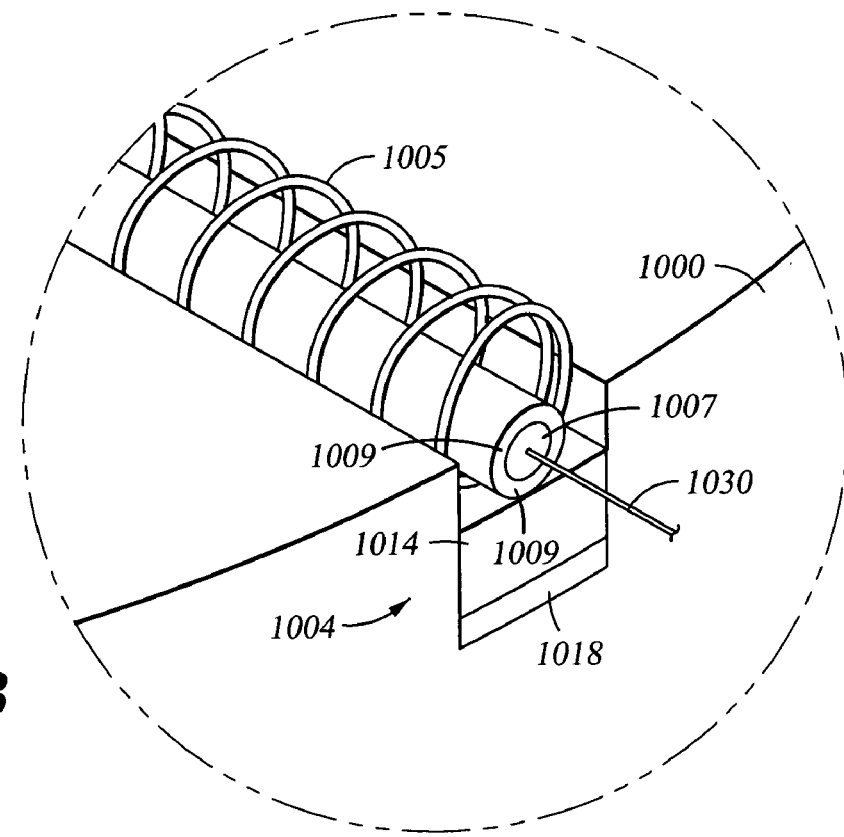
FIG. 10B is a partial perspective view of another embodiment of a polishing article.

FIG. 10B depicts a schematic perspective view of another embodiment of a polishing article 1000 comprised of conductive element 1004. The conductive element 1004 comprises a singular coil 1005 of a wire composed of a fiber coated with a conductive material as described herein. The coil 1005 is coupled to a conductive member 1007 disposed on a base 1014. The coil 1005 may encircle the conductive member 1007, encircle the base 1014, or be adhered to the surface of the base 1014. The conductive bar may comprise a conductive material, such as gold, and generally comprises a conductive material that is chemically inert, such as gold or platinum, with any electrolyte used in a polishing process. Alternatively, a layer 1009 of sacrificial material, such as copper, is disposed on the base 1014. The layer 1009 of sacrificial material is generally a more chemically reactive material, such as copper, than the conductive member 1007 for preferential removal of the chemically reactive material compared to the material of the conductive member 1007 and the coil 1005, during an electropolishing aspect, or anodic dissolution aspect, of the polishing process. The conductive member 1007 may be coupled to a power source by electrical connectors 1030.

A biasing member may be disposed between the conductive elements and the body to provide a bias that urges the conductive elements away from the body and into contact with a substrate surface during polishing. An example of a biasing member 1018 is shown in FIG. 10B. However, the invention contemplates that the conductive elements shown herein, for example in FIGS. 8A-8D, 9A, 10A-10D, may use a biasing member. The biasing member may be a resilient material or device including a compression spring, a flat spring, a coil spring, a foamed polymer such as foamed polyurethane (e.g., PORON® polymer), an elastomer, a bladder or other member or device capable of biasing the conductive element. The biasing member may also be a compliant or elastic material, such as compliant foam or aired soft tube, capable of biasing the conductive element against and improve contact with the substrate surface being polished. The conductive elements biased may form a plane with the surface of the polishing article or may extend above a plane of the surface of the polishing article.

Figure 10C:
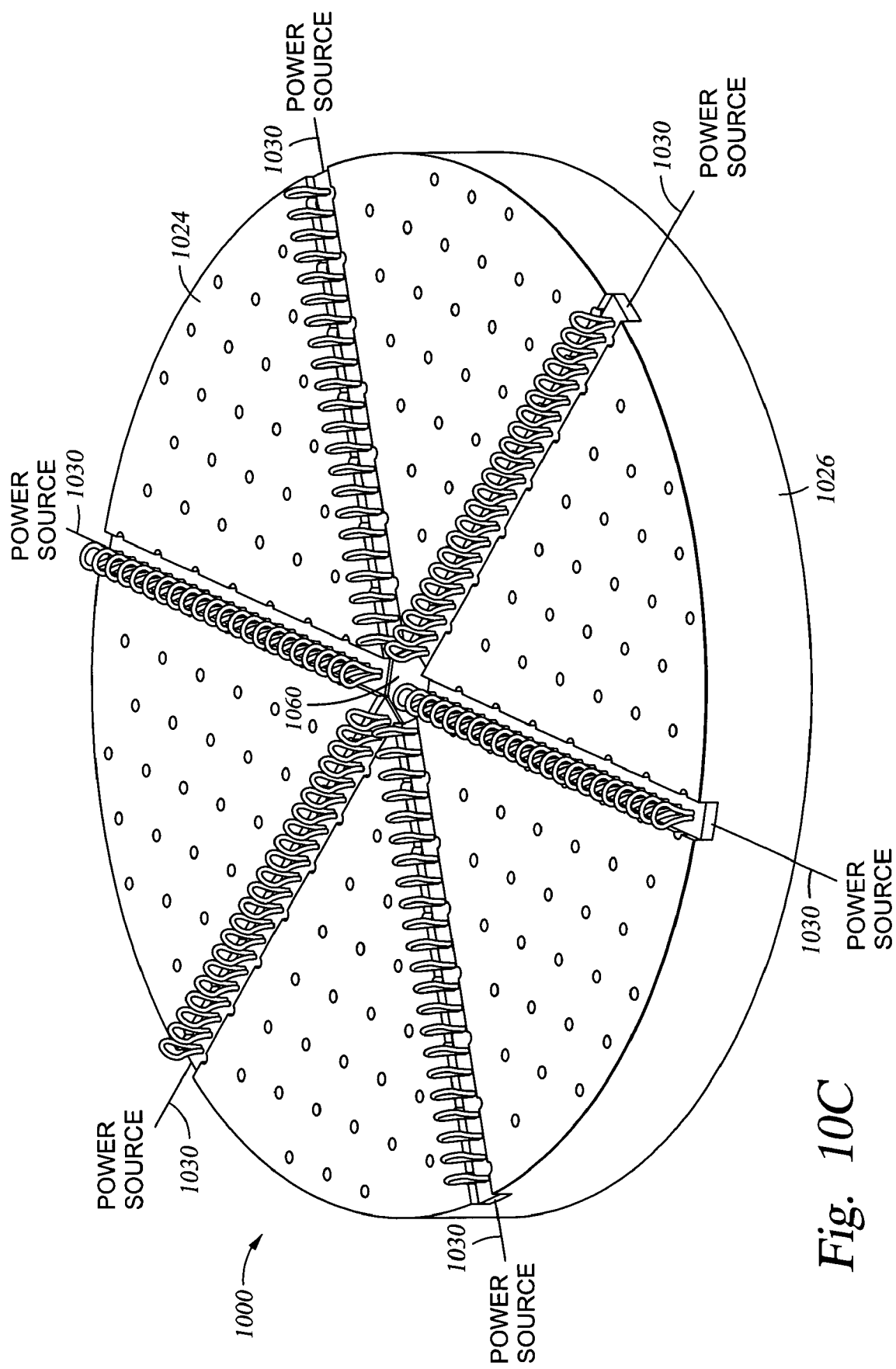
FIG. 10C is a partial perspective view of another embodiment of a polishing article.

FIG. 10C shows a schematic perspective view of another embodiment of a polishing article 1000 having a plurality of conductive elements 1004, disposed in a radial pattern from the center of the substrate to the edge. The plurality of conductive elements may be displaced from each other at intervals of 15°, 30°, 45°, 60°, and 90° degrees, or any other combinations desired. The conductive elements 1004 are generally spaced to provide as uniform application of current or power for polishing of the substrate. The conductive elements may be further spaced so as to not contact each other. Wedge portions 1004 of a dielectric polishing material of the body 1026 may be configured to electrically isolate the conductive elements 1004. A spacer or recessed area 1060 is also formed in the polishing article to also isolate the conductive elements 1004 from each other. The conductive elements 1004 may be in the form of loops as shown in FIG. 10A or vertical extending fibers as shone in FIG. 9B.

Figure 10D:
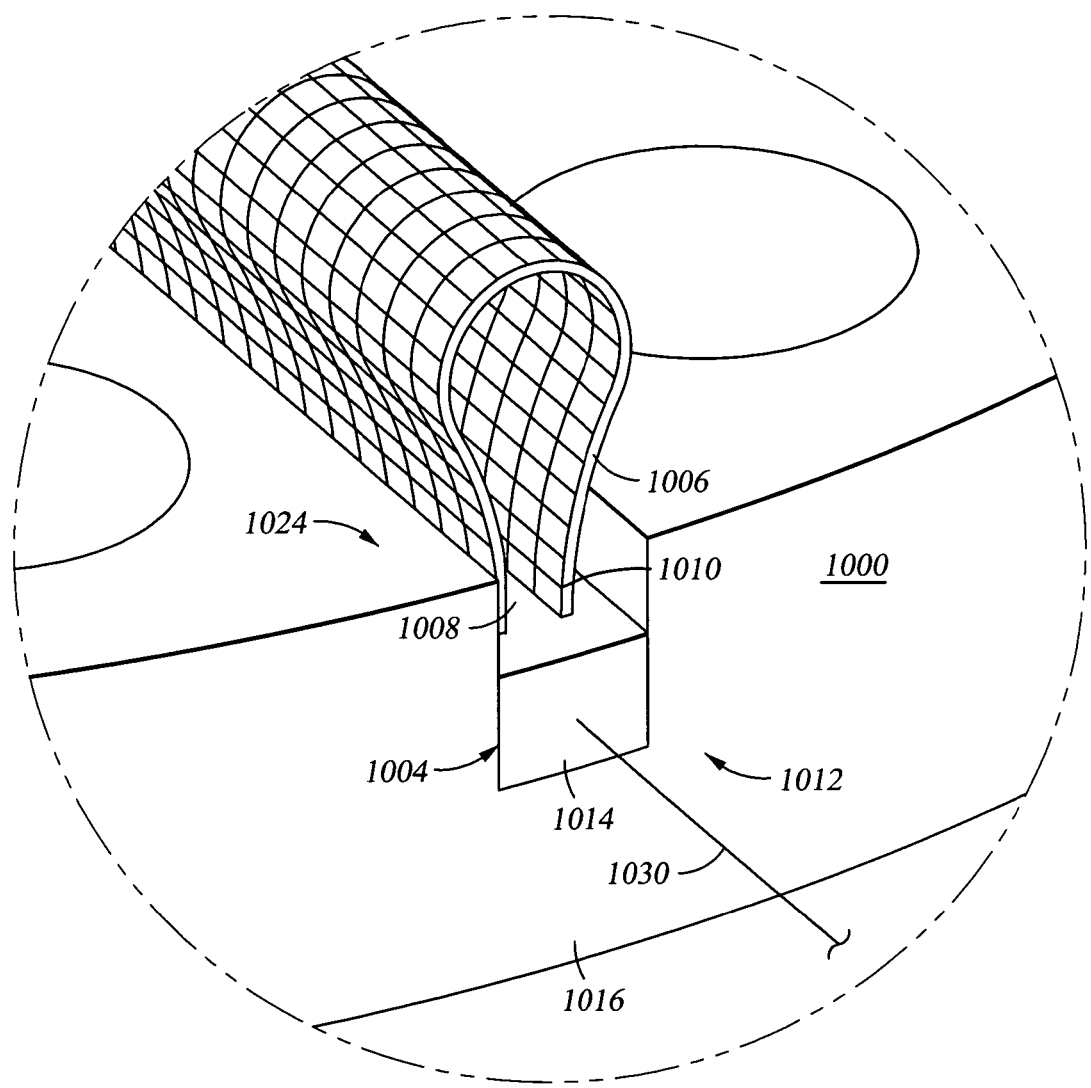
FIG. 10D is a partial perspective view of another embodiment of a polishing article.

FIG. 10D depicts a schematic perspective view of an alternative embodiment of the conductive element 1004 of FIG. 10A. The conductive element 1004 comprises a mesh or fabric of interwoven conductive fibers 1006 as described herein having a first end 1008 and a second end 1010 disposed in a depression 1012 formed in the polishing surface 1024 to form one continuous conductive surface for contact with the substrate. The mesh or fabric may be of one or more layers of interwoven fibers. The mesh or fabric comprising the conductive element 1004 is illustrated as a single layer in FIG. 10D. The conductive element 1004 may be coupled to a conductive base 1014 and may extend above the polishing surface 1024 as shown in FIG. 10A. The conductive element 1004 may be coupled to a power source by electrical connectors 1030 connected to the conductive base 1014.

Figure 10E:
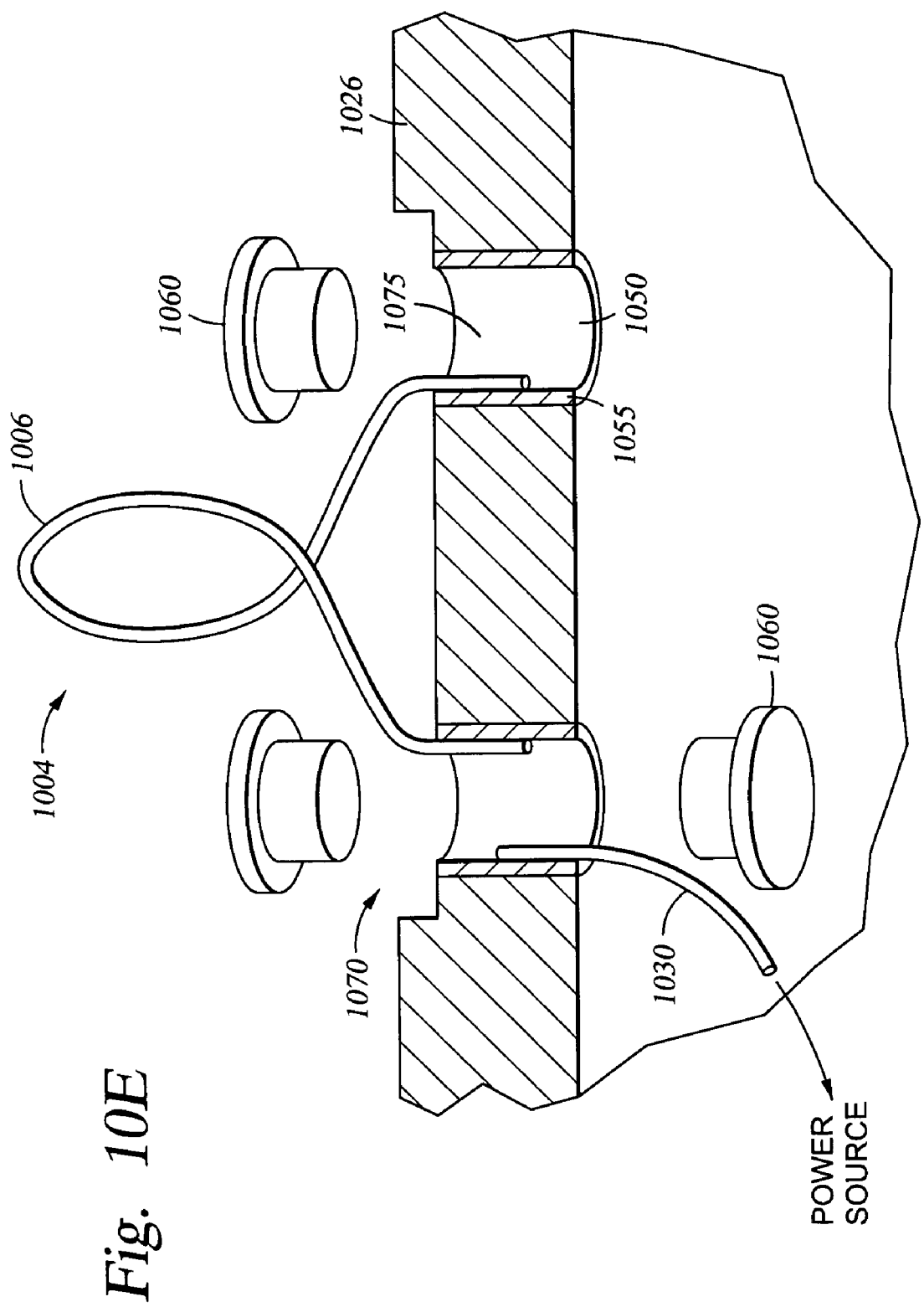
FIG. 10E is a partial perspective view of another embodiment of a polishing article.

FIG. 10E shows a partial schematic perspective view of another embodiment of forming the conductive elements 1004 having loops 1006 formed therein and securing the conductive elements to the body 1026 of the polishing article. Passages 1050 are formed in the body 1024 of the polishing article intersecting grooves 1070 for the conductive elements 1004. An insert 1055 is disposed in the passages 1050. The insert 1055 comprises a conductive material, such as gold or the same material as the conductive element 1006. Connectors 1030 may then be disposed in the passages 1050 and contacted with the insert 1055. The connectors 1030 are coupled to a power source. Ends 1075 of the conductive element 1004 may be contacted with the insert 1055 for flow of power therethrough. The ends 1075 of the conductive element 1004 and the connectors 1030 are then secured to the conductive insert 1055 by dielectric inserts 1060. The invention contemplated using the passages for every loop 1006 of the conductive element 1004, at intervals along the length of the conductive element 1004, or only at the extreme ends of the conductive element 1004.

Figure 11A:
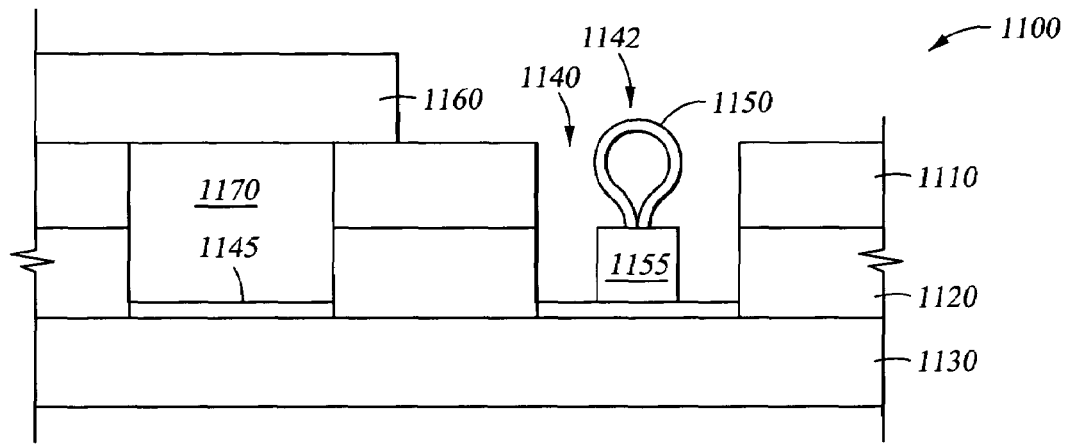
FIGS. 11A-11C are schematic side views of one embodiment of a substrate contacting one embodiment of a polishing article described herein.
Figure 11B:
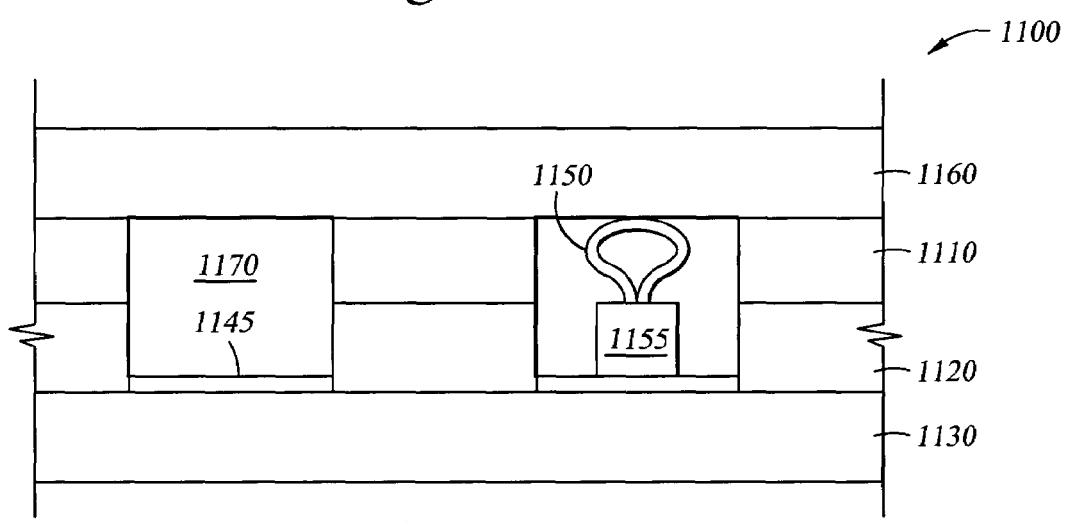
Figure 11C:
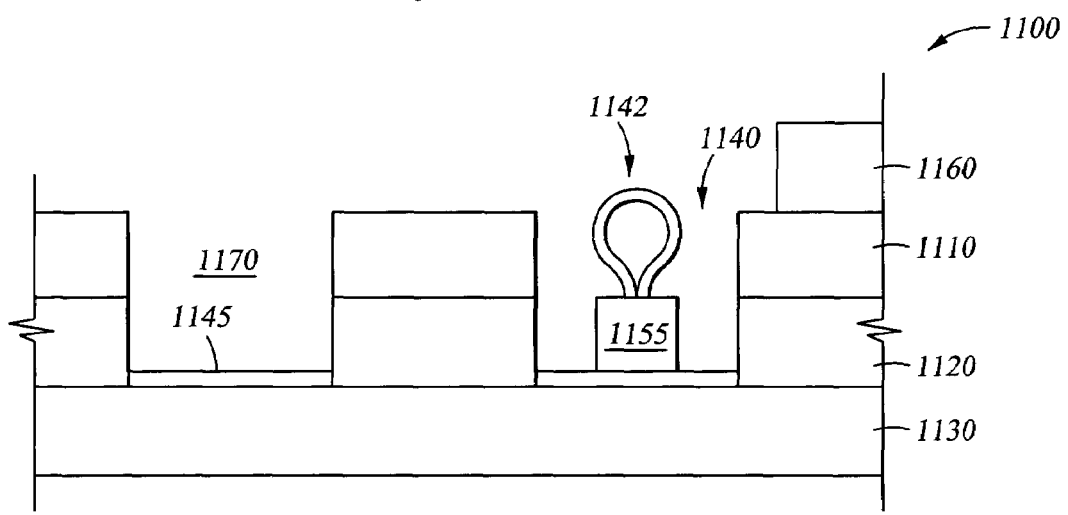

FIGS. 11A-C are a series of schematic side views illustrating the elastic ability of the loops or rings of conductive materials described herein. A polishing article 1100 comprises a polishing surface 1110 disposed on a sub-pad 1120 formed over a pad support 1130 with grooves or depressions 1140 therein. A conductive element 1142 comprising a loop or ring 1150 of a dielectric material coated by a conductive material is disposed on a tie base 1155 in the depression 1170 and coupled with an electrical contact 1145. A substrate 1160 is contacted with the polishing article 1100 and moved in relative motion with the surface of the polishing article 1100. As the substrate contacts the conductive element 1142, the loop 1150 compresses into the depression 1140 while maintaining electrical contact with the substrate 1160 as shown in FIG. 11B. When the substrate is moved a sufficient distance to no longer contact the conductive element 1142, the elastic loop 1150 returns to the uncompressed shape for additional processing as shown in FIG. 11C.

Further examples of conductive polishing pads are described in U.S. patent application Ser. No. 10/033,732, published as U.S. Patent Publication No. 2002/0119286, filed Dec. 27, 2001, which is incorporated by reference in its entirety.

Power Application

Power may be coupled into the polishing articles 205 described above by using a connector as described herein or a power transference device. A power transference device is more fully detailed in U.S. patent application Ser. No. 10/033,732, published as U.S. Patent Publication No. 2002/0119286, filed Dec. 27, 2001, which is incorporated by reference in its entirety.

Referring back to FIGS. 11A-11C, power may be coupled to conductive elements 1140 by the use of electrical contacts 1145 comprising conductive plates or mounts disposed in the grooves or depressions 1170 formed in the polishing pad. In the embodiment shown in FIG. 11A, the conductive elements 1140 are mounted on plates of a metal, such as gold, which are mounted on a support, such as disc 206, with the polishing article 1100 as shown in FIG. 2. Alternatively, the electrical contacts may be disposed on a polishing pad material between a conductive elements and a polishing pad material, for example, between the conductive element 840 and the body 810 as shown in FIGS. 8A and 8B, the electrical contacts are then coupled to a power source by leads (not shown) as described above in FIGS. 8A-8D.

FIGS. 12A-12D are top and side schematic view of embodiments of a polishing article having extensions connected to a power source (not shown). The power source provides the current carrying capability, i.e., the anodic bias to a substrate surface for anodic dissolution in an ECMP process. The power source may be connected to the polishing article by one or more conductive contacts disposed around the conductive polishing portion and/or the article support portion of the polishing article. One or more power sources may be connected to the polishing article by the one or more contacts to allow for generating variable bias or current across a portion of the substrate surface. Alternatively, one or more leads may be formed in the conductive polishing portion and/or the article support portion, which are coupled to a power source.

Figure 12A:
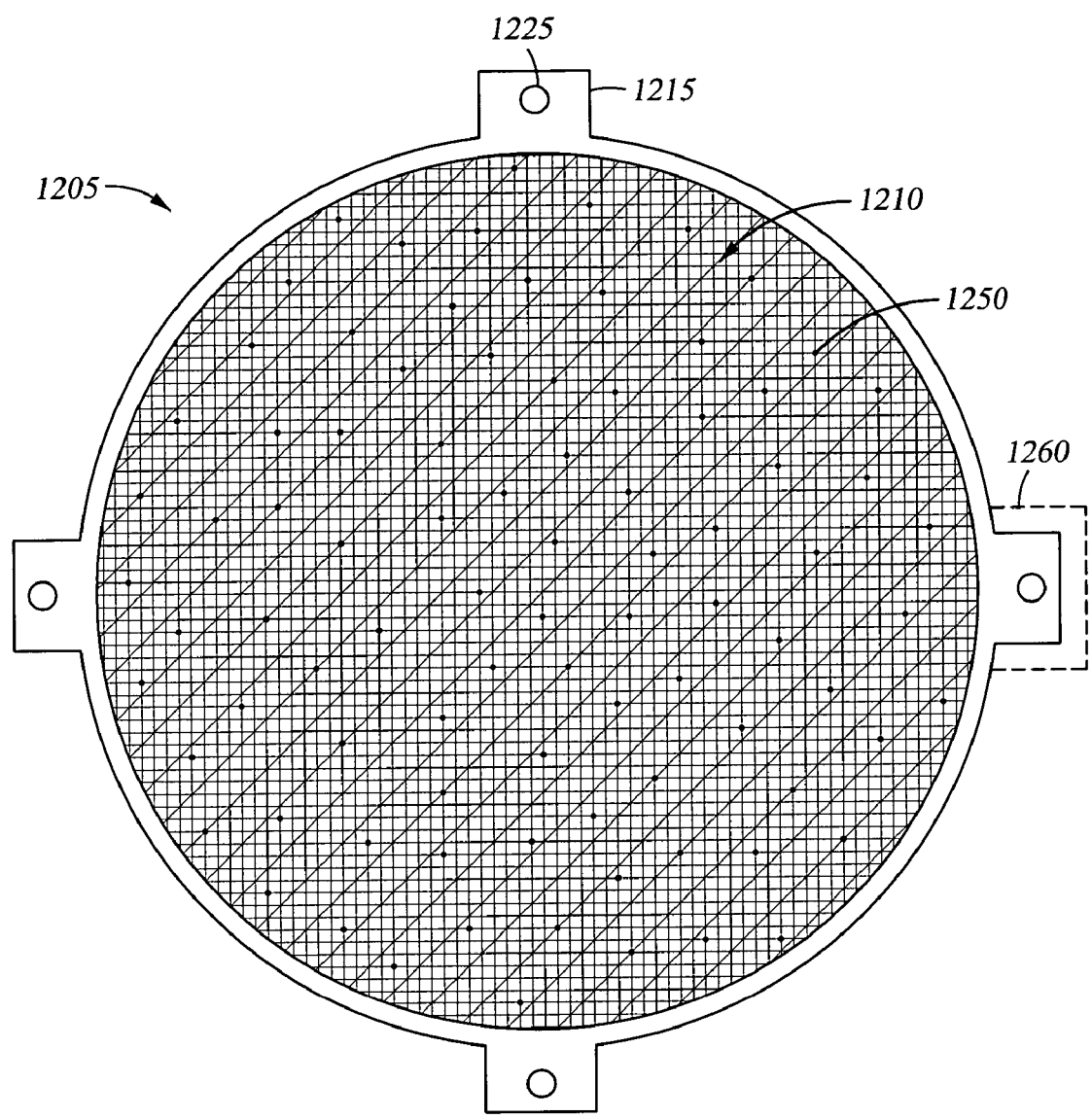
FIGS. 12A-12D are top and side schematic views of embodiments of a polishing article having extensions connected to a power source.
Figure 12B:
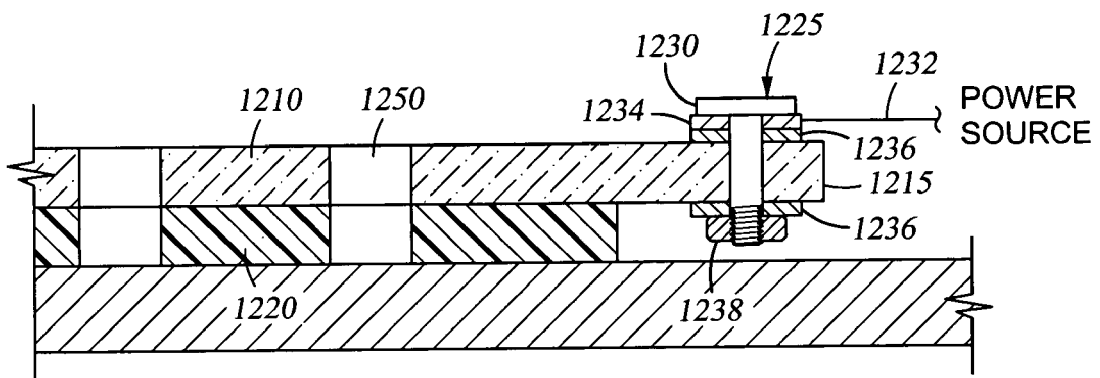

FIG. 12A is a top plan view of one embodiment of a conductive polishing pad coupled to a power source by a conductive connector. The conductive polishing portion may have extensions, for example, a shoulder or individual plugs, formed in the conductive polishing portion 1210 with a greater width or diameter than the article support portion 1220. The extensions are coupled to a power source by a connector 1225 to provide electrical current to the polishing article 205. In FIG. 12B, extensions 1215 may be formed to extend parallel or laterally from the plane of the conductive polishing portion 1210 and extending beyond the diameter of the polishing support portion 1220. The pattern of the perforation and grooving are as shown in FIG. 6.

FIG. 12B is a cross-section schematic view of one embodiment of a connector 1225 coupled to a power source (not shown) via a conductive pathway 1232, such as a wire. The connector comprises an electrical coupling 1234 connected to the conductive pathway 1232 and electrically coupled to the conductive polishing portion 1210 of the extension 1215 by a conductive fastener 1230, such as a screw. A bolt 1238 may be coupled to the conductive fastener 1230 securing the conductive polishing portion 1210 therebetween. Spacers 1236, such as a washer, may be disposed between the conductive polishing portion 1210 and the fastener 1230 and bolt 1238. The spacers 1236 may comprise a conductive material. The fastener 1230, the electrical coupling 1234, the spacers 1236, and the bolt 1238 may be made of a conductive material, for example, gold, platinum, titanium, aluminum, or copper. If a material that may react with the electrolyte is used, such as copper, the material may be covered in a material that is inert to reactions with the electrolyte, such as platinum. While not shown, alternative embodiments of the conductive fastener may include a conductive clamp, conductive adhesive tape, or a conductive adhesive.

Figure 12C:
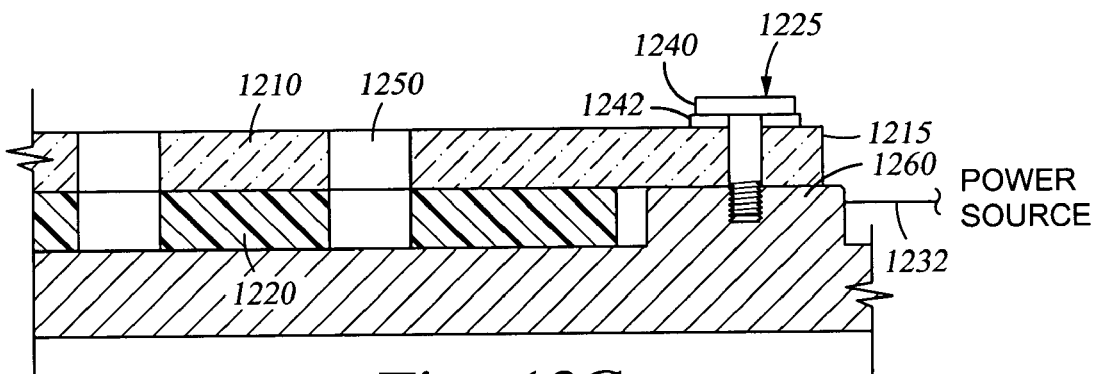

FIG. 12C is a cross-section schematic view of one embodiment of a connector 1225 coupled to a power source (not shown) via a support 1260, such as the upper surface of a platen or disc 206 as shown in FIG. 2. The connector 1225 comprises a fastener 1240, such as a screw or bolt having sufficient length to penetrate through the conductive polishing portion 1210 of the extension 1215 to couple with the support 1260. A spacer 1242 may be disposed between the conductive polishing portion 1210 and the fastener 1240.

The support is generally adapted to receive the fastener 1240. An aperture 1246 may be formed in the surface of the support 1260 to receive the fastener as shown in FIG. 12C. Alternatively, an electrical coupling may be disposed between the fastener 1240 and the conductive polishing portion 1210 with the fastener coupled with a support 1260. The support 1260 may be connected to a power source by a conductive pathway 1232, such as a wire, to a power source external to a polishing platen or chamber or a power source integrated into a polishing platen or chamber to provide electrical connection with the conductive polishing portion 1210. The conductive path 1232 may be integral with the support 1260 or extend from the support 1260 as shown in FIG. 12B

Figure 12D:
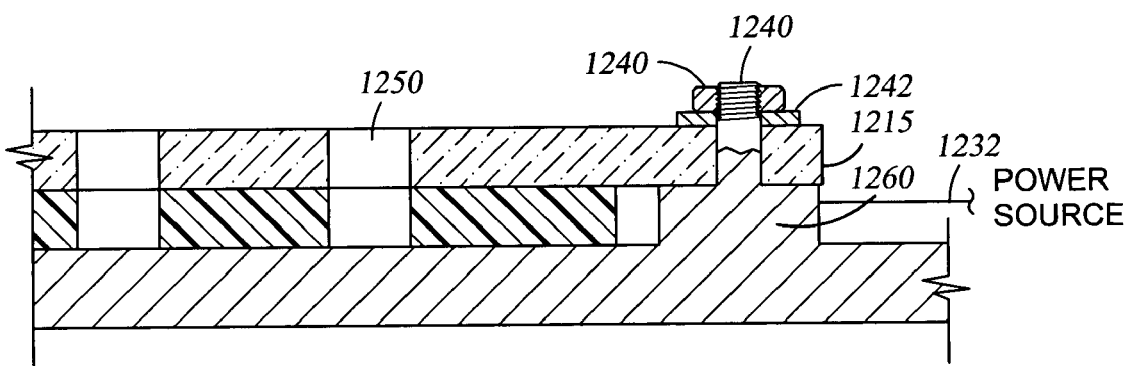

In a further embodiment, the fastener 1240 may be an integrated extension of the support 1260 extending through the conductive polishing portion 1215 and secured by a bolt 1248 as shown in FIG. 12D.

Figure 12E:
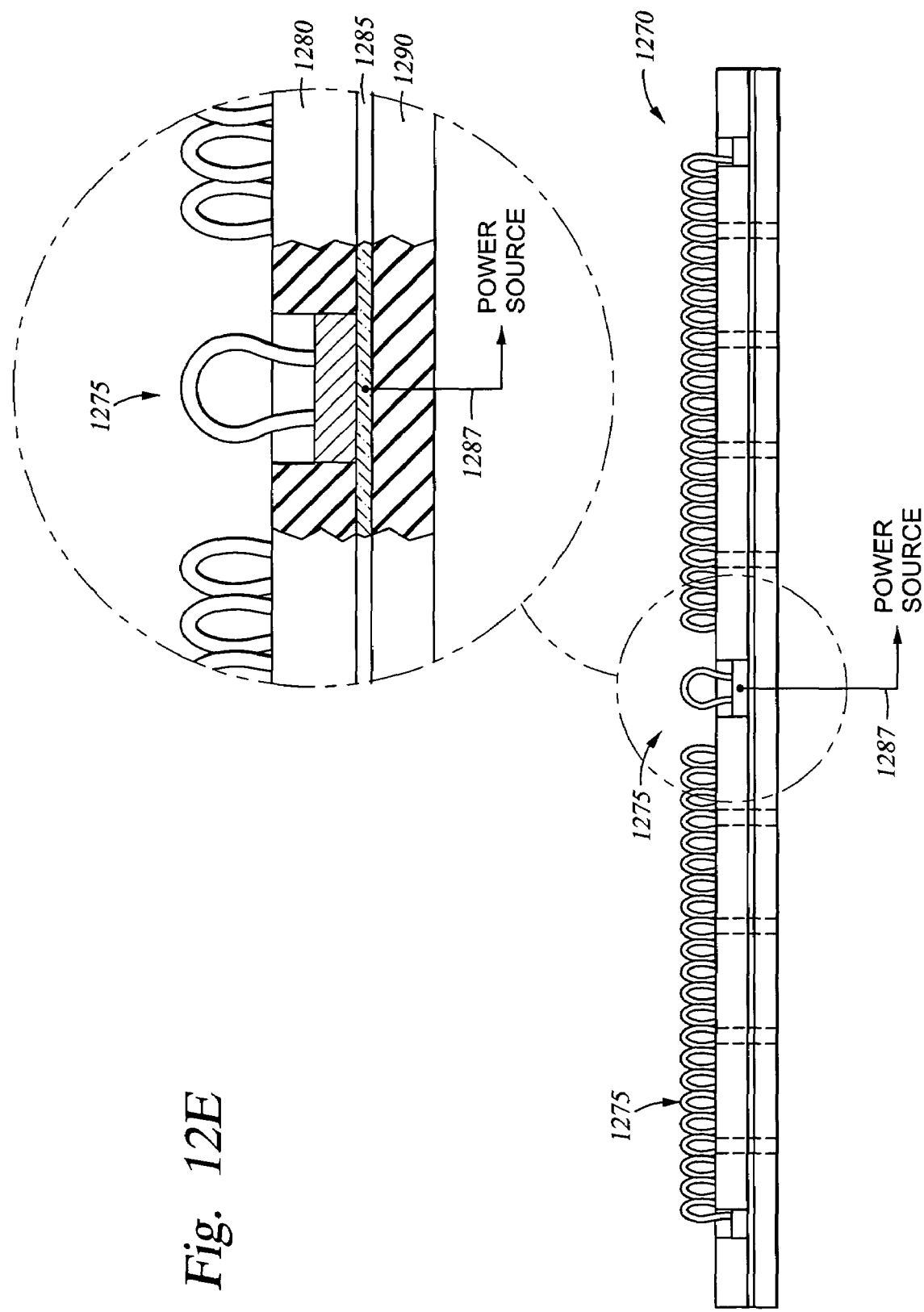
FIGS. 12E and 12F show side schematic and exploded perspective views of another embodiment of providing power to a polishing article.
Figure 12F:
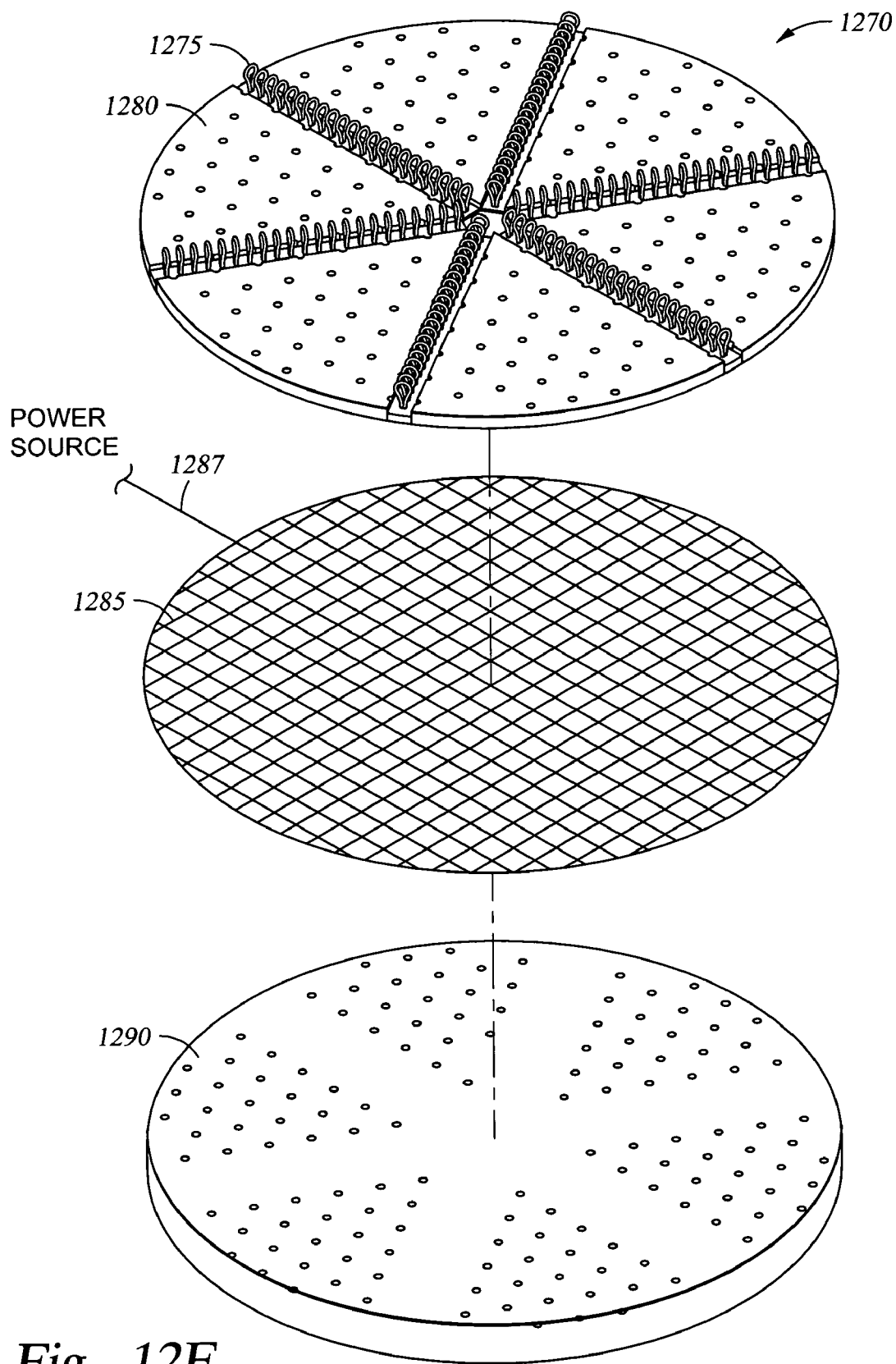

FIGS. 12E and 12F show side schematic and exploded perspective views of another embodiment of providing power to a polishing article 1270 having a power coupling 1285 disposed between a polishing portion 1280 and a article support portion 1290. The polishing portion 1280 may be made of a conductive polishing material as described herein or include a plurality of conductive elements 1275 as described herein. The conductive elements 1275 may be physically isolated from one another as shown in FIG. 12F. The conductive elements 1275 formed in the polishing surface are adapted to electrically contact the power coupling 1285, such as by a conductive base of the element.

The power coupling 1285 may comprise a wire interconnecting elements 1275, multiple parallel wires interconnecting elements 1275, multiple wires independently connecting elements 1275, or a wire mesh interconnecting elements connecting elements 1275 to one or more power sources. Independent power sources coupled to independent wires and elements may have varied power applied while interconnected wires and elements may provide uniform power to the elements. The power coupling may cover a portion or all of the diameter or width of the polishing article. The power coupling 1285 in FIG. 12F is an example of a wire mesh interconnecting elements connecting elements 1275. The power coupling 1285 may be connected to a power source by a conductive pathway 1287, such as a wire, to a power source external to a polishing platen or chamber or a power source integrated into a polishing platen or chamber.

Abrasive Elements in Polishing Surfaces

Figure 13:
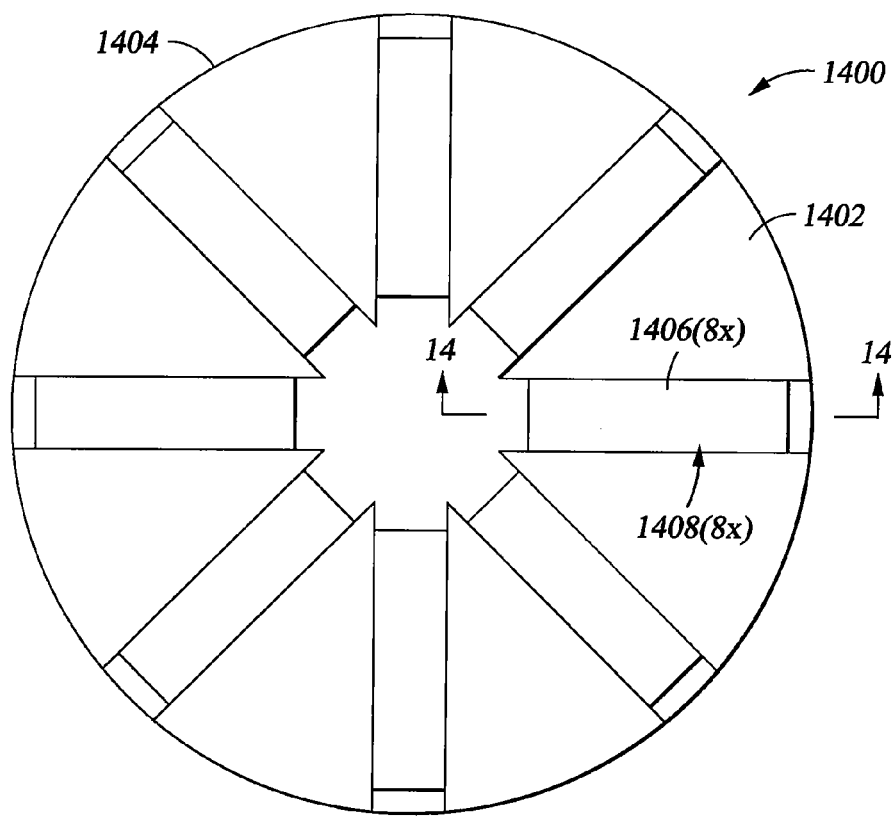
FIGS. 13-14 are top and sectional views of another embodiment of a conductive article.
Figure 14:
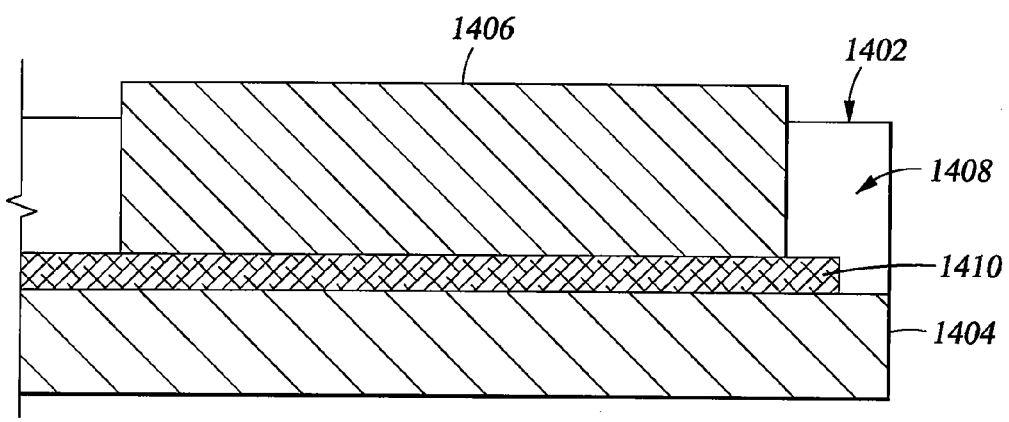
Figure 14A:
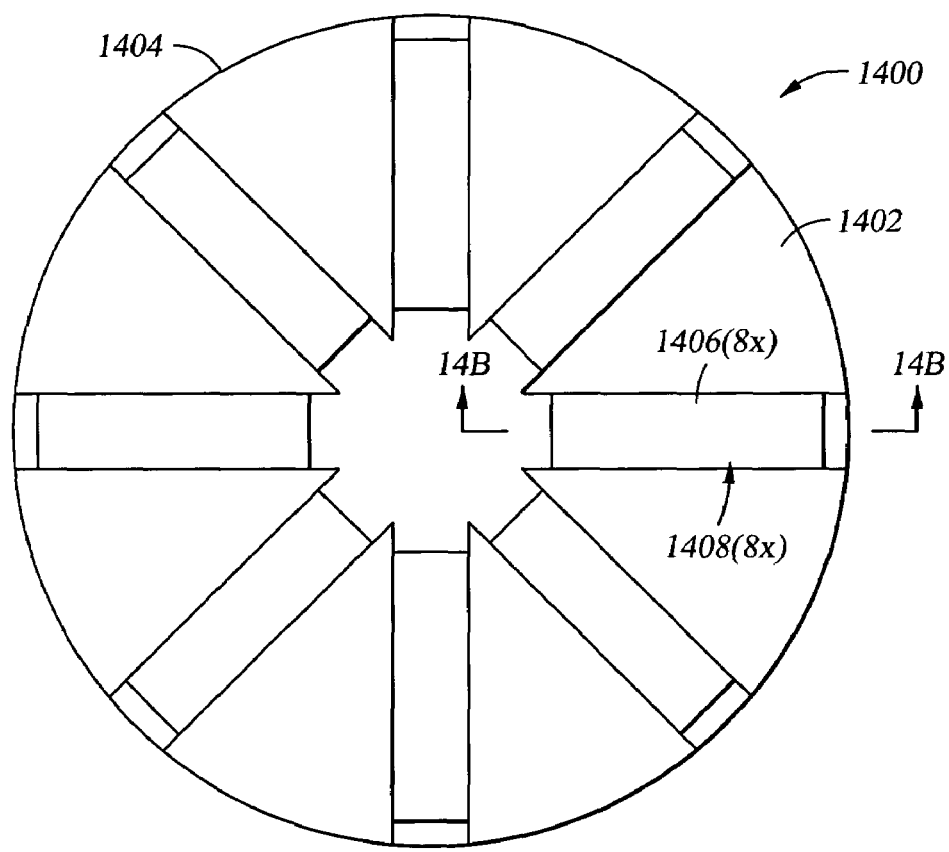
Figure 14B:
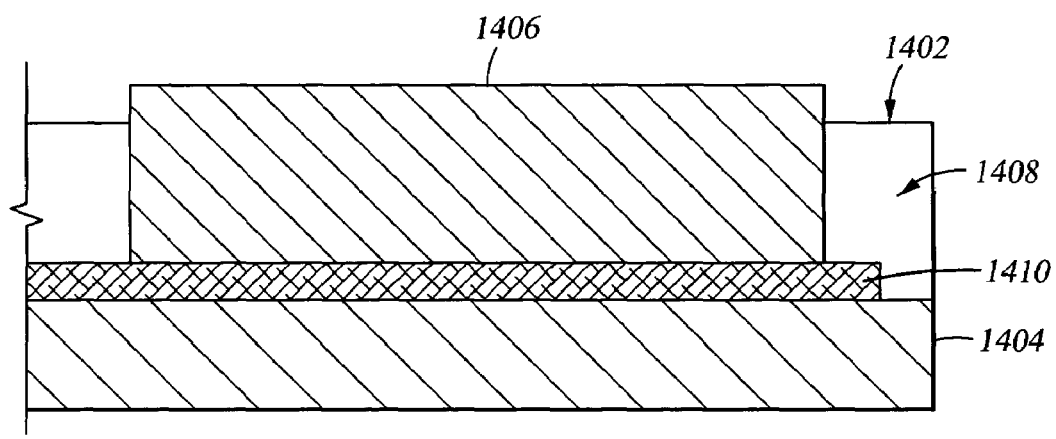

FIGS. 13-14 are top and sectional views of another embodiment of a conductive article 1400. The conductive article 1400 includes abrasive features extending from a polishing surface 1402 of a conductive portion 1404 of the conductive article 1400. The abrasive features may be abrasive particles as described with reference to FIG. 3 above, or may be discreet abrasive elements 1406 as shown in FIGS. 13-14.

In one embodiment, the abrasive elements 1406 are bars received in respective slots 1408 formed in the polishing surface 1402 of the conductive article 1400. The abrasive elements 1406 generally extend from the polishing surface 1402 and are configured to remove the passivation layer of the metal surface of the substrate being polished, thereby exposing the underlying metal to the electrolyte and electrochemical activity, thereby enhancing the rate of polishing during processing. The abrasive elements 1406 may be formed from ceramic, inorganic, organic, or polymer material strong enough to break the passivation layer formed at the metal surface. An example is a bar or strip made from conventional polishing pad such as polyurethane pad disposed in the conductive article 1400. In the embodiment depicted in FIGS. 13-14, the abrasive elements 1406 may have hardness of at least about 30 Shore D, or hard enough to abrade the passivation layer of the material being polished. In one embodiment, the abrasive elements 1406 are harder than copper. Polymer particles may be solid or spongy to tailor the wear rate of the abrasive elements 1406 relative to the surrounding conductive portion 1404.

The abrasive elements 1406 may be configured in various geometric or random configurations on the polishing surface 1402. In one embodiment, the abrasive elements 1406 are radially oriented on the polishing surface 1402, however, other orientations such as spiral, grid, parallel and concentric orientations of the abrasive elements 1406 are contemplated among other orientations.

In one embodiment, a resilient member 1410 may be disposed in the respective slots 1408 between the abrasive elements 1406 and the conductive portion 1404. The resilient member 1410 allows the abrasive elements 1406 to move relative to the conductive portion 1404, thereby providing enhanced compliance to the substrate for more uniform removal of the passivation layer during polishing. Moreover, the compliance of the resilient member 1410 may be selected to tailor the relative pressure applied to the substrate by the abrasive elements 1406 and the polishing surface 1402 of the conductive portion 1404, thereby balancing removal rate of the passivation layer against the rate of passivation layer formation so that the metal layer being polished is minimally exposed to the abrasive elements 1406 to minimize potential scratch generation.

Conductive Balls Extending from Polishing Surfaces

FIGS. 15A-D are top and sectional views of alternative embodiments of a conductive article 1500. The conductive article 1500 includes conductive rollers 1506 extending from a polishing surface 1502 of an upper portion 1504 of the conductive article 1500. The rollers 1506 can be urged down to the same plane of the polishing surface 1502 by a substrate during polishing. The conductive rollers embedded in the conductive article 1500 are coupled to an external power source 1536 at high voltage for high removal rate of bulk polishing substrate during processing.

The conductive rollers 1506 may be fixed relative to the upper portion 1504, or may be free to roll. The conductive rollers 1506 may be balls, cylinders, pins, ellipsidal or other shapes configured not to scratch the substrate during processing.

Figure 15A:
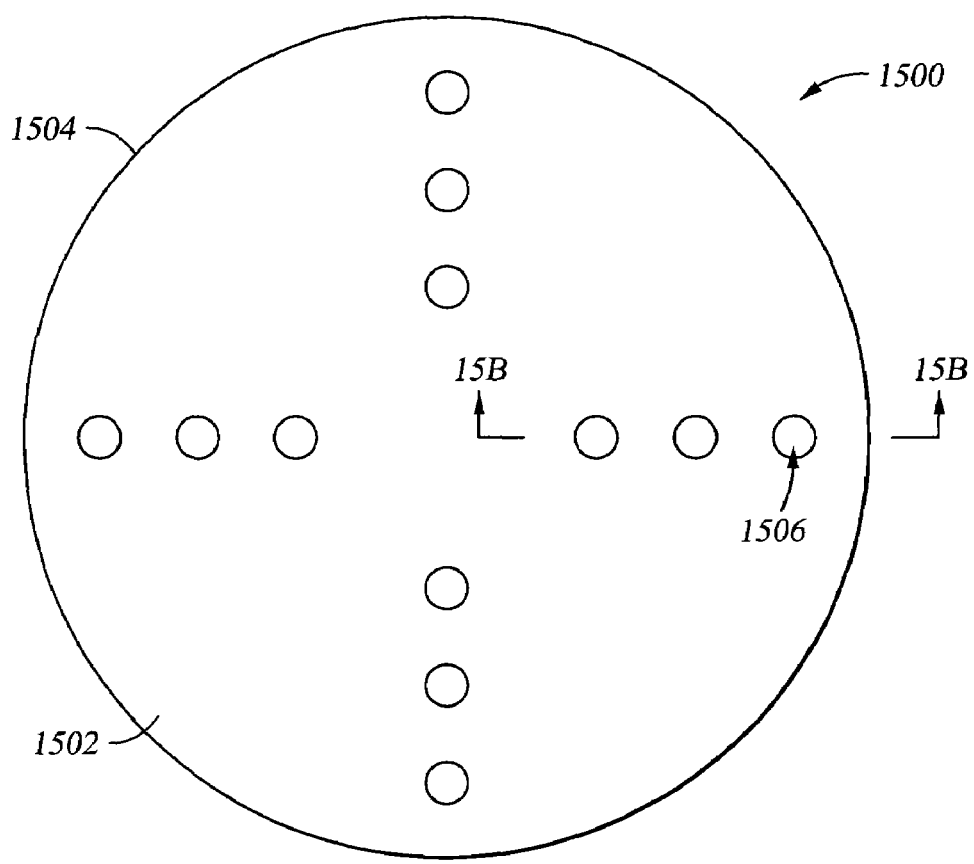
FIGS. 15A-D are top and sectional views of another embodiment of a conductive article.
Figure 15B:
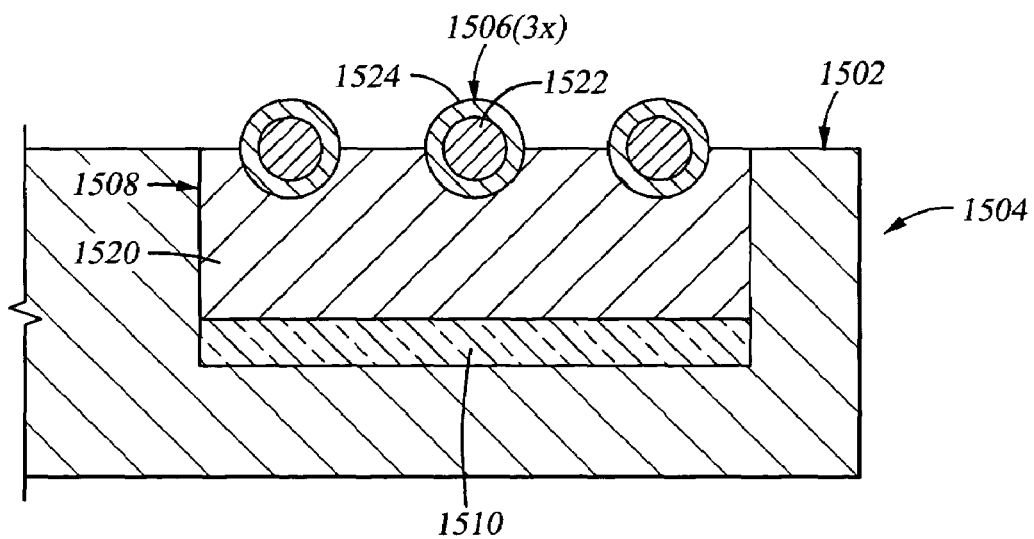

In the embodiment depicted in FIG. 15B, the conductive rollers 1506 are a plurality of balls disposed in one or more conductive carriers 1520. Each conductive carrier 1520 is disposed in a slot 1508 formed in the polishing surface 1502 of the conductive article 1500. The conductive rollers 1506 generally extend from the polishing surface 1502 and are configured to provide electrical contact with the metal surface of the substrate being polished. The conductive rollers 1506 may be formed from any conductive material, or formed from a core 1522 at least partially coated with a conductive covering 1524. In the embodiment depicted in FIG. 15B, the conductive rollers 1506 have a polymer core 1522 at least partially covered by a soft conductive material 1524. An example is a TORLON™ polymer core coated with conductive gold layer using copper as seeding layer between TORLON™ and gold layer. Another example is TORLON™ or other polymer core coated with a layer of copper or other conductive material. Other soft conductive materials 1524 include, but are not limited to, silver, copper, tin and the like.

In one embodiment, the polymer core 1522 may be selected from an elastic or a resilient material such as polyurethane that deformed when the roller 1506 is in contact with a substrate during polishing. Some examples of materials that may be utilized for the core 1522 include elastic organic polymers, ethylene-propylene-diene (EDPM), poly-alkenes, polyalkynes, polyesters, poly-aromatic alkenes/alkynes, polyimide, polycarbonate, polyurethane, and there combinations. Other examples of core materials include inorganic polymers, such as siloxane, or organic and inorganic combined materials, such as polysilicon and polysilane. As the roller 1506 deforms, the contact area between the roller 1506 and substrate increases, thus improving the current flow between the roller 1506 and conductive layer disposed on the substrate and thereby improving polishing results.

Alternatively, the polymer core 1522 may be made conductive as to make the covering of the core 1522 with soft conductive material 1524 optional. For example, the polymer core 1522 may be doped by other conductive elements, such as metals, conductive carbon or graphite, among other conductive materials.

The conductive rollers 1506 may be arranged in various geometric or random configurations on the polishing surface 1502. In one embodiment, the conductive rollers 1506 are radially oriented on the polishing surface 1502, however, other orientations such as spiral, grid, parallel and concentric orientations of the conductive rollers 1506 are contemplated among other orientations.

In the embodiment depicted in FIG. 15B a resilient member 1510 may be disposed in the respective slots 1508 between the conductive carriers 1520 and the conductive portion 1504. The resilient member 1510 allows the conductive rollers 1506 (and carrier 1620) to move relative to the conductive portion 1504. thereby providing enhanced compliance to the substrate for more uniform electrical contact during polishing.

Figure 15C:
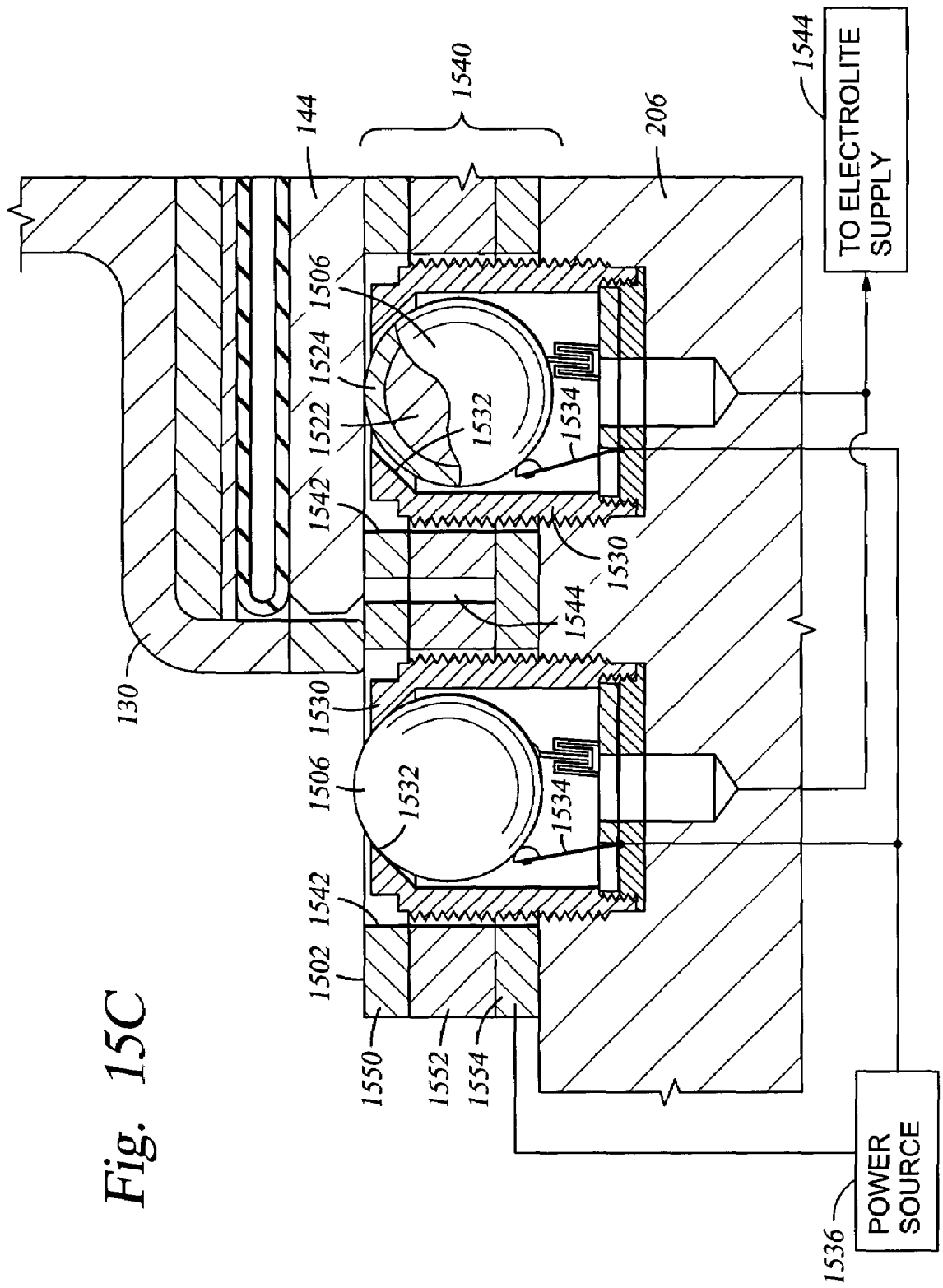

In the embodiment depicted in FIG. 15C, the conductive rollers 1506 are respectively disposed in a plurality of electrically insulative housings 1530 that are coupled to the disc 206. Each housing 1530 may be coupled to the disc 206 by welding, adhesives, staking or other methods. In the embodiment depicted in FIG. 7C, the housings 1530 are threaded into the disc 206.

The housing 1530 is generally a hollow cylinder that allows the roller 1506 to move vertically, perpendicular to the plane of the disc 206 and polishing surface 1502. An upper end of the housing 1530 includes a tapered seat 1532 that prevents the roller 1506 from exiting through the upper end of the housing 1530. The seat 1532 is configured to allow at least a portion of the perimeter of the roller 1506 to extend out of the housing 1530 and contact the substrate 114 during processing.

A contact means 1534 is configured to maintain electrical contact between the roller 1506 and the power source 1536. The contact means 1534 may be any type of conductive resilient member such as a spring form, compression spring, conductive bearing and the like, or other device that allows electrical connection to be maintains between different positions of the roller 1506 within the housing 1530. The contact means 1534 is disposed in the lower end of each of the housings 1530. In one embodiment, the contact means 1534 is a flat spring. The contact means 1534 may be utilized to bias the roller 1506 away from the disc 206 and against the seat 1532.

Alternatively, electrolyte provided from an electrolyte source 1544 flowing through the housing 1530 and exiting the housing 1530 between the seat 1532 and roller 1506. The flow of electrolyte exiting the housing 1530 biases the roller 1506 away from the disc 206.

In yet another embodiment, the roller 1506 may be configured with a specific gravity less than the electrolyte so that the buoyancy of the roller 1506 when the housing 1530 is at least partially filled with electrolyte biases the roller 1506 away from the disc 206. The roller 1506 may be optionally hollow to increase the buoyancy and decrease the inertia of the roller 1506. One housing having a roller coupled to a power source through a contact member that may be adapted to benefit from the invention is described in previously incorporated U.S. patent application No. 10/211,626, published as U.S. Patent Publication No. 2004/0023495.

A pad assembly 1540 is disposed on the disc 206. The pad assembly 1540 includes a plurality of first apertures 1542 that are configured to allow the housings 1530 to extend at least partially therethrough. Generally, the housing 1530 has a height configured to allow a portion of the perimeter of the roller 1506 to extend above the pad assembly 1540 so that the roller 1506 may be displaced to a position substantially flush with the polishing surface 1502 of the pad assembly 1540 by the substrate 114 during processing.

In the embodiment depicted in FIG. 15C, the pad assembly 1540 includes a dielectric layer 1550, a subpad 1552 and an electrode 1554. The dielectric layer 1550, the subpad 1552 and the electrode 1554 may be coupled together as a replaceable unit, for example by compression melding, staking, fastening, adhering, bonding or by other coupling methods.

The dielectric layer 1550 may be similar to the conductive portion 310 described above. The subpad 1552 may be similar to the article support portion 320 described above. The electrode 1554 may be similar to the electrode 204 described above.

A second set of apertures 1544 (one of which is shown in FIG. 15C) may be formed at least through the dielectric layer 1550 through at least the dielectric layer 1550 and the subpad 1552 to allow electrolyte disposed on the pad assembly 1540 to provide a current path between the electrode 1554 and the substrate 114. Optionally, the apertures 1544 may extend into or through the electrode 1554. A window (not shown) may also be formed in the pad assembly 1540 as described above with reference to FIG. 7F to facilitate process control.

Figure 15D:
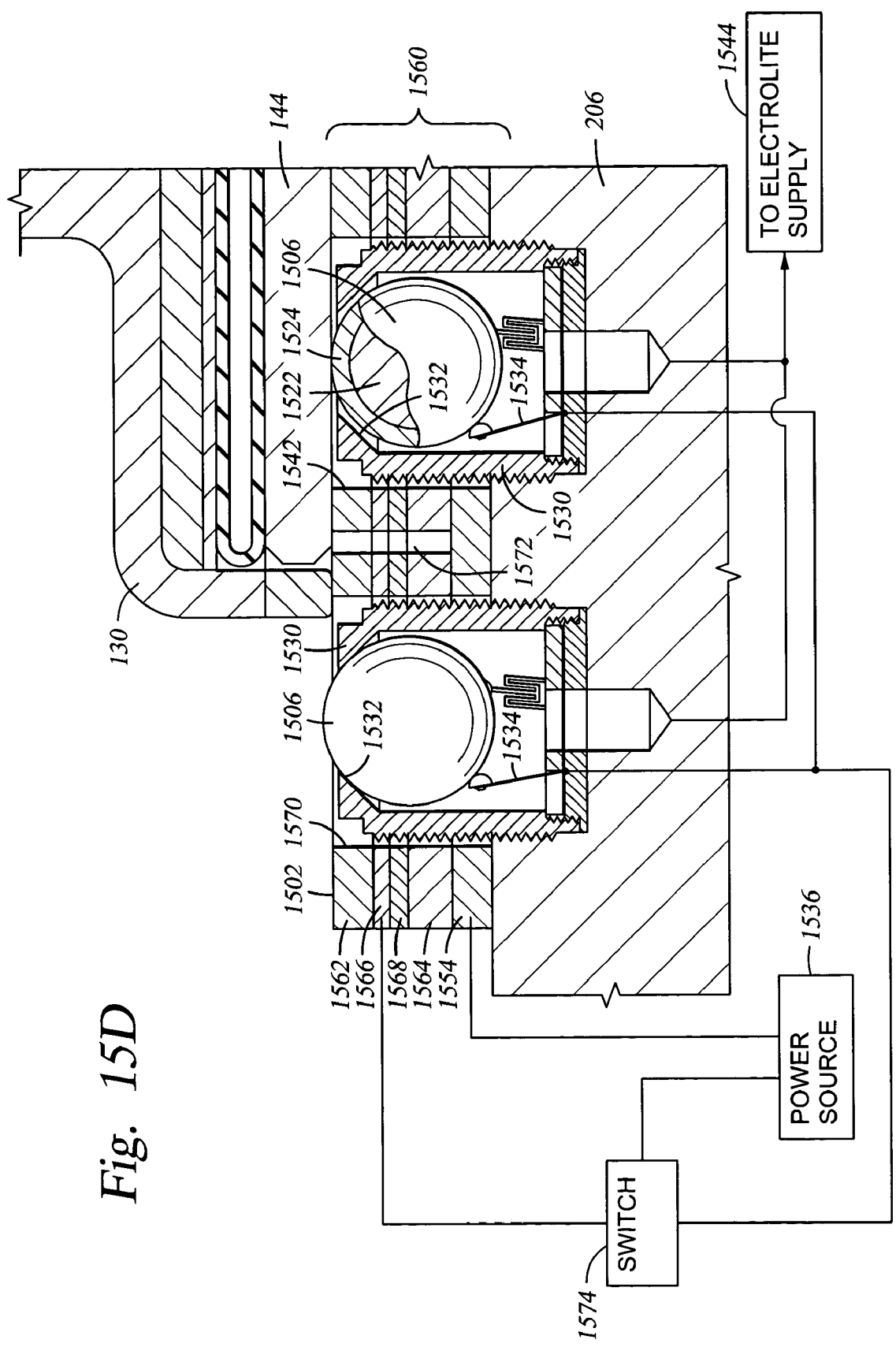

In the embodiment depicted in FIG. 15D, a pad assembly 1560 includes at least a conductive layer 1562, a subpad 1564 and an electrode 1554. The conductive layer 1562, the subpad 1564 and the electrode 1554 may be coupled together as a replaceable unit The pad assembly 1560 may include first apertures 1570 configured to accept the housing 1530 and second apertures 1572 to allow electrolyte disposed on the pad assembly 1560 to establish a current path between the substrate 114 and the electrode 1554. A window (not shown) may also be formed in the pad assembly 1560 as described above In one embodiment, the conductive layer 1562 and subpad 1564 may be configured similar to the conductive layer 310 and article support portion 320 of the polishing article 205 described above. Alternatively, the pad assembly 1560 may include a conductive backing 1566 and an interposed pad 1568 disposed between the conductive layer 1562 and subpad 1564. The conductive backing 1566 and the interposed pad 1568 may be similarly configured to the conductive backing and the interposed pad described under the heading "CONDUCTIVE ARTICLE WITH INTERPOSED PAD" that follows below.

The conductive backing 1566 is generally coupled to the power source 1536 through a switch 1574. The conductive backing 1566 distributes the potential uniformly across the backside of the conductive layer 1562 so that uniform current is delivered across the diameter of the substrate 114 between the conductive layer 1562 and substrate 114 during processing.

During processing, the switch 1574 is disposed in a first state that electrically couples the roller 1506 to the power source 1536 while opening the circuit between the conductive backing 1566 and the power source 1536. The rollers 1506 allow relatively high current flow between the substrate 114 and electrode 1554 thereby facilitating bulk removal of a conductive layer from the substrate. Once the conductive layer is substantially removed, the switch 1574 is disposed in a second state that electrically couples conductive backing 1566 to the power source 1536 while opening the circuit between the roller 1506 and the power source 1536. The conductive backing 1566 provides substantially uniform voltage potential across the width of the conductive layer 1562 to facilitate removal of residual conductive material from the substrate. Thus, both bulk and residual conductive material removal for a substrate may be performed on a single platen without lifting the substrate from the pad assembly 1540. Examples of other pad assembly that may be adapted to benefit from the invention is described below with reference to FIGS. 16-18. It is also contemplated that other pad assemblies may be utilized, including those described above and those incorporating windows that facilitate sensing polishing performance.

Conductive Article with Interposed Pad

Figure 16:
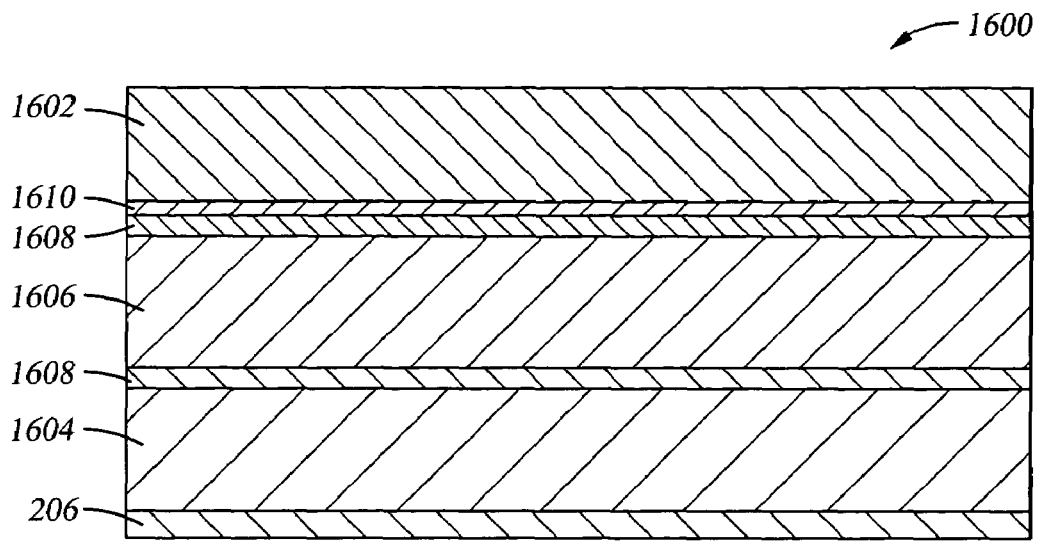
FIGS. 16-18 are a sectional view of alternate embodiments of a conductive article.

FIG. 16 is a sectional view of another embodiment of a conductive article 1600. The conductive article 1600 generally includes a conductive portion 1602 adapted to contact a substrate during polishing, an article support portion 1604 and an interposed pad 1606 sandwiched between the conductive portion 1602 and the article support portion 1604. The conductive portion 1602 and article support portion 1604 may be configured similar to any of the embodiments described herein or their equivalent. A layer of adhesive 4608 may be provided on each side of the interposed pad 1606 to couple the interposed pad 1606 to the article support portion 1604 and the conductive portion 1602. The conductive portion 1602, the article support portion 1604 and the interposed pad 1606 may be coupled by alternative methods thereby allowing the components of the conductive article 1600 to be easily replaced as a single unit after its service life, simplifying replacement, inventory and order management of the conductive article 1600.

Optionally, the support portion 1604 may be coupled to an electrode 204 and replaceable with the conductive article 1600 as a single unit. The conductive article 1600, optionally including the electrode 204, may also include a window formed therethrough as depicted and described with reference to FIG. 7F.

The interposed pad 1606 is generally harder than the article support portion 1604 and is a hard or harder than the conductive portion 1602. The invention contemplates the interposed pad 1606 may alternatively be softer than the conductive portion 1602. The hardness of the interposed pad 1606 is selected to provide stiffness to the conductive article 1600, which extends the mechanical life of both the conductive portion 1602 and the article support portion 1604 while improving dampening characteristics of the conductive article 1600 resulting in greater global flatness of the polished substrate. In one embodiment, the interposed pad 1606 has a hardness of less than or equal to about 80 Shore D, the article support portion 1604 has a hardness of less than or equal to about 80 Shore A, while the conductive portion 1602 has a hardness of less than or to about 100 Shore D. In another embodiment, the interposed pad 1606 has a thickness of less than or equal to about 35 mils, while the article support portion 1604 has a thickness of less than or equal to about 100 mils.

The interposed pad 1606 may be fabricated from a dielectric material that permits electrical pathways to be established through the laminate comprising the conductive article 1600 (i.e., the stack of the conductive portion 1602, the interposed pad 1606 and the article support portion 1604). The electrical pathways may be established as the conductive article 1600 is immersed or covered with a conductive fluid, such as an electrolyte. To facilitate the establishment of electrical pathways through the conductive article 1600, the interposed pad 1606 may be at least one of permeable or perforated to allow electrolyte to flow therethrough.

In one embodiment, the interposed pad 1606 is fabricated from a dielectric material compatible with the electrolyte and the electrochemical process. Suitable materials include polymers, such as polyurethane, polyester, mylar sheet, epoxy and polycarbonate, among others.

Optionally, a conductive backing 1610 may be disposed between the interposed pad 1606 and the conductive portion 1602. The conductive backing 1610 generally equalizes the potential across the conductive portion 1602, thereby enhancing polishing uniformity. Having equal potential across the polishing surface of the conductive portion 1602 ensures good electrical contact between the conductive portion 1602 and conductive material being polished, particularly if the conductive material is residual material that is not longer a continuous film (i.e., discrete islands of film residue). Moreover, the conductive backing 1610 provides mechanical strength to the conductive portion 1602, thereby increasing the service life of the conductive article 1600. Utilization of the conductive backing 1610 is beneficial in embodiments where the resistance through the conductive portion is greater than about 500 m-ohms and enhances the mechanical integrity of conductive portion 1602. The conductive backing 1610 may also be utilized to enhance the conductive uniformity and lower the electrical resistance of the conductive portion 1602. The conductive backing 1610 may be fabricated from metal foils, metal screens, metal coated woven or non-woven fabrics among other suitable conductive materials compatible with the polishing process. In one embodiment, the conductive backing 1610 is compression molded to the conductive portion 1602. The backing 1610 is configured not to prevent the flow of electrolyte between the conductive portions 1604 and the interposed pad 1606. The conductive portion 1602 may be mounted onto the conductive backing 1610 through compression molding, lamination, injection molding and other suitable methods.

Figure 17:
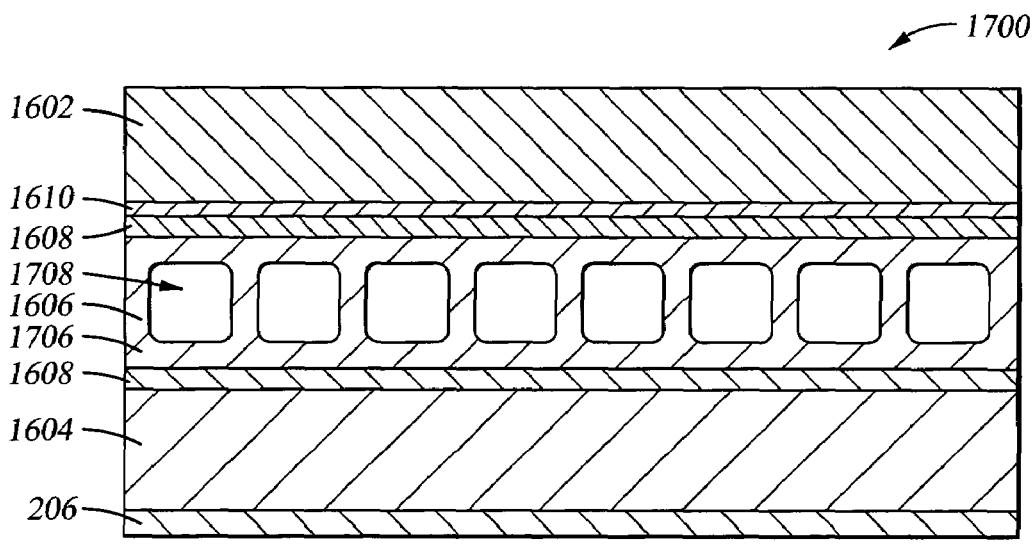

FIG. 17 is a sectional view of another embodiment of a conductive article 1700. The conductive article 1700 generally includes a conductive portion 1602 adapted to contact a substrate during polishing, a conductive backing 1610, an article support portion 1604 and an interposed pad 1706 sandwiched between the conductive portion 1602 and the article support portion 1604, having similar construction to the conductive article 1600 described above.

In the embodiment depicted in FIG. 17, the interposed pad 1706 is fabricated from a material having a plurality of cells 1708. The cells 1708 are generally filled with air or other fluid, and provide a resiliency and compliance that enhances processing. The cells may be open or closed with a size ranging from 0.1 micron meter to several millimeters such as between 1 micron meter to 1 milimeter. The invention contemplates other sizes applicable for interposed pad 1706.

The interposed pad 1706 may be at least one of permeable or perforated to allow electrolyte to flow therethrough.

The interposed pad 1706 may be fabricated from a dielectric material compatible with the electrolyte and the electrochemical process. Suitable materials include, but are not limited to, foamed polymers such as foamed polyurethane and mylar sheet. The interposed pad 1706 generally has a less compressibility than article support portion or sub-pad 1604 and more local deformation independence when subjected to pressure.

Figure 18:
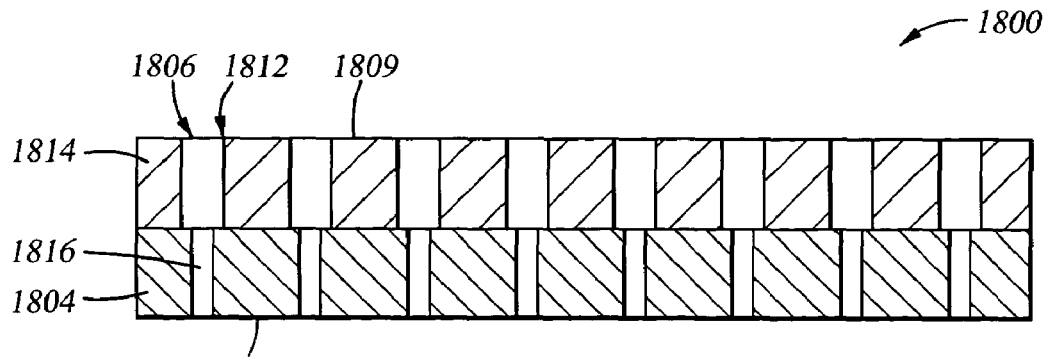

FIG. 18 is sectional view of another embodiment of a conductive article 1800. The conductive article 1800 includes a conductive portion 1802 coupled to an article support portion 1804. Optionally, the conductive article 1800 may include an interposed pad and conductive backing (both not shown) disposed between the conductive portion 1802 and the article support portion 1804.

The conductive article 1800 generally includes a plurality of apertures 1806 formed therethrough to allow electrolyte or other processing fluids to pass between an upper polishing surface 1808 of the conductive portion 1802 and a lower mounting surface 1810 of the article support portion 1804. The edge 1812 defined where each of the apertures 1806 intersects the upper polishing surface 1808 is contoured to eliminate any sharp corner, burrs or surface irregularities that may scratch the substrate during processing. The contour of the edge 1812 may include a radius, chamfer, taper or other configuration that smoothes the edge 1812 and promotes scratch minimization.

In embodiments where the conductive portion 1802 is at least partially fabricated from a polymer, the smoothing of the edge 1812 may be realized by forming the aperture 1806 before the polymer has completely cured. Thus, the edges 1812 will become rounded as the conductive portion 1802 shrinks during the remainder of polymer curing cycle.

Additionally, or in the alternative, the edges 1812 may be rounded by applying at least one of heat or pressure during or after curing. In one example, the edges 1812 may be burnished, heat or flame treated to round the transition between the polishing surface 1808 and the aperture 1806 at the edge 1812.

In another example, a polymer conductive portion 1802 may be comprised of a moldable material that is repulsive to the mold or die. The repulsive nature of polymer conductive portion 1802 causes a surface tension that causes stresses to be molded into the polymer conductive portion 1802 that pull the material away from the mold, thereby resulting in the rounding of the edges 1812 of the apertures 1806 upon curing.

The apertures 1806 may be formed through the conductive article 1800 before or after assembly. In one embodiment, the aperture 1806 includes a first hole 1814 formed in the conductive portion 1802 and a second hole 1816 formed in the article support portion 1804. In embodiments comprising an interposed pad, the second hole 1816 is formed therein. Alternatively, the first hole 1814 and at least a portion of the second hole 1816 may be formed in the conductive portion 1802. The first hole 1814 has a diameter greater than a diameter of the second hole 1816. The smaller diameter of the second hole 1816 underlying the first hole 1814 provides lateral support to the conductive portion 1802 surrounding the first hole 1814, thereby improving resistance to pad shear and torque during polishing. Thus, the aperture 1806 comprising a larger hole at the surface 1808 disposed concentric to a underlying smaller hole results in less deformation of the conductive portion 1802 while minimizing particle generation, thus minimizing substrate defects incurred by pad damages.

The apertures in conductive article may be punched through mechanical methods such as male/female punching before or after all layers are put together. In one embodiment the conductive portion 1802 compression molded onto conductive backing is first mounted onto interposed layer, conductive portion 1802 with conductive backing and interposed layer are mechanically perforated together, the article support portion or sub-pad is mechanically perforated separately, after perforation they are aligned together. In another embodiment all layers are put together, then perforated. The invention contemplates any perforation techniques and sequence.

Figure 19:
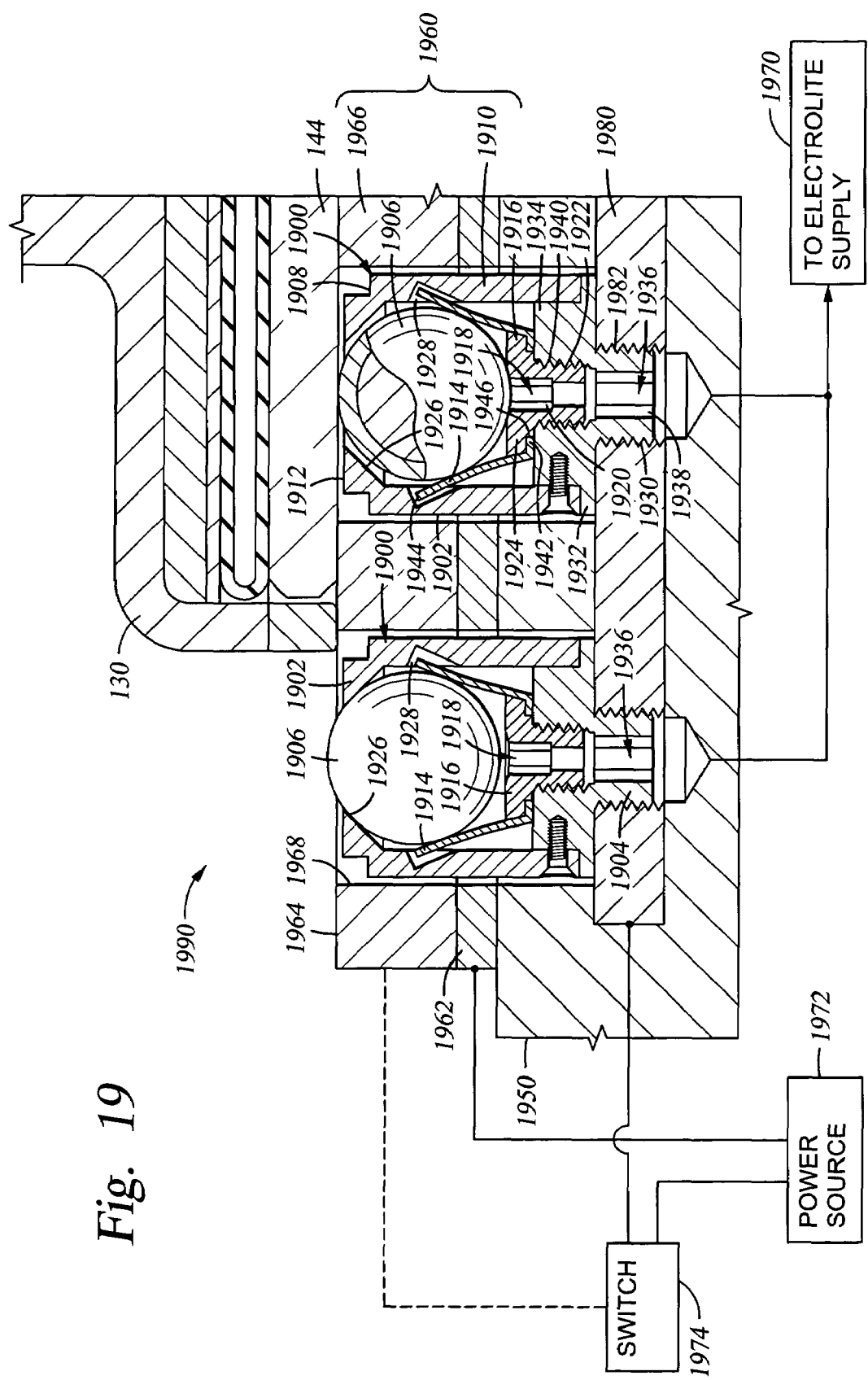
FIG. 19 is sectional view of another embodiment of a conductive article having one embodiment of a ball assembly.

FIG. 19 is a partial sectional view of another embodiment of an ECMP station 1990 and FIGS. 20A-B are side and exploded views of a ball assembly 1900 of the ECMP station 1990 of FIG. 19. The ECMP station 1990 includes a platen 1950 that supports a polishing pad assembly 1960 on which a substrate 114 retained in a polishing head 130 is processed. The platen 1950 includes at least one bell assembly 1900 projecting therefrom and coupled to a power source 1972 that are adapted to bias a surface of the substrate 114 during processing. Although two ball assemblies 1900 are shown in FIG. 19, any number of ball assemblies may be utilized and may be distributed in any number of configurations relative to the centerline of the platen 1950.

The polishing pad assembly 1960 may be any pad assembly suitable for processing the substrate, including any of the embodiments described above. The polishing pad assembly 1960 may include an electrode 1962 and a polishing layer 1966. In one embodiment, the polishing layer 1966 of the polishing pad assembly 1960 may include a polishing surface 1964 that is dielectric, such as a polyurethane pad. In another embodiment, the polishing layer 1966 of the polishing pad assembly 1960 may include a polishing surface 1964 that is conductive, such as a polymer matrix having conductive particles dispersed therein or a conductive coated fabric, among others. In the embodiment wherein the polishing surface 1964 is conductive, the polishing surface 1964 and electrode 1962 may be coupled to the power source 1972 (shown by the dashed lines) via a switch 1974 that allows power to be selectively switch between the ball assemblies 1900 and the conductive polishing surface 1964 to respectively facilitate bulk metal removal and residual metal removal from the substrate 114 without lifting the substrate 114 from the polishing pad assembly 1960.

The ball assemblies 1900 are generally coupled to the platen 1950 and extend at least partially through respective apertures 1968 formed in the polishing pad assembly 1960. Each of the ball assemblies 1900 include a hollow housing 1902, an adapter 1904, a ball 1906, a contact element 1914 and a clamp bushing 1916. The ball 1906 is movably disposed in the housing 1902, and may be disposed in a first position having at least a portion of the ball 1906 extending above the polishing surface 1964 and at least a second position where the ball 1906 is flush with the polishing surface 1964. The ball 1906 is generally suitable for electrically biasing the substrate 114 and may be configured as described above.

The housing 1902 is fabricated from a dielectric material compatible with process chemistries. In one embodiment, the housing 1902 is made of PEEK. The housing 1902 has a first end 1908 and a second end 1910. A drive feature 1912 is formed in and/or on the first end 1908 to facilitate installation of the ball assembly 1900 to the platen 1950. The drive feature 1912 may be holes for a spanner wrench, a slot or slots, a recessed drive feature (such as for a TORX® or hex drive, and the like) or a projecting drive feature (such as wrench flats or a hex head, and the like), among others. The first end 1908 additionally includes a seat 1926 that prevents the ball 1906 from passing out of the first end 1908 of the housing 1902.

The contact element 1914 is coupled between the clamp bushing 1916 and adapter 1904. The contact element 1914 is generally configured to electrically connect the adapter 1904 and ball 1906 substantially or completely through the range of ball positions within the housing 1902. The contact element 1914 may be configured as described above.

In the embodiment depicted in FIGS. 19-20A-B and detailed in FIG. 21, the contact element 1914 includes an annular base 1942 having a plurality of flexures 1944 extending therefrom in a polar array. The flexure 1944 includes two support elements 2102 extending from the base 1942 to a distal end 2108. The support elements 2102 are coupled by a plurality of rungs 2104 to define apertures 2110 that facilitate flow past the contact element 1916 with little pressure drop as discussed further below. A contact pad 2106 adapted to contact the ball 1906 couples the support elements 2102 at the distal end 2108 of each flexure 1944. The flexure 1944 is generally fabricated from a resilient and conductive material suitable for use with process chemistries. In one embodiment, the flexure 1944 is fabricated from gold plated beryllium copper.

Returning to FIGS. 19-20B, the clamp bushing 1916 includes a flared head 1924 having a threaded post 1922 extending therefrom. The clamp busing may be fabricated from either a dielectric or conductive material, and in one embodiment, is fabricated from the same material as the housing 1902. The flared head 1924 maintains the flexures 1944 at an acute angle relative to the centerline of the ball assembly 1900 so that the contact pads 2106 of the contact elements 1914 are positioned to spread around the surface of the ball 1906 to prevent bending, binding and/or damage to the flexures 1944 during assembly of the ball assembly 1900 and through the range of motion of the ball 1906.

The post 1922 of the clamp bushing 1916 is disposed through a hole 1946 in the base 1942 and threads into a threaded portion 1940 of a passage 1936 formed through the adapter 1904. A passage 1918 formed through the clamp bushing 1916 includes a drive feature 1920 at an end disposed in the flared head 1924. Similarly, the passage 1936 includes a drive feature 1938 in an end opposite the threaded portion 1940. The drive features 1920, 1930 may be similar to those described above, and in one embodiment, are hexagonal holes suitable for use with a hex driver. The clamp bushing 1924 is tightened to a level that ensures good electrical contact between the contact element 1914 and the adapter 1904 without damaging the contact element 1914 or other component.

The adapter 1904 is generally fabricated from an electrically conductive material compatible with process chemistries, and in one embodiment, is fabricated from stainless steel. The adapter 1904 includes an annular flange 1932 having a threaded post 1930 extending from one side and a boss 1934 extending from the opposite side. The threaded post 1930 is adapted to mate with a contact plate 1980 disposed in the platen 1950 which couples the respective balls 1906 in the ball assemblies 1900 to the power source 1972.

The boss 1934 is received in the second end 1910 of the housing 1902 and provides a surface for clamping the contact element 1914 thereto. The boss 1934 additionally includes at least one threaded hole 2006 disposed on the side of the boss 1934 that engages a fastener 2002 disposed through a hole 2004 formed in the housing 1902, thereby securing the housing 1902 to the adapter 1904 and capturing the ball 1906 therein. In the embodiment depicted in FIG. 20A, three fasteners are shown for coupling the housing 1902 to the adapter 1904 through counter-sunk holes 2004. It is contemplated that the housing 1902 and adapter 1904 may be fastened by alternative methods or devices, such as staking, adhering, bonding, press fit, dowel pins, spring pins, rivets and retaining rings, among others.

The ball 1904 is generally actuated towards the polishing surface 1906 by at least one of spring, buoyant or flow forces. In the embodiment depicted in FIG. 19, the passages 1936, 1918 formed through the adaptor 1904 and clamp busing 1916 are coupled through the platen 1950 to an electrolyte source 1970. The electrolyte source 1970 provides electrolyte through the passages 1936 and 1918 into the interior of the hollow housing 1902. The electrolyte exits the housing 1902 between the seat 1926 and ball 1906, thus causing the ball 1906 to be biased toward the polishing surface 1964 and into contact with the substrate 114 during processing.

So that the force upon the ball 1906 is consistent across the different elevations of the ball 1906 within the housing 1906, a relief or groove 1928 is formed in the interior wall of the housing 1906 to accept the distal ends (2108 in FIG. 21) of the flexures 1944 to prevent restricting the flow of electrolyte passing the ball 1908. An end of the groove 1928 disposed away from the seat 1926 is generally configured to being at or below the diameter of the ball 1906 when the ball 1906 is in the lowered position.

Figure 22:
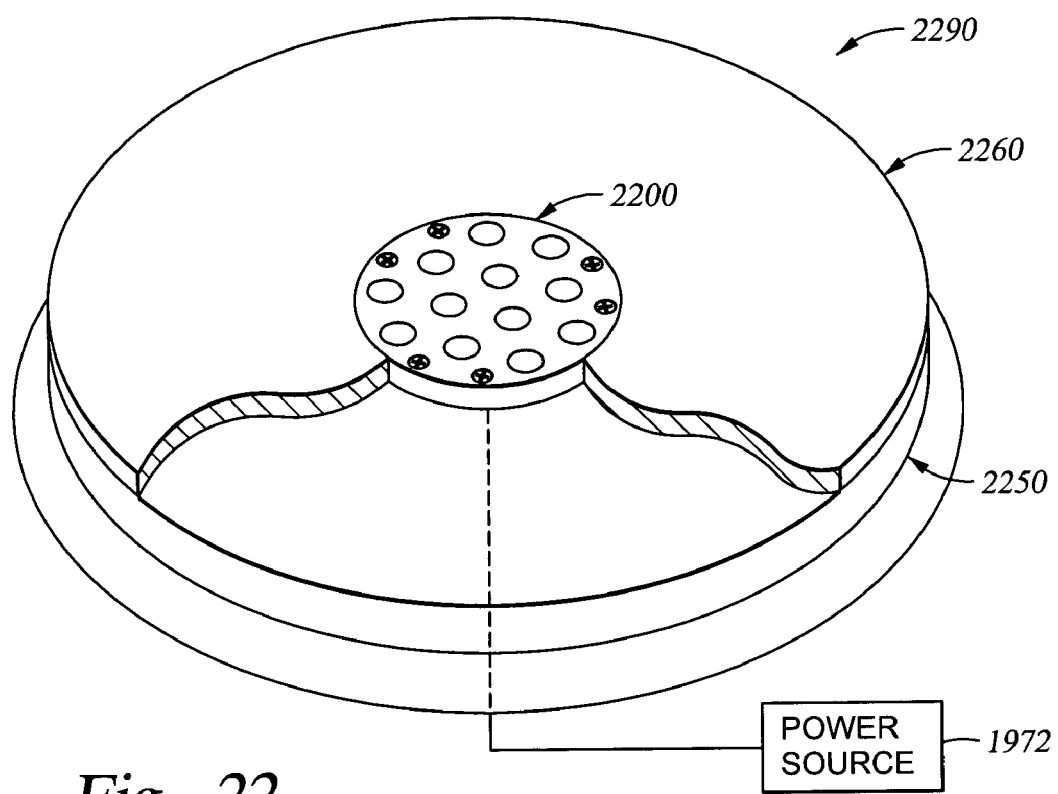
FIGS. 22-24 are perspective and sectional views of another embodiment of a conductive article having another embodiment of a ball assembly; and To facilitate understanding, identical reference numerals have been used, wherever possible, to designate identical elements that are common to the figures.
Figure 23:
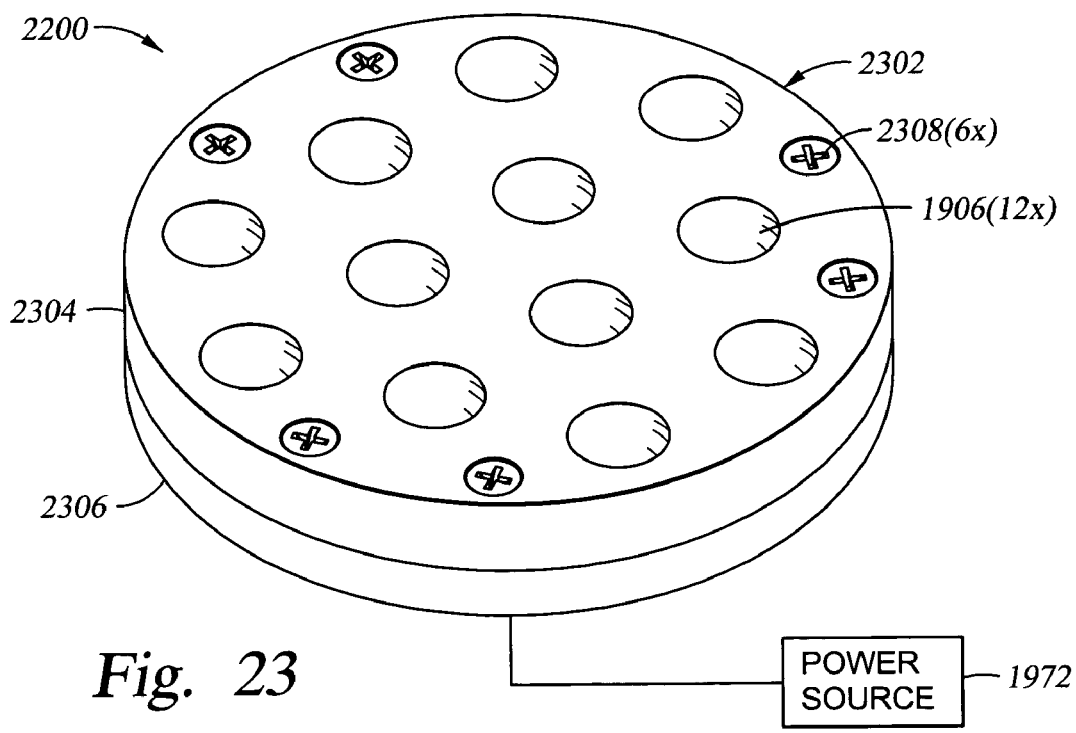
Figure 24:
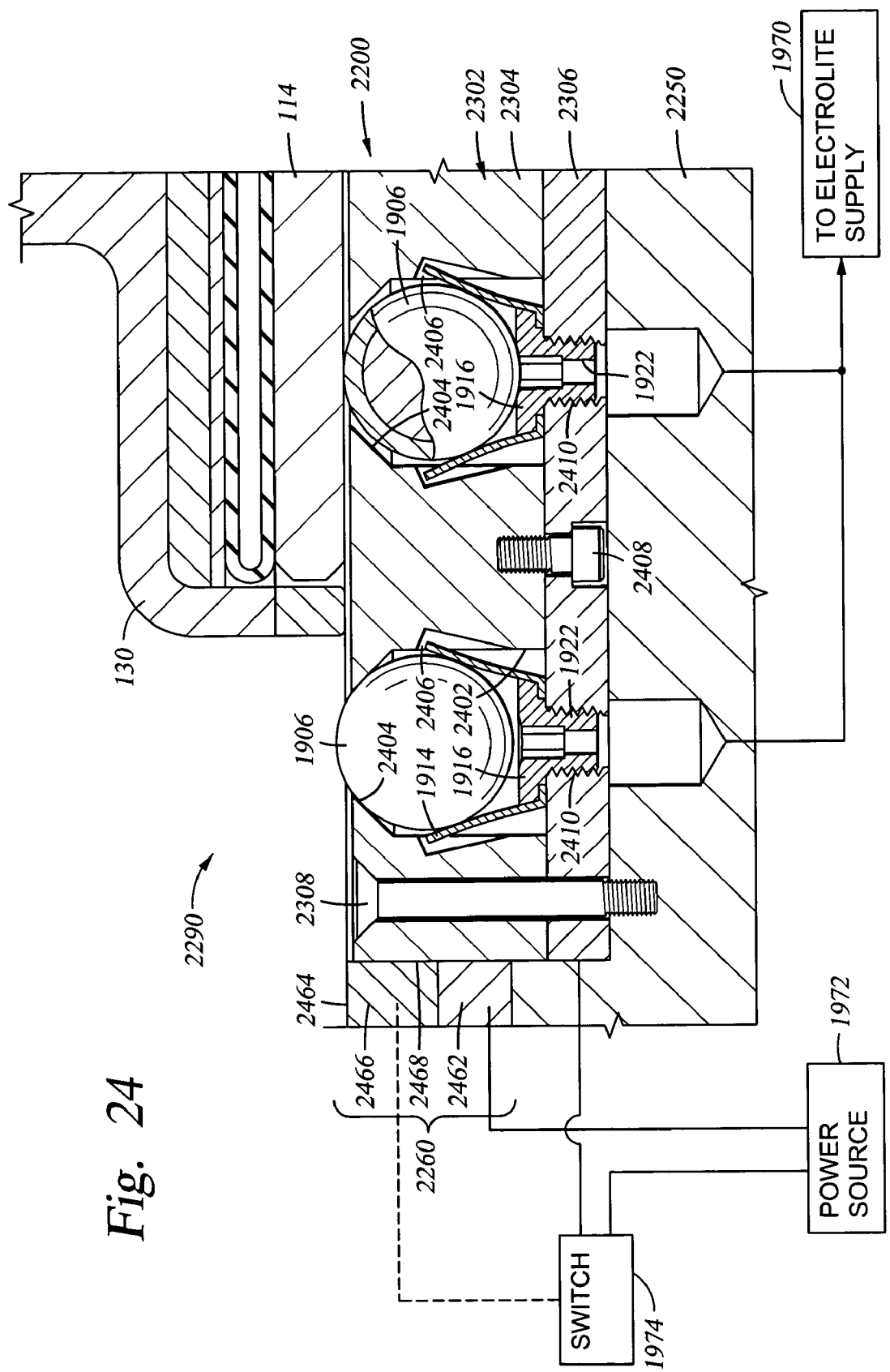

FIGS. 22-24 are perspective and sectional views of another embodiment of a conductive article having another embodiment of a ball assembly.

FIG. 22 is a perspective view of another embodiment of an ECMP station 2290 and FIGS. 23-24 are perspective and partial sectional views of a ball assembly 2200 of the ECMP station 2290 of FIG. 22. The ECMP station 2290 includes a platen 2250 that supports a polishing pad assembly 2260 (partially shown in FIG. 22). The platen 2250 includes at least one ball assembly 2200 projecting therefrom and coupled to a power source 1972. The ball assembly 2200 is adapted to electrically bias a surface of the substrate 114 (shown in FIG. 24) during processing. Although one ball assembly 2200 is shown coupled to the center of the platen 2250 in FIG. 22, any number of ball assemblies may be utilized and may be distributed in any number of configurations relative to the centerline of the platen 2250.

The polishing pad assembly 2260 may be any pad assembly suitable for processing the substrate, including any of the embodiments described above. The polishing pad assembly 2260 may include an electrode 2462 and a polishing layer 2466. In one embodiment, the polishing layer 2466 of the polishing pad assembly 2260 may include a polishing surface 2464 that is dielectric, such as a polyurethane pad. In another embodiment, the polishing layer 2466 of the polishing pad assembly 2260 may include a polishing surface 2464 that is conductive, such as a polymer matrix having conductive particles dispersed therein or a conductive coated fabric, among others. In the embodiment wherein the polishing surface 2464 is conductive, the polishing surface 2464 and electrode 2462 may be coupled to the power source 1972 (shown by the dashed lines) via a switch 1974 that allows power to be selectively switch between the ball assembly 2200 and the conductive polishing surface 2464 to respectively facilitate bulk metal removal and residual metal removal from the substrate 114 without lifting the substrate 114 from the polishing pad assembly 2260.

The ball assembly 2200 is generally coupled to the platen 2250 and extends at least partially through an aperture 2468 formed in the polishing pad assembly 2260. The ball assembly 2200 include a housing 2302 that retains a plurality of balls 1906. The balls 1906 are movably disposed in the housing 2302, and may be disposed in a first position having at least a portion of the balls 1906 extending above the polishing surface 2464 and at least a second position where the balls 1906 are flush with the polishing surface 2464. The balls 1906 are generally suitable for electrically biasing the substrate 114 and may be configured as described above.

The housing 2302 is removably coupled to the platen 2250 to facilitate replacement of the ball assembly 2200 after a number of polishing cycles. In one embodiment, the housing 2302 is coupled to the platen 2250 by a plurality of screws 2308. The housing 2302 includes an upper housing 2304 coupled to a lower housing 2306 that retain the balls 1906 therebetween. The upper housing 2304 is fabricated from a dielectric material compatible with process chemistries. In one embodiment, the upper housing 2304 is made of PEEK. The lower housing 2306 is fabricated from a conductive material compatible with process chemistries. In one embodiment, the lower housing 2306 is made of stainless steel. The lower housing 2306 is coupled to the power source 1972. The housings 2304, 2306 may be coupled in any number of methods, including but not limited to, screwing, bolting, riveting, bonding, staking and clamping, among others. In the embodiment depicted in FIGS. 22-24, the housings 2304, 2306 are coupled by a plurality of screws 2408.

The balls 1906 are disposed in a plurality of apertures 2402 formed through the housings 2304, 2306. An upper portion of each of the apertures 2402 includes a seat 2404 that extends into the aperture 2402 from the upper housing 2304. The seat 2404 is configured to prevent the ball 1906 from exiting the top end of the aperture 2402.

A contact element 1914 is disposed in each aperture 2402 to electrically couple the ball 1906 to the lower plate 2306. Each of the contact element 1914 is coupled to the lower plate 2306 by a respective clamp bushing 1916. In one embodiment, a post 1922 of the clamp bushing 1916 is threaded into a threaded portion 2410 of the aperture 2402 formed through the housing 2302.

The upper portion of each of the apertures 2402 includes a relief or groove 2406 formed in the upper housing 2304. The groove 2406 is configured to receive the distal portions of the contact element 1914, thereby preventing restriction of electrolyte flowing between the ball 1906 and housing 2302 from an electrolyte source 1970. The electrolyte source 1970 provides electrolyte through the apertures 2402 and into contact with the substrate 114 during processing.

During processing, the balls 2204 disposed within the housing 2302 are actuated towards the polishing surface 2206 by at least one of spring, buoyant or flow forces. The balls 1906 electrically couple the substrate 114 to the power source 1972 through the contact elements 1914 and lower plate 2306. Electrolyte, flowing through the housing 2302 provides a conductive path between the electrode 2462 and biased substrate 114 thereby driving an electrochemical polishing process.

Thus, various embodiments of a conductive article suitable for electrochemical polishing of substrates have been provided. The conductive articles provide good compliance to the substrate's surface to promote uniform electrical contact that enhances polishing performance. Moreover, the conductive articles are configured to minimize scratching while processing, advantageously reducing defect generation and thereby lowering the unit cost of processing.

While the foregoing is directed to various embodiments of the invention, other and further embodiments of the invention may be devised without departing from the basic scope thereof, and the scope thereof is determined by the claims that follow.

What is claimed is:

1. A ball assembly comprising:
   a housing having an interior passage;
   an annular seat extending into the interior passage at a first end of the housing;
   a ball disposed in the housing and prevented by the seat from exiting the housing;
   a conductive adapter coupled to a second end of the housing; and
   a contact element electrically coupling the adapter and the ball.

2. The ball assembly of claim 1, wherein the ball has an outer surface comprised of a soft conductive material.

3. The ball assembly of claim 2, wherein the ball has a soft resilient core.

4. The ball assembly of claim 3, wherein the core at least partially comprises at least one material selected from the group consisting of elastic organic polymers, ethylene-propylene-diene (EDPM), poly-alkenes, polyalkynes, polyesters, poly-aromatic alkenes/alkynes, polyimide, polycarbonate, polyurethane, inorganic polymers, siloxane, polysilicon and polysilane.

5. The ball assembly of claim 1, wherein the ball is comprised of at least one of a conductive polymer or polymer having conductive material disposed therein.

6. The ball assembly of claim 1, wherein the ball is movable between a first position having at least a portion of the ball exposed beyond the first end of the housing and at least a second position flush with the first end of the housing, wherein the contact element maintains electrical contact with the ball between the first and second positions.

7. The ball assembly of claim 6, wherein the ball has at least one of a gold or copper exterior surface.

8. The ball assembly of claim 1, wherein the housing further comprises a drive feature disposed at the first end.

9. The ball assembly of claim 8, wherein the drive feature further comprises a hexagonal projection.

10. The ball assembly of claim 1, wherein the housing is fabricated from PEEK.

11. The ball assembly of claim 1, wherein the contact element further comprises:
    an annular base; and
    a plurality of flexures extending from the base to a distal end.

12. The ball assembly of claim 11, wherein the housing further comprises:
    an annular groove formed in an interior wall of the housing for receiving the distal ends of the flexures.

13. The ball assembly of claim 11, wherein each of the flexures further comprises:
    two members having first ends coupled to the base and extending therefrom to the distal end of the flexure;
    a plurality of rungs coupling the members; and
    a contact pad coupling the members at the distal end of the flexure.

14. The ball assembly of claim 11 further comprising:
    a clamp bushing coupling the contact element to the adapter.

15. The ball assembly of claim 14, where the clamp bushing further comprises:
   a head; and
   a threaded post extending from the head and through the base of the contact element, the threaded post engaging a threaded portion of a passage formed at least partially through the adapter.

16. The ball assembly of claim 15, wherein the head includes a drive feature.

17. The ball assembly of claim 16, wherein the drive feature of the clamp bushing is a hex hole formed in at least a portion of a passage disposed through the clamp bushing.

18. The ball assembly of claim 11, wherein the contact member is gold-coated beryllium copper.

19. The ball assembly of claim 1, wherein the adapter further comprises:
   a boss mating with the second end of the housing; and
   a threaded post extending from the boss opposite the housing.

20. The ball assembly of claim 19, wherein the adapter further comprises a passage framed through the a head and threaded post.

21. The ball assembly of claim 20, wherein the adapter further comprises a drive feature.

22. The ball assembly of claim 21, wherein the drive feature further comprises a hex hole framed in a portion of the passage disposed in the threaded post.

23. The ball assembly of claim 1, wherein the ball is hollow.

24. The ball assembly of claim 1 further comprising:
   a polishing material having an upper surface adapted to process a substrate thereon;
   a platen supporting the polishing material; and
   a conductive contact plate disposed in the platen having a hole receiving a portion of the conductive adapter.

25. A ball assembly comprising:
   a conductive adapter having a threaded post coupled to a boss, the adapter having a passage formed through the boss and post;
   a hollow cylindrical dielectric housing having a first end having an annular seat extending radially inward and a second end engaging the boss of the adapter;
   a conductive contact member having a plurality of flexures extending from an annular base;
   a clamp bushing having a threaded post extending from a flared head, the threaded post of the clamp bushing extending through the base and engaging a threaded portion of the passage disposed through the adapter and urging the head toward the adapter, clamping the base between the head of the clamp bushing and the boss of the adapter; and
   a conductive ball disposed in the housing and movable between a first position having a portion of the ball extending through the seat and at least a second position flush with the first end of the housing, wherein the flexures maintain electrical contact with the ball in the first and second positions.

26. The ball assembly of claim 25, wherein the flared head orientates the flexures at an acute angle relative to a center line of the ball assembly.

27. The ball assembly of claim 25, wherein the housing further comprises a drive feature disposed at the first end.

28. The ball assembly of claim 27, wherein the drive feature is a hex head.

29. The ball assembly of claim 25, wherein the contact member has a gold exterior and the ball has at least one of a gold or copper exterior.

30. The ball assembly of claim 29, wherein the adapter is stainless steel.

31. The ball assembly of claim 25, wherein the ball is hollow.

32. A ball assembly comprising:
   a conductive adapter having a threaded post coupled to a boss, the adapter having an aperture formed through the boss and post;
   a hollow cylindrical dielectric housing having a first end and a second end engaging the boss of the adapter;
   a conductive ball disposed in the housing and having a diameter that allows fluid flow passage to be defined through the housing, around the ball and through the aperture, the ball movable between a first position having a portion of the ball extending through the first end and at least a second position flush with the first end of the housing; and
   a connection means for maintaining electrical connection between the ball and the adapter when the ball is in the first and second positions.

33. The ball assembly of claim 32, wherein the connection means further comprises:
   a spring form, a compression spring or a conductive bearing.

34. The ball assembly of claim 32, wherein the connection means further comprises:
   a conductive contact member having a plurality of flexures extended from an annular base that are adapted to contact the ball.

35. The ball assembly of claim 34 further comprising:
   a clamp bushing having a threaded post extending from a flared head, the threaded post of the clamp bushing extending through the base and engaging a threaded portion of the aperture disposed through the adapter and urging the head toward the adapter, clamping the base between the head of the clamp bushing and the boss of the adapter.

36. The ball assembly of claim 35, wherein the clamp bushing further comprises:
   a passage extending therethrough; and
   a hex drive feature formed in a portion of the passage opposite the threaded post of the clamp bushing.

37. The ball assembly of claim 36, wherein the aperture of the conductive adapter further comprises:
   a hex drive feature formed in a portion of the aperture opposite the threaded portion of the aperture.

38. The ball assembly of claim 34, wherein the housing further comprises:
   an annular groove formed in an interior wall of the housing for receiving distal ends of the flexures.

39. The ball assembly of claim 34, wherein at least one of the flexures further comprises:
   at least one aperture formed therethrough.

40. The ball assembly of claim 32, wherein the housing further comprises:
   a hex drive feature formed at the first end.

41. A ball assembly comprising:
   a first plate;
   a second plate coupled to the first plate;
   a plurality of apertures having portions formed through the first and second plates;
   a plurality of conductive balls, one of the balls respectively disposed in a respective one of the apertures, each ball movable between a first position having a portion of the ball extending through an outer surface of the first plate and at least a second position flush with the outer surface of the first plate; and a plurality of conductive contact members electrically coupling the conductive balls to the second plate.

42. The ball assembly of claim 41, wherein the first plate is fabricated from a dielectric material.

43. The ball assembly of claim 41, wherein the second plate is fabricated from a conductive material.

44. The ball assembly of claim 41, wherein the first plate further comprises:

a plurality of an annular seats each extending radially into a respective one of the apertures.

45. The ball assembly of claim 41, wherein at least one of the conductive contact members further comprises:

an annular base; and a plurality of flexures extending from an annular base and contacting one of the balls.

46. The ball assembly of claim 45 further comprising:

a clamp bushing coupling the base to the second plate.

47. The ball assembly of claim 46, wherein the clamp bushing further comprises:

a flared head; and a threaded post extending from a flared head and passing through the base of the contact member, the post engaging a threaded portion of the aperture disposed in the second plate.

48. The ball assembly of claim 46, wherein the clamp bushing further comprises:

a passage formed axially therethrough.

49. The ball assembly of claim 41, wherein at least one of the balls has an outer surface comprised of a soft conductive material.

50. The ball assembly of claim 41, wherein at least one of the balls has a soft resilient core.

51. The ball assembly of claim 50, wherein the core at least partially comprises at least one material selected from the group consisting of elastic organic polymers, ethylene-propylene-diene (EDPM), poly-alkenes, polyalkynes, polyesters, poly-aromatic alkenes/alkynes, polyimide, polycarbonate, polyurethane, inorganic polymers, siloxane, polysilicon and polysilane.

52. The ball assembly of claim 41, wherein the ball is comprised of a conductive polymer.

53. The ball assembly of claim 41, wherein the ball is hollow.

54. The ball assembly of claim 41, wherein the ball has at least one of a gold or copper exterior.

55. The ball assembly of claim 41 further comprising:

a platen having the second plate coupled thereto; and a polishing material disposed on the platen and having a passage formed therethrough, the passages having at least the first plate disposed therein.

56. A system for electrochemically processing a substrate, comprising:

a platen;

a polishing material;

an electrode coupled to the polishing material and disposed on the platen;

a ball assembly coupled to the platen and extending through the polishing material, the ball assembly comprising:

a housing having an interior passage;

an annular seat extending into the interior passage at a first end of the housing;

a ball disposed in the housing and prevented by the seat from exiting the housing;

a conductive adapter coupled to a second end of the housing; and a contact element electrically coupling the adapter and the ball; and a power source having a first terminal coupled to the electrode and a second terminal coupled to the ball assembly.

57. The system of claim 56, wherein the ball of the ball assembly further comprises:

at least one of a conductive polymer or polymer having conductive material disposed therein.

58. The system of claim 56, wherein the system further comprises:

a first plate;

a second plate coupled to the first plate, the power source and to the platen;

a plurality of apertures having portions formed through the first and second plates;

a plurality of conductive balls, one of the balls respectively disposed in a respective one of the apertures, each ball movable between a first position having a portion of the ball extending through an outer surface of the first plate and at least a second position flush with the outer surface of the first plate; and a plurality of conductive contact members electrically coupling the conductive balls to the second plate.

* * * * *

UNITED STATES PATENT AND TRADEMARK OFFICE
CERTIFICATE OF CORRECTION

PATENT NO. : 7,374,644 B2
APPLICATION NO. : 10/608513
DATED : May 20, 2008
INVENTOR(S) : Butterfield et al.

It is certified that error appears in the above-identified patent and that said Letters Patent is hereby corrected as shown below:

Title Page:

Please delete "2,451,341 A 10/1948 Jemstedt" and insert --2,451,341 A 10/1948 Jernstedt--;

Please delete "2,457,510 A 12/1948 van Omum" and insert --2,457,510 A 12/1948 Van Ornum--;

Please delete "2,657,117 A 10/1953 Rendel" and insert --2,657,177 A 10/1953 Rendel--;

In the Drawings:

Please delete sheet 23 of 31;

In the Brief Description of the Drawings:

Column 6, Lines 7-8, please delete "Figs. 13A-B are sectional views of other embodiments of polishing articles;";

Column 6, Line 24, please delete "and";

In the Detailed Description:

Column 7, Line 14, please delete "conducive" and insert --conductive--;

Column 34, Line 39, please delete "ellipsidal" and insert --ellipsoidal--;

Column 35, Line 28, please delete "1620" and insert --1520--;

Column 36, Line 23, please delete "melding" and insert --molding--;

Column 37, Line 38, please delete "4608" and insert --1608--;

Column 38, Line 66, please delete "milimeter" and insert --millimeter--;

Column 40, Line 21, please delete "bell" and insert --ball--;

Column 42, Line 14, please delete "adaptor" and insert --adapter--;

UNITED STATES PATENT AND TRADEMARK OFFICE
CERTIFICATE OF CORRECTION

PATENT NO.       : 7,374,644 B2
APPLICATION NO.  : 10/608513
DATED            : May 20, 2008
INVENTOR(S)      : Butterfield et al.

It is certified that error appears in the above-identified patent and that said Letters Patent is hereby corrected as shown below:

In the Claims:

Column 45, Claim 20, Line 21, please delete "the".

Signed and Sealed this

Eighteenth Day of November, 2008

JON W. DUDAS
*Director of the United States Patent and Trademark Office*